(12) United States Patent
Matsushita

(10) Patent No.: US 10,510,965 B2
(45) Date of Patent: Dec. 17, 2019

(54) COMPOSITION FOR FORMING ORGANIC SEMICONDUCTOR FILM, ORGANIC THIN FILM TRANSISTOR, ELECTRONIC PAPER, AND DISPLAY DEVICE

(71) Applicant: FUJIFILM CORPORATION, Tokyo (JP)

(72) Inventor: Yasuaki Matsushita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 31 days.

(21) Appl. No.: 15/679,867

(22) Filed: Aug. 17, 2017

(65) Prior Publication Data
US 2017/0346018 A1   Nov. 30, 2017

Related U.S. Application Data

(63) Continuation of application No. PCT/JP2016/054298, filed on Feb. 15, 2016.

(30) Foreign Application Priority Data

Mar. 13, 2015  (JP) ................................ 2015-051148

(51) Int. Cl.
*H01B 1/00* (2006.01)
*H01L 51/00* (2006.01)
(Continued)

(52) U.S. Cl.
CPC ............ *H01L 51/0071* (2013.01); *C08K 5/00* (2013.01); *C09D 11/03* (2013.01); *C09D 11/38* (2013.01);
(Continued)

(58) Field of Classification Search
CPC .. H01B 1/00; H01B 1/121; H01B 1/24; H01L 21/336; H01L 51/05; H01L 51/30; H01L 51/40
See application file for complete search history.

(56) References Cited

U.S. PATENT DOCUMENTS 9,882,137 B2 *  1/2018  Matsumura ......... H01L 51/0036
10,008,682 B2 *  6/2018  Matsushita ......... H01L 51/0558
(Continued)

FOREIGN PATENT DOCUMENTS

JP   2005-005582 A   1/2005
JP   2008-010541 A   1/2008
(Continued)

OTHER PUBLICATIONS

English language machine translation of JP 2015-029020 (pub Feb. 2015).*
(Continued)

*Primary Examiner* — Mark Kopec
(74) *Attorney, Agent, or Firm* — Studebaker & Brackett PC

(57) ABSTRACT

A composition for forming an organic semiconductor film that is excellent in printing properties makes it possible to prepare an organic thin film transistor excellent in mobility and insulation reliability. The composition may be used with an organic thin film transistor, electronic paper, and a display device. The composition for forming an organic semiconductor film contains an organic semiconductor material, a phenolic reductant, a polymer compound having a weight-average molecular weight of equal to or greater than 500,000, a surfactant, and an organic solvent having a standard boiling point of equal to or higher than 150° C. A ratio of a content of the organic semiconductor material to a content of the polymer compound is 0.02 to 10 based on mass, and a ratio of a content of the phenolic reductant to the content of the polymer compound is 0.1 to 5 based on mass.

19 Claims, 1 Drawing Sheet

(51) Int. Cl.
  *C08K 5/00* (2006.01)
  *H01B 1/12* (2006.01)
  *C09D 11/03* (2014.01)
  *C09D 11/38* (2014.01)
  *C09D 11/52* (2014.01)
  *H01L 27/32* (2006.01)
  *H01L 51/05* (2006.01)
  *H01L 51/50* (2006.01)

(52) U.S. Cl.
  CPC .......... *C09D 11/52* (2013.01); *H01B 1/121* (2013.01); *H01B 1/124* (2013.01); *H01L 27/3274* (2013.01); *H01L 51/005* (2013.01); *H01L 51/0052* (2013.01); *H01L 51/0072* (2013.01); *H01L 51/0073* (2013.01); *H01L 51/0074* (2013.01); *H01L 51/0094* (2013.01); *H01L 51/0512* (2013.01); *C08K 2201/001* (2013.01); *H01L 51/5012* (2013.01)

(56) References Cited

U.S. PATENT DOCUMENTS

| | | | |
|---|---|---|---|
| 2007/0051403 A1* | 3/2007 | Itami | H01L 51/4226 136/263 |
| 2011/0065895 A1 | 3/2011 | Miura et al. | |
| 2014/0306212 A1* | 10/2014 | Kaihovirta | C08K 5/005 257/40 |
| 2015/0126751 A1 | 5/2015 | Doetz et al. | |
| 2015/0166561 A1 | 6/2015 | Kitamura et al. | |
| 2015/0318496 A1 | 11/2015 | Jiao et al. | |
| 2016/0013429 A1 | 1/2016 | Takaku et al. | |
| 2016/0049592 A1 | 2/2016 | Yonekuta et al. | |
| 2016/0155964 A1 | 6/2016 | Matsushita et al. | |

FOREIGN PATENT DOCUMENTS

| | | |
|---|---|---|
| JP | 2008-147256 A | 6/2008 |
| JP | 2009-054810 A | 3/2009 |
| JP | 2010-161323 A | 7/2010 |
| JP | 2010-258214 A | 11/2010 |
| JP | 2014-063969 A | 4/2014 |
| JP | 2014-209583 A | 11/2014 |
| JP | 2014-209597 A | 11/2014 |
| JP | 2015-029020 A | 2/2015 |
| JP | 2015-133358 A | 7/2015 |
| JP | 2015-167156 A | 9/2015 |
| WO | 2009/101982 A1 | 8/2009 |
| WO | WO 2012/095796  * | 7/2012 |
| WO | 2013/168048 A1 | 11/2013 |
| WO | 2014/087300 A1 | 6/2014 |
| WO | 2015/016003 A1 | 2/2015 |
| WO | 2016/052283 A1 | 4/2016 |

OTHER PUBLICATIONS

An Office Action mailed by the European Patent Office dated Oct. 22, 2018, which corresponds to European Patent Application No. 16764604.1-1212 and is related to U.S. Appl. No. 15/679,867.

Extended European Search Report (EESR) dated Jan. 25, 2018, from corresponding EP Appl No. 16764604.1, 6 pp.

International Search Report issued in PCT/JP2016/054298; dated May 17, 2016.

Written Opinion issued in PCT/JP2016/054298; dated May 17, 2016.

An Office Action mailed by the Japanese Patent Office dated Oct. 23, 2018, which corresponds to Japanese Patent Application No. 2017-506149 and is related to U.S. Appl. No. 15/679,867.

Communication pursuant to Article 94(3) EPC issued by the European Patent Office dated Jun. 12, 2019, which corresponds to European Patent Application No. 16764604.1-1212 and is related to U.S. Appl. No. 15/679,867.

An Office Action dated by the Taiwanese Patent Office on Jul. 2, 2019, which corresponds to Taiwanese Patent Application No. 105105349 and is related to U.S. Appl. No. 15/679,867; with English Translation.

* cited by examiner

COMPOSITION FOR FORMING ORGANIC SEMICONDUCTOR FILM, ORGANIC THIN FILM TRANSISTOR, ELECTRONIC PAPER, AND DISPLAY DEVICE

CROSS-REFERENCE TO RELATED APPLICATIONS

This application is a Continuation of PCT International Application No. PCT/JP2016/054298 filed on Feb. 15, 2016, which claims priority under 35 U.S.C. § 119(a) to Japanese Patent Application No. 2015-051148 filed on Mar. 13, 2015. The above application is hereby expressly incorporated by reference, in its entirety, into the present application.

BACKGROUND OF THE INVENTION

1. Field of the Invention

The present invention relates to a composition for forming an organic semiconductor film, an organic thin film transistor, electronic paper, and a display device.

2. Description of the Related Art

An organic thin film transistor (organic TFT) having an organic semiconductor film (organic semiconductor layer) is utilized in a field effect transistor (FET) used in a liquid crystal display or an organic electroluminescence (organic EL) display, an apparatus using a logic circuit such as a Radio Frequency Identifier (RFID, RF tag) or a memory, and the like, because the use of the organic thin film transistor makes it possible to achieve weight lightening, cost reduction, and flexibilization.

Today, as an expectation for the organic thin film transistor is increasing, the improvement of mobility (particularly, field effect mobility), stability (the improvement of insulation reliability), and the like are required for the organic thin film transistor.

Under these circumstances, JP2005-5582A discloses an organic thin film transistor in which an organic semiconductor layer is formed of a composition containing an antioxidant so as to reduce the oxidation and deterioration of the organic semiconductor layer.

SUMMARY OF THE INVENTION

Incidentally, in recent years, from the viewpoint of reducing production costs of the organic thin film transistor or the like, improving the productivity, and the like, regarding the formation of an organic semiconductor film, the use of a printing process (for example, a flexographic printing method or an ink jet printing method) instead of a process such as a vacuum film formation has been examined.

However, in a case where an organic semiconductor film is formed by applying the composition (composition for forming an organic semiconductor film) described in JP2005-5582A to a printing process, in the obtained organic semiconductor film, the solid content (component derived from an organic semiconductor material) is concentrated in a specific area within the obtained organic semiconductor film (printing properties deteriorate) in some cases.

An object of the present invention is to provide a composition for forming an organic semiconductor film that is excellent in printing properties and makes is possible to prepare an organic thin film transistor excellent mobility and insulation reliability.

Another object of the present invention is to provide an organic thin film transistor, electronic paper, and a display device.

As a result of conducting a thorough examination regarding the aforementioned objects, the inventor of the present invention found that the aforementioned objects can be achieved by specifying a ratio of a content of an organic semiconductor material and a ratio of a content of a phenolic reductant to a content of a polymer compound having a specific molecular weight. Based on what the inventor had found, the inventor accomplished the present invention.

That is, the inventor of the present invention found that the aforementioned objects can be achieved by the following constitution.

[1] A composition for forming an organic semiconductor film, comprising an organic semiconductor material, a phenolic reductant, a polymer compound having a weight-average molecular weight of equal to or greater than 500,000, a surfactant, and an organic solvent having a standard boiling point of equal to or higher than 150° C., in which a ratio of a content of the organic semiconductor material to a content of the polymer compound is 0.02 to 10 based on mass, and a ratio of a content of the phenolic reductant to the content of the polymer compound is 0.1 to 5 based on mass.

[2] The composition for forming an organic semiconductor film described in [1], in which the phenolic reductant contains at least one of Compound X, which contains 2 or more groups selected from the group consisting of a group represented by Formula (A) which will be described later and a group represented by Formula (B) which will be described later, or Compound Y represented by Formula (C) which will be described later.

[3] The composition for forming an organic semiconductor film described in [1] or [2], in which the organic semiconductor material has a condensed polycyclic aromatic group, the number of rings in the condensed polycyclic aromatic group is equal to or greater than 4, at least 2 rings in the condensed polycyclic aromatic group contains at least 1 atom selected from the group consisting of a sulfur atom, a nitrogen atom, a selenium atom, and an oxygen atom, and at least any one structure selected from the group consisting of a benzene ring, a naphthalene ring, and a phenanthrene ring is contained as a partial structure in the condensed polycyclic aromatic group.

[4] The composition for forming an organic semiconductor film described in [3], in which the number of rings in the condensed polycyclic aromatic group in the organic semiconductor material is 5 or 6.

[5] The composition for forming an organic semiconductor film described in [3] or [4], in which at least 2 heterocyclic rings are contained in the condensed polycyclic aromatic group of the organic semiconductor material, and each of the heterocyclic rings is a heterocyclic ring having only 1 heteroatom.

[6] The composition for forming an organic semiconductor film described in any one of [1] to [5], in which the surfactant contains at least one kind of compound selected from the group consisting of a fluorine-based surfactant and a silicone-based surfactant.

[7] The composition for forming an organic semiconductor film described in any one of [1] to [6], in which a ratio of the content of the polymer compound to a content of the surfactant is 0.01 to 200 based on mass.

[8] The composition for forming an organic semiconductor film described in any one of [1] to [7], in which the organic semiconductor material contains at least one kind of compound represented by any one of Formulae 1 to 16 which will be described later.

[9] The composition for forming an organic semiconductor film described in [8], in which the organic semiconductor material contains at least one kind of compound represented by Formulae 1 to 9 or Formula 15 which will be described later.

[10] The composition for forming an organic semiconductor film described in any one of [1] to [9] that is for ink jet printing or flexographic printing.

[11] An organic thin film transistor comprising an organic semiconductor film prepared using the composition for forming an organic semiconductor film described in any one of [1] to [10].

[12] The organic thin film transistor described in [11], further comprising a source electrode, a drain electrode, and a gate electrode, in which at least one of the source electrode, the drain electrode, or the gate electrode is constituted with a silver-containing material.

[13] Electronic paper obtained using the organic thin film transistor described in [11] or [12].

[14] A display device obtained using the organic thin film transistor described in [11] or [12].

As described above, according to the present invention, it is possible to provide a composition for forming an organic semiconductor film that is excellent in printing properties and makes it possible to prepare an organic thin film transistor excellent in mobility and insulation reliability. Furthermore, according to the present invention, it is possible to provide an organic thin film transistor, electronic paper, and a display device.

DESCRIPTION OF THE PREFERRED EMBODIMENTS

Figure 1:
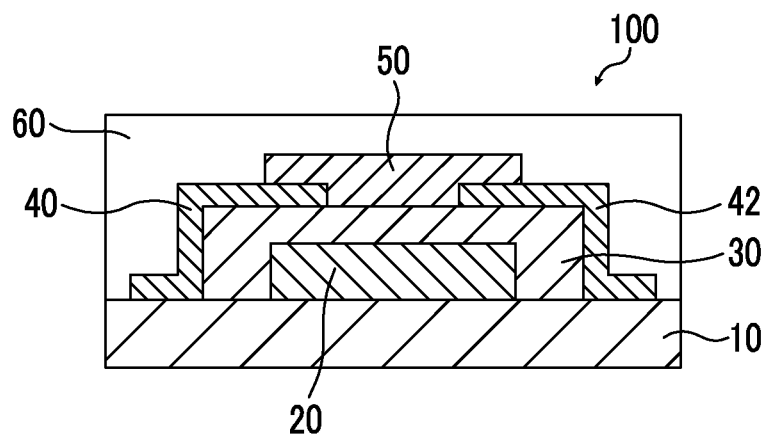
FIG. 1 is a schematic cross-sectional view of a bottom contact-type organic thin film transistor according to an embodiment of the present invention.

Hereinafter, the composition for forming an organic semiconductor film (hereinbelow, simply referred to as "organic semiconductor composition" as well) of the present invention will be described.

In the present invention, a range of numerical values described using "to" means a range including numerical values listed before and after "to" as a lower limit and upper limit respectively.

In the present specification, in a case where there is no description regarding whether a group (atomic group) is substituted or unsubstituted, the group includes both of a group not having a substituent and a group having a substituent. For example, an "alkyl group" includes not only an alkyl group not having a substituent (unsubstituted alkyl group) but also an alkyl group having a substituent (substituted alkyl group).

In the present invention, in a case where an organic semiconductor film is prepared by a printing process using the organic semiconductor composition, "printing properties" refer to an extent of concentration of the solid content (for example, the component derived from the organic semiconductor material) in a specific area within the prepared organic semiconductor film. Specifically, being excellent in printing properties refers to a state where the concentration of the solid content in a specific area within the organic semiconductor film prepared by printing is insignificant, and the solid content is substantially evenly distributed across the entirety of the film.

[Organic Semiconductor Composition]

The organic semiconductor composition of the present invention contains an organic semiconductor material, a phenolic reductant, a polymer compound having a weight-average molecular weight of equal to or greater than 500,000 (hereinafter, simply referred to as "specific polymer compound" as well), a surfactant, and an organic solvent having a standard boiling point of equal to or higher than 150° C. (hereinafter, simply referred to as "specific organic solvent" as well). A ratio $M_{A/C}$ of a content of the organic semiconductor material to a content of the specific polymer compound is 0.02 to 10 based on mass. Furthermore, a ratio $M_{B/C}$ of a content of the phenolic reductant to the content of the specific polymer compound is 0.1 to 5 based on mass.

The organic semiconductor composition of the present invention is suitably used for printing. Being used for printing means that the composition is used for known printing methods such as ink jet printing, flexographic printing, gravure printing, and screen printing. The organic semiconductor composition of the present invention is particularly suitably used for ink jet printing or flexographic printing among the above printing methods.

By setting the ratio of the content of the organic semiconductor material to the content of the specific polymer compound within a specific range and setting the ratio of the content of the phenolic reductant to the content of the specific polymer compound within a specific range as described above, the aforementioned desired effects are obtained. The specific reason why the effects are obtained is unclear, but is assumed to be as below.

In order to improve the mobility of an organic thin film transistor, the content of an organic semiconductor material contained in an organic semiconductor composition used for preparing the transistor needs to be increased. However, because the solubility of the organic semiconductor material in an organic solvent is low, depending on the content of the organic semiconductor material, it is difficult to use the organic semiconductor composition for a printing process or the printing properties deteriorate in some cases.

Meanwhile, a specific polymer compound is added to the organic semiconductor composition in some cases because then the viscosity of the composition can be adjusted to fall into a range suitable for printing, and the applicability of the composition to a printing process can be improved. The specific polymer compound is suitably used from the viewpoint of excellent solubility in an organic solvent or the like.

In a case where a film is formed of the organic semiconductor composition by using various printing methods, the organic semiconductor film starts to dry from the surface thereof, and hence the organic semiconductor material showing low solubility in an organic solvent is easily concentrated on the surface. Then, the organic semiconductor material and the specific polymer compound are excessively markedly separated from each other in the layer direction, and hence a layer containing a large amount of the specific polymer compound is hindered from contacting the organic semiconductor material and an electrode in some cases. As a result, the mobility of the prepared organic thin film transistor deteriorates in some cases.

In order to solve the above problem, the inventor of the present invention conducted a thorough examination. As a result, the inventor found that by using the organic semiconductor composition in which the ratio of the content of the organic semiconductor material to the content of the specific polymer compound is set to be within a specific range, the printing properties of the organic semiconductor composition prepared and the mobility of the organic thin film transistor prepared using the composition can both become excellent.

Meanwhile, from the viewpoint of improving insulation reliability by inhibiting the occurrence of migration in an organic thin film transistor, a phenolic reductant is used in some cases.

However, depending on the ratio of a content of the phenolic reductant to a content of the specific polymer compound, the aforementioned function (improvement of insulation reliability) is not sufficiently performed, or the crystal growth of the organic semiconductor material is hindered, and accordingly, the mobility of the prepared organic thin film transistor deteriorates in some cases.

As a solution to the above problem, the inventor of the present invention found that by using the organic semiconductor composition in which the ratio of the content of the phenolic reductant to the content of the specific polymer compound is set to be within a specific range, the insulation reliability and the mobility of the prepared organic thin film transistor can become excellent.

Presumably, for the aforementioned reasons, according to the present invention, an organic semiconductor composition is obtained which is excellent in printing properties and makes it possible to prepare an organic thin film transistor having excellent mobility and insulation reliability.

Hereinafter, the components contained in the organic semiconductor composition of the present invention and components that can be contained in the composition will be specifically described.

<Organic Semiconductor Material>

The organic semiconductor composition of the present invention contains an organic semiconductor material. The organic semiconductor material is a material which exhibits properties of a semiconductor.

The ratio $M_{A/C}$ (organic semiconductor material/specific polymer compound) of the content of the organic semiconductor material to the content of the specific polymer compound (described later) is 0.02 to 10, preferably 0.1 to 8, and more preferably 0.25 to 7 based on mass. In a case where the ratio $M_{A/C}$ is within the above range, the properties of each component are excellent exhibited. As a result, the printing properties of composition for an organic semiconductor become excellent, and the mobility of the prepared organic thin film transistor becomes excellent.

In contrast, in a case where the ratio $M_{A/C}$ is lower than 0.02, because the specific polymer compound hinders the organic semiconductor material from contacting an electrode, the mobility of the prepared organic thin film transistor deteriorates. In a case where the ratio $M_{A/C}$ is higher than 10, the printing properties deteriorate. In this way, in a case where the ratio $M_{A/C}$ is outside the aforementioned range, the characteristics of each component are not sufficiently exhibited.

The content of the organic semiconductor material is, with respect to the total mass of the organic semiconductor composition, preferably 0.1% to 10% by mass, more preferably 0.3% to 8% by mass, and even more preferably 0.5% to 5% by mass. In a case where the content of the organic semiconductor material is within the above range, the mobility of the organic thin film transistor is further improved.

Examples of the organic semiconductor material include pentacenes such as 6,13-bis(triisopropylsilylethynyl)pentacene (TIPS pentacene), tetramethylpentacene, and perfluoropentacene, anthradithiophenes such as 5,11-bis(triethylsilylethynyl)anthradithiophene (TES-ADT) and 2,8-difluoro-5,11-bis(triethylsilylethynyl)anthradithiophene (diF-TES-ADT), benzothienobenzothiophenes such as diphenylbenzothienobenzothiophene (DPh-BTBT) and alkylbenzothienobenzothiophene (Cn-BTBT), dinaphthothienothiophenes such as alkyldinaphthothienothiophene (Cn-DNTT), dioxaanthanthrenes such as perixanthenoxanthene, rubrenes, fullerenes such as C60 and phenyl $C_{61}$ butyric acid methyl ester (PCBM), phthalocyanines such as copper phthalocyanine and fluorinated copper phthalocyanine, polythiophenes such as poly(3-alkylthiophene) (P3RT), polyquaterthiophene (PQT), and poly(3-hexylthiophene) (P3HT), polythienothiophenes such as poly[2,5-bis(3-dodecylthiophen-2-yl)thieno[3,2-b]thiophene] (PBTTT), a specific organic semiconductor material which will be described later, and the like.

Among these, from the viewpoint of further improving the performance such as mobility of the prepared organic semiconductor film, the following specific organic semiconductor material (hereinafter, referred to as "component A" as well) is preferably used. In the present invention, the specific organic semiconductor material (component A) refers to an organic semiconductor material having a condensed polycyclic aromatic group, in which the number of rings in the condensed polycyclic aromatic group is equal to or greater than 4, at least 2 rings in the condensed polycyclic aromatic group contains at least 1 atom selected from the group consisting of a sulfur atom, a nitrogen atom, a selenium atom, and an oxygen atom, and at least 1 structure selected from the group consisting of a benzene ring, a naphthalene ring, and a phenanthrene ring is contained as a partial structure in the condensed polycyclic aromatic group.

Here, the partial structure in the condensed polycyclic aromatic group in the specific organic semiconductor material does not contain an anthracene ring. In a case where the partial structure contains an anthracene ring, both the mobility and the thermal stability of the obtained organic thin film transistor deteriorate, although the reason is unclear.

The condensed polycyclic aromatic group is a group obtained by the condensation of a plurality of aromatic rings.

Examples of the aromatic rings include an aromatic hydrocarbon ring (for example, a benzene ring) and an aromatic heterocyclic ring (for example, a thiophene ring, a furan ring, a pyrrole ring, a selenophene ring, and an imidazole ring).

Component A contains the condensed polycyclic aromatic group (condensed polycyclic aromatic structure), and it is preferable that this group is contained in component A as a main component. Herein, the "main component" means that the content of the condensed polycyclic aromatic group based on the molecular weight is equal to or greater than 30% with respect to the total molecular weight of component A. The content of the condensed polycyclic aromatic group is preferably equal to or greater than 40%. The upper limit of the content of the condensed polycyclic aromatic group is not particularly limited, but from the viewpoint of solubility, the upper limit is preferably equal to or less than 80%.

The condensed polycyclic aromatic group is a ring structure formed by the condensation of a plurality of rings and exhibits aromaticity.

From the viewpoint of the mobility of the organic thin film transistor, the number of rings in the condensed polycyclic aromatic group in component A is equal to or greater than 4, preferably 4 to 9, more preferably 4 to 7, and even more preferably 5 or 6.

At least 2 rings in the condensed polycyclic aromatic group contains at least one kind of atom selected from a sulfur atom, a nitrogen atom, a selenium atom, and an oxygen atom. From the viewpoint of the mobility of the organic thin film transistor, it is preferable that 2 to 6 rings contain the aforementioned atom, and it is more preferable that 2 to 4 rings contain the aforementioned atom.

From the viewpoint of the mobility of the organic thin film transistor, the condensed polycyclic aromatic group preferably contains at least 2 heterocyclic rings, and each of the heterocyclic rings preferably has 1 heteroatom. The type of the heteroatom is not particularly limited, and examples thereof include an oxygen atom (O atom), a sulfur atom (S atom), a nitrogen atom (N atom), a selenium atom (Se atom), and the like.

The condensed polycyclic aromatic group in component A contains, as a partial structure, at least any one structure selected from the group consisting of a benzene ring, a naphthalene ring, and a phenanthrene ring. The aforementioned partial structure does not contain an anthracene ring.

From the viewpoint of the mobility of the organic thin film transistor, component A preferably has at least a thiophene ring structure and/or a selenophene ring structure, and more preferably has at least a thiophene ring structure. It is even more preferable that a thiophene ring structure is the only heterocyclic structure that component A has.

From the viewpoint of the mobility of the organic thin film transistor, the aforementioned condensed polycyclic aromatic group is preferably a condensed polycyclic aromatic group which contains at least any one structure selected from the group consisting of a benzene ring, a naphthalene ring, and a phenanthrene ring as a partial structure and contains 2 or more thiophene rings, in which the number of rings is equal to or greater than 4. Particularly, a condensed polycyclic aromatic group is more preferable which contains a benzene ring as a partial structure and contains 2 or more thiophene rings, in which the number of rings is equal to or greater than 4.

Regarding the condensed polycyclic aromatic group, from the viewpoint of the mobility of the organic thin film transistor, the number of thiophene rings in the condensed polycyclic aromatic group is preferably equal to or greater than 3, more preferably 3 to 5, even more preferably 3 or 4, and particularly preferably 3.

From the viewpoint of the mobility of the organic thin film transistor, the number of rings in the condensed polycyclic aromatic group is preferably 4 to 6, more preferably 5 or 6, and even more preferably 5. As the condensed polycyclic aromatic group, a condensed polycyclic aromatic group is particularly preferable which contains 2 benzene rings and 3 thiophene rings, in which the number of rings is 5.

Examples of the condensed polycyclic aromatic group preferably include a group obtained in a case where a ring (heterocyclic ring, preferably, a thiophene ring) containing at last one kind of atom selected from the group consisting of a sulfur atom, a nitrogen atom, a selenium atom, and an oxygen atom and a benzene ring are alternately condensed (fused) with each other.

From the viewpoint of the mobility of the organic thin film transistor, the composition of the present invention preferably contains at least one kind of compound represented by any one of Formulae 1 to 16 as component A, and more preferably contains 1 or more kinds of compounds represented by any one of Formulae 1 to 16 as component A.

The composition of the present invention may contain only one kind of component A or two or more kinds of component A.

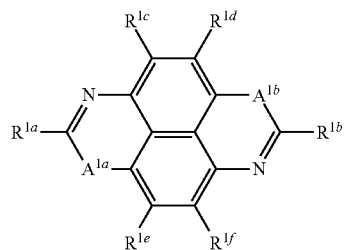

(1)

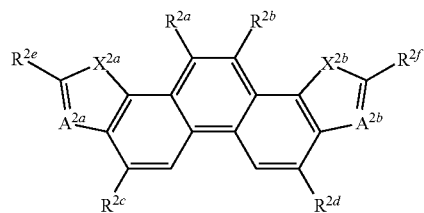

(2)

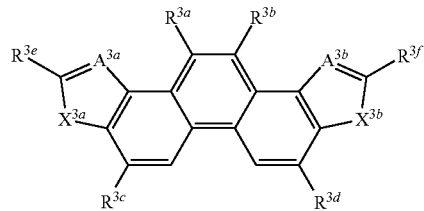

(3)

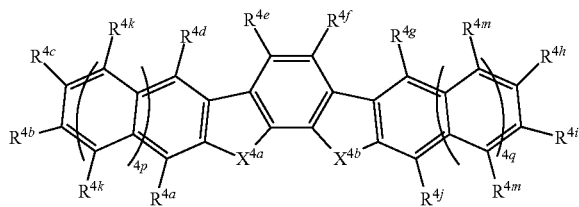

(4)

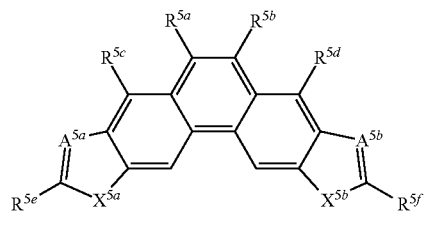

(5)

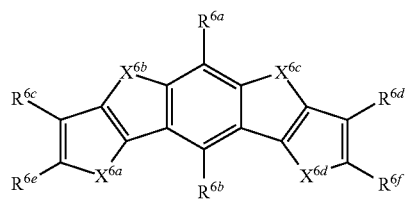

(6)

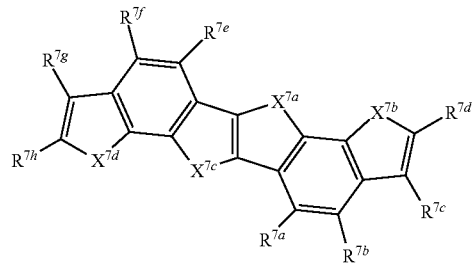
(7)

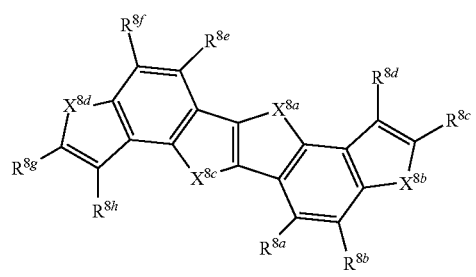
(8)

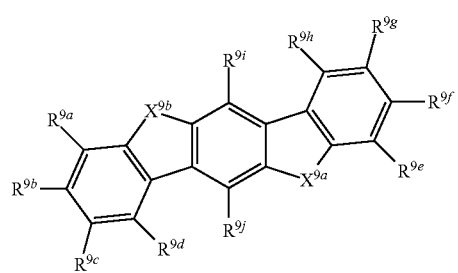
(9)

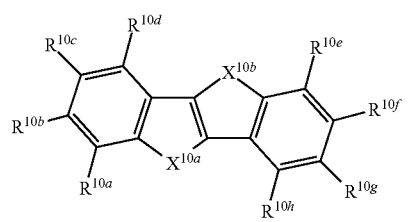
(10)

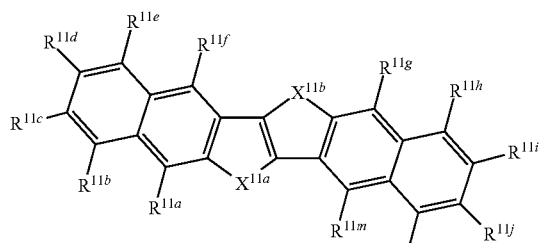
(11)

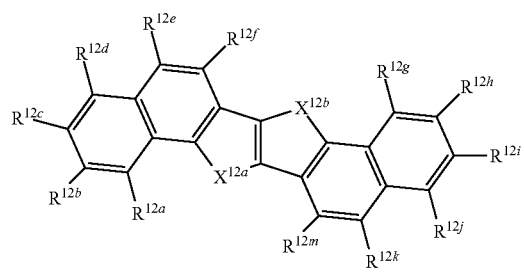
(12)

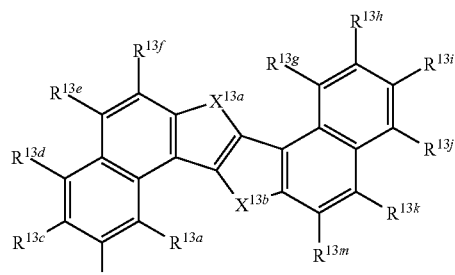
(13)

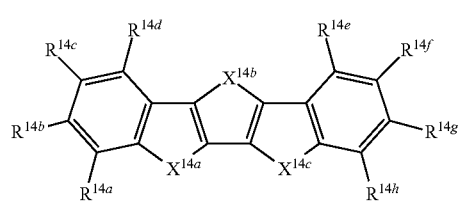
(14)

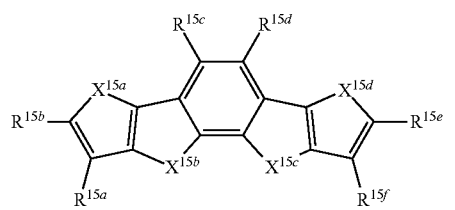
(15)

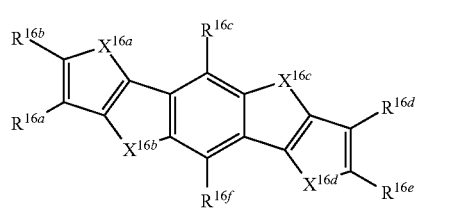
(16)

In Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W.

$$-L^W - R^W \quad (W)$$

In Formula W, $L^W$ represents a divalent linking group represented by any one of the following Formulae L-1 to L-25 or a divalent linking group in which 2 or more divalent linking groups represented by any one of the following Formulae L-1 to L-25 are bonded to each other. $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having 2 or more silicon atoms, or a trialkylsilyl group.

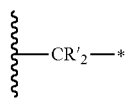
(L-1)

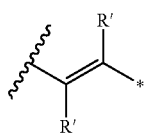 (L-2)
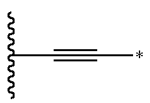 (L-3)
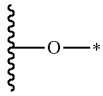 (L-4)
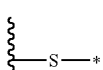 (L-5)
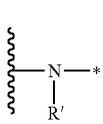 (L-6)
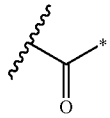 (L-7)
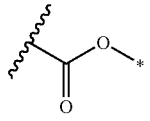 (L-8)
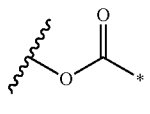 (L-9)
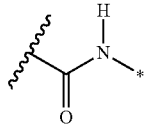 (L-10)
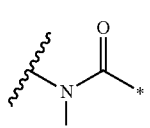 (L-11)
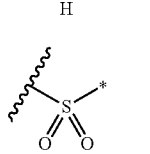 (L-12)
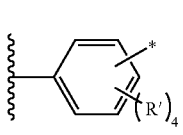 (L-13)
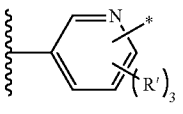 (L-14)

In Formulae L-1 to L-25, * represents a binding position with respect to $R^W$, the portion of a wavy line represents a binding position on the other side, R' in Formulae L-1, L-2, L-6, and L-13 to L-24 each independently represents a hydrogen atom or a substituent, $R^N$ represents a hydrogen atom or a substituent, and $R^{si}$ each independently represents a hydrogen atom, an alkyl group, an alkenyl group, or an alkynyl group.

In Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W.

In Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom. $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W.

In Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, and at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3.

In Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

In Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W.

In Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h1}$, or $R^{7i}$ is a group represented by Formula W.

In Formula 8, $X^{8a}$ and $X^{8i}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

In Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent.

In Formula 10, $R^{10a}$ to $R^{10b}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, a Se atom, or $NR^{10i}$, and $R^{10i}$ each independently represents a hydrogen atom or a group represented by Formula W.

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11e}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W.

In Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W.

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W.

In Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W.

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W.

In Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

—Compound represented by Formula 1—

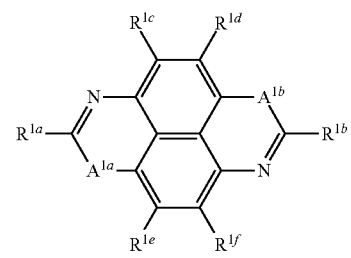

(1)

In Formula 1, $A^{1a}$ and $A^{1b}$ each independently represent a sulfur atom (S atom), an oxygen atom (O atom), or a selenium atom (Se atom). $A^{1a}$ and $A^{1b}$ are preferably a S atom or an O atom. $A^{1a}$ and $A^{1b}$ may be the same as or different from each other, but are preferably the same as each other.

In Formula 1, $R^{1a}$ to $R^{1r}$ each independently represent a hydrogen atom or a substituent. Here, at least one of $R^{1a}$, $R^{1b}$, $R^{1c}$, $R^{1d}$, $R^{1e}$, or $R^{1f}$ is a group represented by Formula W which will be described later.

The compound represented by Formula 1 may have other substituents in addition to the group represented by Formula W which will be described later.

The type of the substituent that $R^{1a}$ to $R^{1f}$ in Formula 1 can adopt is not particularly limited, and examples of the substituent include a substituent X described below. Examples of the substituent X include a group represented by Formula W which will be described later, a halogen atom, an alkyl group (including a cycloalkyl group, a bicycloalkyl group, and a tricycloalkyl group), an alkenyl group (including cycloalkenyl and bicycloalkenyl), an alkynyl group, an aryl group, a heterocyclic group (may be referred to as a hetero ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, alkyl- and aryl sulfonylamino groups, a mercapto group, an alkylthio group, an arylthio group, a heterocyclic thio group, a sulfamoyl group, a sulfo group, alkyl- and aryl sulfinyl groups, alkyl- and aryl sulfonyl groups, an acyl group, an aryloxycarbonyl group, an alkoxycarbonyl group, a carbamoyl group, aryl- and heterocyclic azo groups, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents. In the present specification, examples of the "substituent" in Formulae 1 to 16 preferably include the aforementioned substituent X.

Among these, as the group other than the group represented by Formula W which will be described later, a halogen atom, an alkyl group, an alkynyl group, an alkenyl group, an alkoxy group, an alkylthio group, and an aryl group are preferable, a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having 1 or 2 carbon atoms, a substituted or unsubstituted methylthio group, and a phenyl group are more preferable, and a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having 1 or 2 carbon atoms, and a substituted or unsubstituted methyl group are particularly preferable.

In the compound represented by Formula 1, among $R^{1a}$ to $R^{1f}$, the number of substituents other than the group represented by Formula W is preferably 0 to 4, more preferably 0 to 2, and particularly preferably 0.

Furthermore, these substituents may further have the substituent X.

Among the substituents, $R^{1c}$ to $R^{1f}$ preferably each independently represent a hydrogen atom, a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having 1 or 2 carbon atoms, or a substituted or unsubstituted methylthio group.

Next, the group represented by Formula W will be described.

(W)

In Formula W, L represents a divalent linking group represented by any one of the following Formulae L-1 to L-25 or a divalent linking group in which 2 or more divalent linking groups represented by any one of the following Formulae L-1 to L-25 are bonded to each other.

(L-1)

(L-2)

(L-3)

(L-4)

(L-5)

(L-6)

(L-7)

(L-8)

(L-9)

(L-10)

(L-11)

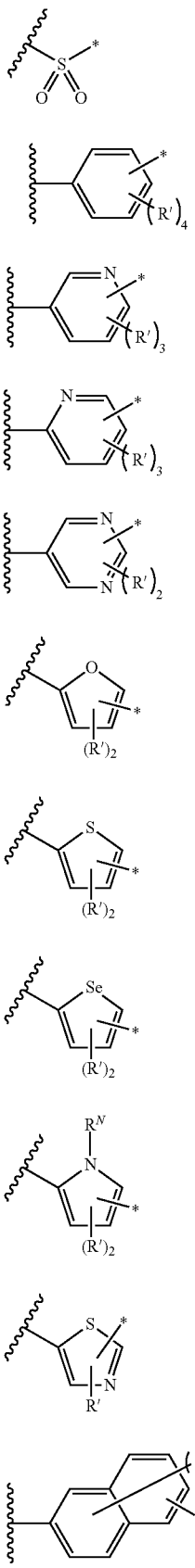
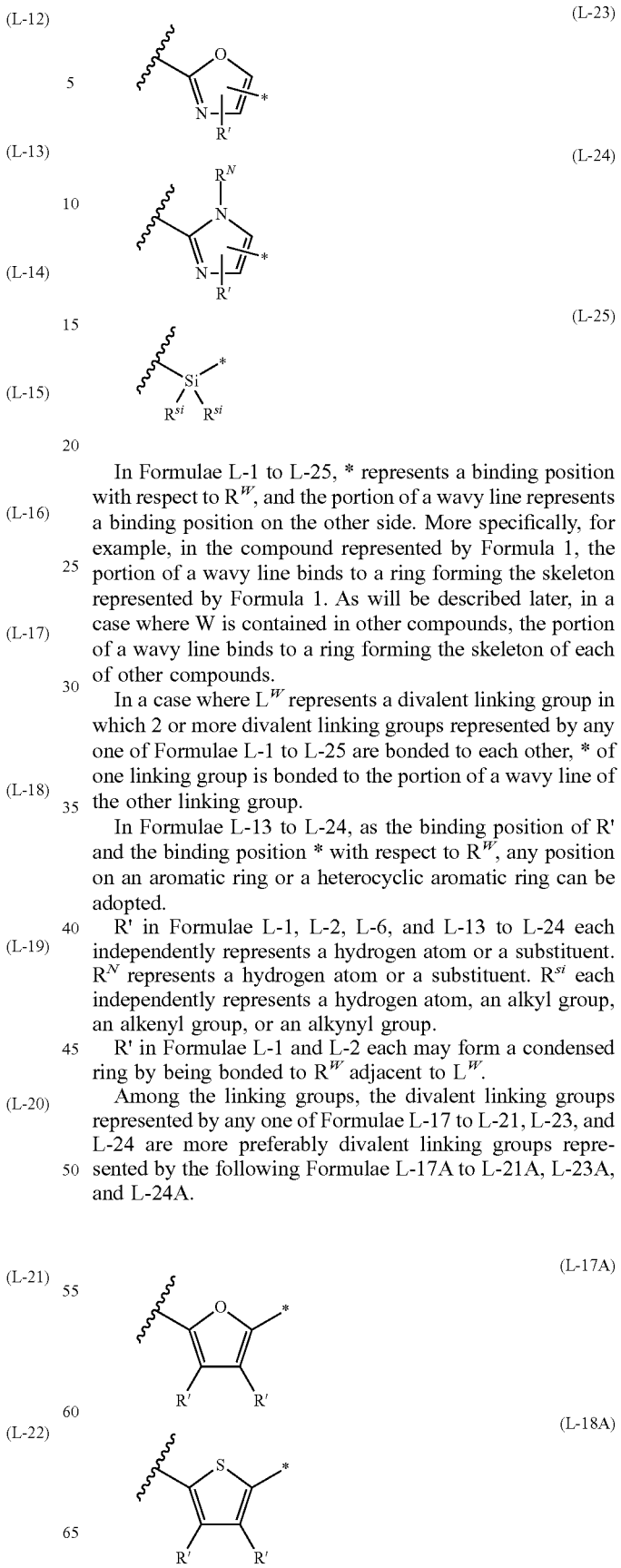

In Formulae L-1 to L-25, * represents a binding position with respect to $R^W$, and the portion of a wavy line represents a binding position on the other side. More specifically, for example, in the compound represented by Formula 1, the portion of a wavy line binds to a ring forming the skeleton represented by Formula 1. As will be described later, in a case where W is contained in other compounds, the portion of a wavy line binds to a ring forming the skeleton of each of other compounds.

In a case where $L^W$ represents a divalent linking group in which 2 or more divalent linking groups represented by any one of Formulae L-1 to L-25 are bonded to each other, * of one linking group is bonded to the portion of a wavy line of the other linking group.

In Formulae L-13 to L-24, as the binding position of R' and the binding position * with respect to $R^W$, any position on an aromatic ring or a heterocyclic aromatic ring can be adopted.

R' in Formulae L-1, L-2, L-6, and L-13 to L-24 each independently represents a hydrogen atom or a substituent. $R^N$ represents a hydrogen atom or a substituent. $R^{si}$ each independently represents a hydrogen atom, an alkyl group, an alkenyl group, or an alkynyl group.

R' in Formulae L-1 and L-2 each may form a condensed ring by being bonded to $R^W$ adjacent to $L^W$.

Among the linking groups, the divalent linking groups represented by any one of Formulae L-17 to L-21, L-23, and L-24 are more preferably divalent linking groups represented by the following Formulae L-17A to L-21A, L-23A, and L-24A.

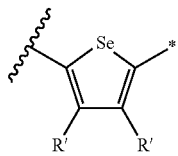
(L-19A)

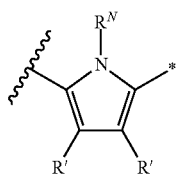
(L-20A)

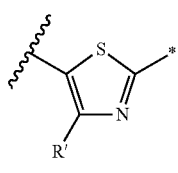
(L-21A)

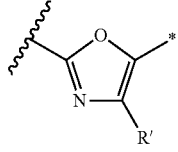
(L-23A)

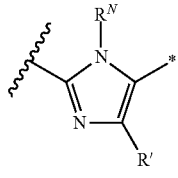
(L-24A)

In a case where a substituted or unsubstituted alkyl group, an oxyethylene group, an oligo-oxyethylene group in which a repetition number v of an oxyethylene unit is equal to or greater than 2, a siloxane group, an oligosiloxane group having 2 or more silicon atoms, or a substituted or unsubstituted trialkylsilyl group is present on the terminal of a substituent, the substituent can be interpreted as a substituent consisting only of —$R^W$ in Formula W or a substituent consisting of -$L^W$-$R^W$ in Formula W.

In the present invention, in a case where a substituted or unsubstituted alkyl group having a main chain consisting of N carbon atoms is present on the terminal of a substituent, the substituent is interpreted as -$L^W$-$R^W$ in Formula W including as many linking groups as possible from the terminal of the substituent. Specifically, the substituent is interpreted as a substituent in which "one group represented by Formula L-1 corresponding to $L^W$ in Formula W" and "a substituted or unsubstituted alkyl group which corresponds to $R^W$ in Formula W and has a main chain consisting of (N−1) carbon atoms" are bonded to each other. For example, in a case where a n-octyl group which is an alkyl group having eight carbon atoms is present on the terminal of a substituent, the substituent is interpreted as a substituent in which one group represented by Formula L-1, in which two R's represent hydrogen atoms, and a n-pentyl group having 7 carbon atoms are bonded to each other.

In contrast, in the present invention, in a case where an oxyethylene group, an oligo-oxyethylene group in which a repetition number v of an oxyethylene unit is equal to or greater than 2, a siloxane group, an oligosiloxane group having 2 or more silicon atoms, or a substituted or unsubstituted trialkylsilyl group is present on the terminal of a substituent, the substituent is interpreted as a substituent consisting only of $R^W$ in Formula W including as many linking groups as possible from the terminal of the substituent. For example, in a case where a —(OCH$_2$CH$_2$)—(OCH$_2$CH$_2$)—(OCH$_2$CH$_2$)—OCH$_3$ group is present on the terminal of a substituent, the substituent is interpreted as a substituent consisting only of an oligo-oxyethylene group in which a repetition number v of an oxyethylene unit is 3.

In a case where $L^W$ forms a linking group in which divalent linking groups represented by any one of Formulae L-1 to L-25 are bonded to each other, the number of bonded divalent linking groups represented by any one of Formulae L-1 to L-25 is preferably 2 to 4, and more preferably 2 or 3.

Examples of the substituent R' in Formulae L-1, L-2, L-6, and L-13 to L-24 include those exemplified above as substituents that the substituents $R^{1a}$ to $R^{1f}$ of Formula 1 can adopt. The substituent R' in Formula L-6 among the above formulae is preferably an alkyl group. In a case where R' in Formula L-6 is an alkyl group, the number of carbon atoms in the alkyl group is preferably 1 to 9, more preferably 4 to 9 from the viewpoint of chemical stability and carrier transport properties, and even more preferably 5 to 9. In a case where R' in Formula L-6 is an alkyl group, the alkyl group is preferably a linear alkyl group, because then the carrier mobility can be improved.

$R^N$ represents a hydrogen atom or a substituent. Examples of $R^N$ include those exemplified above as substituents that $R^{1a}$ to $R^{1f}$ in Formula 1 can adopt. $R^N$ is preferably a hydrogen atom or a methyl group among the substituents.

$R^{si}$ each independently represents a hydrogen atom, an alkyl group, an alkenyl group, or an alkynyl group. $R^{si}$ is preferably an alkyl group. The alkyl group that $R^{si}$ can adopt is not particularly limited. A preferred range of the alkyl group that that $R^{si}$ can adopt is the same as a preferred range of an alkyl group that a trialkylsilyl group can adopt in a case where R represents the trialkylsilyl group. The alkenyl group that $R^{si}$ can adopt is not particularly limited. The alkenyl group is preferably a substituted or unsubstituted alkenyl group and more preferably a branched alkenyl group, and the alkenyl group preferably has 2 or 3 carbon atoms. The alkynyl group that $R^{si}$ can adopt is not particularly limited. The alkynyl group is preferably a substituted or unsubstituted alkynyl group and more preferably a branched alkynyl group, and the alkynyl group preferably has 2 or 3 carbon atoms.

$L^W$ is preferably a divalent linking group which is represented by any one of Formulae L-1 to L-5, L-13, L-17, and L-18 or a divalent linking group in which 2 or more divalent linking groups represented by any one of Formulae L-1 to L-5, L-13, L-17, and L-18 are bonded to each other, more preferably a divalent linking group which is represented by any one of Formulae L-1, L-3, L-13, and L-18 or a divalent linking group in which 2 or more divalent linking groups represented by any one of Formulae L-1, L-3, L-13, and L-18 are bonded to each other, and particularly preferably a divalent linking group which is represented by any one of Formulae L-1, L-3, L-13, and L-18 or a divalent linking group in which a divalent linking group represented by any one of Formulae L-3, L-13, and L-18 is bonded to a divalent linking group represented by Formula L-1.

It is preferable that, in the divalent linking group, in which a divalent linking group represented by any one of Formulae L-3, L-13, and L-18 and a divalent linking group represented by Formula L-1 are bonded to each other, the divalent linking group represented by Formula L-1 is bonded to the $R^W$ side.

From the viewpoint of chemical stability and carrier transport properties, $L^W$ is particularly preferably a divalent linking group containing a divalent linking group represented by Formula L-1, and more particularly preferably a divalent linking group represented by Formula L-1. It is most preferable that $L^W$ is a divalent linking group represented by Formula L-1 and $R^W$ is a substituted or unsubstituted alkyl group.

In Formula W, $R^W$ represents a substituted or unsubstituted alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having 2 or more silicon atoms, or a substituted or unsubstituted trialkylsilyl group.

In Formula W, in a case where $L^W$ adjacent to $R^W$ is a divalent linking group which is represented by Formula L-1, $R^W$ is preferably a substituted or unsubstituted alkyl group, an oxyethylene group, an oligo-oxyethylene group in which a repetition number v of an oxyethylene unit is equal to or greater than 2, a siloxane group, or an oligosiloxane group having 2 or more silicon atoms, and more preferably a substituted or unsubstituted alkyl group.

In Formula W, in a case where $L^W$ adjacent to $R^W$ is a divalent linking group which is represented by any one of Formula L-2 and Formulae L-4 to L-25, $R^W$ is more preferably a substituted or unsubstituted alkyl group.

In Formula W, in a case where $L^W$ adjacent to $R^W$ is a divalent linking group which is represented by Formula L-3, $R^W$ is preferably a substituted or unsubstituted alkyl group or a substituted or unsubstituted trialkylsilyl group.

In a case where $R^W$ is a substituted or unsubstituted alkyl group, the number of carbon atoms in the alkyl group is preferably 4 to 17, more preferably 6 to 14 from the viewpoint of chemical stability and carrier transport properties, and even more preferably 6 to 12. It is preferable that R is a long-chain alkyl group having carbon atoms within the above range, particularly, a long-chain linear alkyl group, because then the linearity of the molecule is improved, and hence the carrier mobility can be improved.

In a case where $R^W$ represents an alkyl group, the alkyl group may be linear, branched, or cyclic. It is preferable that the alkyl group is a linear alkyl group, because then the linearity of the molecule is improved, and hence the carrier mobility can be improved.

Particularly, from the viewpoint of improving the carrier mobility, $R^W$ and $L^W$ in Formula W preferably form a combination in which $L^W$ in Formula 1 is a divalent linking group represented by Formula L-1 and $R^W$ in Formula 1 is a linear alkyl group having 7 to 17 carbon atoms or a combination in which $L^W$ is a divalent linking group, in which a divalent linking group represented by any one of Formulae L-3, L-13, and L-18 and a divalent linking group represented by Formula L-1 are bonded to each other, and $R^W$ is a linear alkyl group. In a case where $L^W$ is a divalent linking group represented by Formula L-1 and $R^W$ is a linear alkyl group having 7 to 17 carbon atoms, $R^W$ is more preferably a linear alkyl group having 7 to 14 carbon atoms from the viewpoint of improving the carrier mobility, and particularly preferably a linear alkyl group having 7 to 12 carbon atoms.

In a case where $L^W$ is a divalent linking group, in which a divalent linking group represented by any one of Formulae L-3, L-13, and L-18 and a divalent linking group represented by Formula L-1 are bonded to each other, and $R^W$ is a linear alkyl group, $R^W$ is more preferably a linear alkyl group having 4 to 17 carbon atoms, even more preferably a linear alkyl group having 6 to 14 carbon atoms from the viewpoint of chemical stability and carrier transport properties, and particularly preferably a linear alkyl group having 6 to 12 carbon atoms from the viewpoint of improving the carrier mobility.

In contrast, from the viewpoint of improving the solubility of the compound in an organic solvent, $R^W$ is preferably a branched alkyl group.

In a case where $R^W$ is an alkyl group having a substituent, examples of the substituent include a halogen atom and the like, and the halogen atom is preferably a fluorine atom. In a case where $R^W$ is an alkyl group having a fluorine atom, all of the hydrogen atoms of the alkyl group may be substituted with fluorine atoms such that a perfluoroalkyl group is formed. Here, $R^W$ is preferably an unsubstituted alkyl group.

In the present specification, in a case where $R^W$ is an oligo-oxyethylene group in which the repetition number v of an oxyethylene unit is equal to or greater than 2, the "oligo-oxyethylene group" represented by R refers to a group represented by $-(OCH_2CH_2)_v-OY$ (the repetition number v of an oxyethylene unit represents an integer of equal to or greater than 2, and Y on the terminal represents a hydrogen atom or a substituent). In a case where Y on the terminal of the oligo-oxyethylene group is a hydrogen atom, the terminal becomes a hydroxyl group. The repetition number v of the oxyethylene unit is preferably 2 to 4, and more preferably 2 or 3.

It is preferable that the hydroxyl group on the terminal of the oligo-oxyethylene group is capped. That is, it is preferable that Y represents a substituent. In this case, the hydroxyl group is preferably capped with an alkyl group having 1 to 3 carbon atoms. That is, Y is preferably an alkyl group having 1 to 3 carbon atoms, more preferably a methyl group or an ethyl group, and particularly preferably a methyl group.

In a case where $R^W$ is a siloxane group or an oligosiloxane group having 2 or more silicon atoms, a repetition number of the siloxane unit is preferably 2 to 4, and more preferably 2 or 3. Furthermore, it is preferable that a hydrogen atom or an alkyl group is bonded to each silicon atom (Si atom). In a case where an alkyl group is bonded to the silicon atom, the number of carbon atoms in the alkyl group is preferably 1 to 3. For example, it is preferable that a methyl group or an ethyl group is bonded to the silicon atom. The same alkyl groups may be bonded to the silicon atoms, or different alkyl groups or hydrogen atoms may be bonded to the silicon atoms. All of the siloxane units constituting the oligosiloxane group may be the same as or different from each other, but it is preferable that all of the siloxane units are the same as each other.

In a case where $L^W$ adjacent to $R^W$ is a divalent linking group represented by Formula L-3, $R^W$ is preferably a substituted or unsubstituted trialkylsilyl group. In a case where $R^W$ is a substituted or unsubstituted trialkylsilyl group, the substituent of the silyl group is not particularly limited as long as the substituent is a substituted or unsubstituted alkyl group. However, it is preferable that the substituent is a branched alkyl group. The number of carbon atoms in the alkyl group bonded to each silicon atom is preferably 1 to 3. For example, it is preferable that a methyl group, an ethyl group, or an isopropyl group is bonded to the silicone atoms. The same alkyl groups or different alkyl groups may be bonded to the silicon atoms. In a case where $R^W$ is a trialkylsilyl group further having a substituent on an alkyl group, the substituent is not particularly limited.

In Formula W, the total number of carbon atoms contained in $L^W$ and $R^W$ is preferably 5 to 18. In a case where the total number of carbon atoms contained in $L^W$ and $R^W$ is equal to or greater than the lower limit of the above range, the carrier mobility is improved, and the driving voltage is reduced. In a case where the total number of carbon atoms contained in $L^W$ and $R^W$ is equal to or less than the upper limit of the above range, the solubility of the compound in an organic solvent is improved.

The total number of carbon atoms contained in $L^W$ and $R^W$ is preferably 5 to 14, more preferably 6 to 14, even more preferably 6 to 12, and particularly preferably 8 to 12.

In the compound represented by Formulae 1, the number of groups represented by Formula W among $R^{1a}$ to $R^{1f}$ is preferably 1 to 4, more preferably 1 or 2, and particularly preferably 2.

In the present invention, at least one of $R^{1a}$ or $R^{1b}$ in Formula 1 is preferably a group represented by Formula W for the following reason. That is, it is considered that from the viewpoint of excellent chemical stability of the compound, the highest occupied molecular orbital (HOMO) level, and packing in a film of molecules, the positions of $R^{1a}$ and $R^{1b}$ are suitable as substitution positions in Formula 1. Particularly, in Formula 1, in a case where a substituent is on the 2 sites of $R^{1a}$ and $R^{1b}$, high carrier density can be obtained. In Formula 1, $R^{1c}$ to $R^{1f}$ preferably each independently represent a hydrogen atom, a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having 1 or 2 carbon atoms, or a substituted or unsubstituted methylthio group.

—Compound represented by Formula 2—

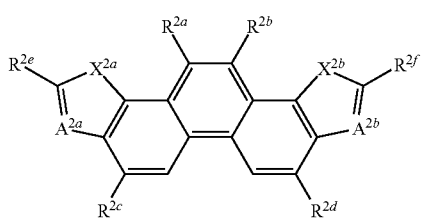

(2)

In Formula 2, $X^{2a}$ and $X^{2b}$ each independently represent $NR^{2i}$ (>N—$R^{2i}$), an O atom, or a S atom. From the viewpoint of ease of synthesis, $X^{2a}$ and $X^{2b}$ preferably each independently represent an O atom or a S atom. In contrast, from the viewpoint of improving the carrier mobility, at least one of $X^{2a}$ or $X^{2b}$ preferably represents a S atom.

$X^{2a}$ and $X^{2b}$ are preferably the same linking groups. It is more preferable that both of $X^{2a}$ and $X^{2b}$ are S atoms.

$R^{2i}$ represents a hydrogen atom, an alkyl group, an alkenyl group, an alkynyl group, or an acyl group. $R^{2i}$ is preferably a hydrogen atom or an alkyl group, more preferably an alkyl group having 1 to 14 carbon atoms, and particularly preferably an alkyl group having 1 to 4 carbon atoms.

In a case where $R^{2i}$ represents an alkyl group, the alkyl group may be linear, branched, or cyclic. It is preferable that the alkyl group is a linear alkyl group, because then the linearity of the molecule is improved, and hence the carrier mobility can be improved.

In Formula 2, $A^{2a}$ represents $CR^{2g}$ or a N atom, $A^{2b}$ represents $CR^{2h}$ or a N atom, and $R^{2g}$ and $R^{2h}$ each independently represent a hydrogen atom or a substituent. It is preferable that $A^{2a}$ represents $CR^{2g}$, or $A^{2b}$ represents $CR^{2h}$. It is more preferable that $A^{2a}$ represents $CR^{2g}$, and $A^{2b}$ represents $CR^{2h}$. $A^{2a}$ and $A^{2b}$ may be the same as or different from each other, but it is preferable that they are the same as each other.

In Formula 2, $R^{2e}$ and $R^{2g}$ may or may not form a ring by being bonded to each other, but it is preferable that they do not form a ring by being bonded to each other.

In Formula 2, $R^{2f}$ and $R^{2h}$ may or may not form a ring by being bonded to each other, but it is preferable that they do not form a ring by being bonded to each other.

In Formula 2, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ represents a substituent represented by Formula W.

Examples of the substituent that $R^{2a}$ to $R^{2h}$ can each independently adopt include the substituent X described above. The definition of the substituent represented by Formula W is as described above.

The substituent that $R^{2a}$ to $R^{2h}$ can each independently adopt is preferably an alkyl group, an aryl group, an alkenyl group, an alkynyl group, a heterocyclic group, an alkoxy group, an alkylthio group, or a substituent represented by Formula W, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W, particularly preferably a group having a chain length of a linking group, which will be described later, of equal to or less than 3.7 Å or a group represented by Formula W, and more particularly preferably a group represented by Formula W.

In the compound represented by Formula 2, among $R^{2a}$ to $R^{2h}$, the number of groups represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{2a}$ to $R^{2h}$ without particular limitation. From the viewpoint of improving the carrier mobility and improving the solubility in an organic solvent, the group represented by Formula W is preferably positioned in $R^{2e}$ or $R^{2h}$.

Among $R^{2a}$ to $R^{2h}$, the number of substituents other than a group represented by Formula W is preferably 0 to 4, more preferably 0 to 2, even more preferably 0 or 1, and particularly preferably 0.

In a case where $R^{2a}$ to $R^{2h}$ each represent a substituent other than a group represented by W, the substituent is preferably a group having a chain length of a linking group of equal to or less than 3.7 Å (=0.37 nm), more preferably a group having a chain length of a linking group of 1.0 to 3.7 Å, and even more preferably a group having a chain length of a linking group of 1.0 to 2.1 Å.

The chain length of a linking group refers to a length from a C atom to the terminal of a substituent R in a C (carbon atom)-R bond. The calculation for structural optimization can be performed using a density functional method (Gaussian 03 (Gaussian, Inc)/basis function: 6-31G*, exchange-correlation functional: B3LYP/LANL2DZ). Regarding a molecular length of typical substituents, a propyl group has a molecular length of 4.6 Å, a pyrrole group has a molecular length of 4.6 Å, a propynyl group has a molecular length of 4.5 Å, a propenyl group has a molecular length of 4.6 Å, an ethoxy group has a molecular length of 4.5 Å, a methylthio group has a molecular length of 3.7 Å, an ethenyl group has a molecular length of 3.4 Å, an ethyl group has a molecular length of 3.5 Å, an ethynyl group has a molecular length of 3.6 Å, a methoxy group has a molecular length of 3.3 Å, a methyl group has a molecular length of 2.1 Å, and a hydrogen atom has a molecular length of 1.0 Å.

In a case where $R^{2a}$ to $R^{2h}$ represent substituents other than a group represented by Formula W, the substituents preferably each independently represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms, and more preferably each independently represent a substituted or unsubstituted alkyl group having 2 or less carbon atoms.

In a case where $R^{2a}$ to $R^{2h}$ represent substituents other than a group represented by Formula W, and the substituents each independently represent a substituted alkyl group having 2 or less carbon atoms, examples of substituents that the alkyl group can have include a cyano group, a fluorine atom, a deuterium atom, and the like. Among these, a cyano group is preferable. In a case where $R^{2a}$ to $R^{2h}$ represent substituents other than a group represented by Formula W, the substituted or unsubstituted alkyl group having 2 or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{2a}$ to $R^{2h}$ represent substituents other than a group represented by Formula W, and the substituents each independently represent a substituted alkynyl group having 2 or less carbon atoms, examples of substituents that the alkynyl group can have include a deuterium atom and the like. In a case where $R^{2a}$ to $R^{2h}$ represent substituents other than a group represented by Formula W, examples of the substituted or unsubstituted alkynyl group having 2 or less carbon atoms that is represented by each of the substituents include an ethynyl group and an acetylene group substituted with a deuterium atom. Between these, an ethynyl group is preferable.

In a case where $R^{2a}$ to $R^{2h}$ represent substituents other than a group represented by Formula W, and the substituents each independently represent a substituted alkenyl group having 2 or less carbon atoms, examples of substituents that the alkenyl group can have include a deuterium atom and the like. In a case where $R^{2a}$ to $R^{2h}$ represent substituents other than a group represented by Formula W, examples of the substituted or unsubstituted alkenyl group having 2 or less carbon atoms that is represented by each of the substituents include an ethenyl group and an ethenyl group substituted with a deuterium atom. Between these, an ethenyl group is preferable.

In a case where $R^{2a}$ to $R^{2h}$ represent substituents other than a group represented by Formula W, and the substituents each independently represent a substituted acyl group having 2 or less carbon atoms, examples of substituents that the acyl group can have include a fluorine atom and the like. In a case where $R^{2a}$ to $R^{2h}$ represent substituents other than a group represented by Formula W, examples of the substituted or unsubstituted acyl group having 2 or less carbon atoms that is represented by each of the substituents include a formyl group, an acetyl group, and an acetyl group substituted with fluorine. Among these, a formyl group is preferable.

—Compound represented by Formula 3—

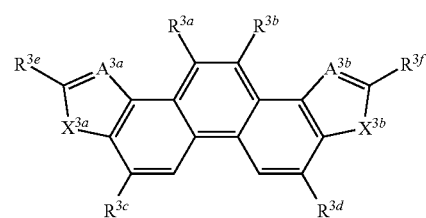

(3)

In Formula 3, $R^{3a}$ to $R^{3f}$ and $R^{3g}$ and $R^{3h}$, which will be described later, each independently represent a hydrogen atom or a substituent. Here, at least one of $R^{3a}$, $R^{3b}$, $R^{3c}$, $R^{3d}$, $R^{3e}$, $R^{3f}$, $R^{3g}$, or $R^{3h}$ represents a group represented by Formula W.

Examples of the substituent represented by $R^{3a}$ to $R^{3h}$ include the substituent X described above. The definition of a group represented by Formula W is as described above.

The substituent that $R^{3a}$ to $R^{3f}$ can each independently adopt is preferably an alkyl group, an aryl group, an alkenyl group, an alkynyl group, a heterocyclic group, an alkoxy group, an alkylthio group, or a substituent represented by Formula W, and more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W.

In Formula 3, $X^{3a}$ and $X^{3b}$ each independently represent a S atom, an O atom, or $NR^{3g}$ ($>N—R^{3g}$), and $R^{3g}$ represents a hydrogen atom or a substituent. X is preferably a S atom or an O atom. In Formula 3, $X^{3a}$ and $X^{3b}$ are preferably the same as each other.

$R^{3g}$ is preferably a hydrogen atom, an alkyl group, or an aryl group, more preferably an alkyl group having 1 to 14 carbon atoms, and particularly preferably an alkyl group having 4 to 12 carbon atoms. It is preferable that $R^{3g}$ is a long-chain alkyl group having carbon atoms within the above range, particularly, a long-chain linear alkyl group, because then the linearity of the molecule is improved, and hence the carrier mobility can be improved.

In a case where $R^{3g}$ is an alkyl group, the alkyl group may be linear, branched, or cyclic. It is preferable that the alkyl group is a linear alkyl group, because then the linearity of the molecule is improved, and hence the carrier mobility can be improved.

In Formula 3, $A^{3a}$ and $A^{3b}$ each independently represent $CR^{3h}$ or a N atom. It is preferable that $A^{3a}$ and $A^{3b}$ each independently represent $CR^{3h}$. In Formula 3, $A^{3a}$ and $A^{3b}$ may be the same as or different from each other, but it is preferable that they are the same as each other.

$R^{3h}$ is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

$R^{3h}$ is preferably a hydrogen atom, a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms, more preferably a hydrogen atom or a substituted or unsubstituted alkyl group having 2 or less carbon atoms, and particularly preferably a hydrogen atom.

In a case where $R^{3h}$ represents a substituted alkyl group having 2 or less carbon atoms, examples of substituents that the alkyl group can have include a cyano group, a fluorine atom, a deuterium atom, and the like. Among these, a cyano group is preferable. The substituted or unsubstituted alkyl group having 2 or less carbon atoms that is represented by $R^{3h}$ is preferably a methyl group, an ethyl group, or a methyl group substituted with a cyano group, more preferably a methyl group or a methyl group substituted with a cyano group, and particularly preferably a methyl group substituted with a cyano group.

In a case where $R^{3h}$ represents a substituted alkynyl group having 2 or less carbon atoms, examples of substituents that the alkynyl group can have include a deuterium atom and the like. Examples of the substituted or unsubstituted alkynyl group having 2 or less carbon atoms that is represented by $R^{3h}$ include an ethynyl group and an acetylene group substituted with a deuterium atom. Between these, an ethynyl group is preferable.

In a case where $R^{3h}$ represents a substituted alkenyl group having 2 or less carbon atoms, examples of substituents that the alkenyl group can have include a deuterium atom and the like. Examples of the substituted or unsubstituted alkenyl group having 2 or less carbon atoms that is represented by $R^{3h}$ include an ethenyl group and an ethenyl group substituted with a deuterium atom. Between these, an ethenyl group is preferable.

In a case where $R^{3h}$ represents a substituted acyl group having 2 or less carbon atoms, examples of substituents that the acyl group can have include a fluorine atom and the like. Examples of the substituted or unsubstituted acyl group having 2 or less carbon atoms that is represented by $R^{3h}$ include a formyl group, an acetyl group, and an acetyl group substituted with a fluorine atom. Among these, a formyl group is preferable.

—Compound represented by Formula 4—

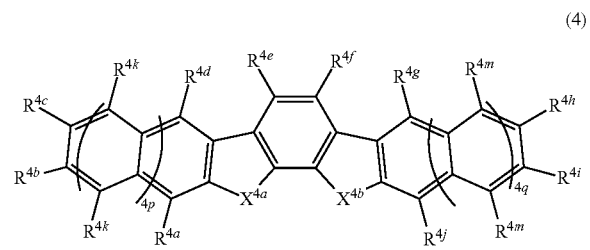

(4)

In Formula 4, $X^{4a}$ and $X^{4b}$ each independently represent an O atom, a S atom, or a Se atom.

It is preferable that $X^{4a}$ and $X^{4b}$ each independently represent an O atom or a S atom. From the viewpoint of improving the carrier mobility, it is more preferable that at least one of $X^{4a}$ or $X^{4b}$ is a S atom. It is preferable that $X^{4a}$ and $X^{4b}$ are the same linking groups. It is particularly preferable that both of $X^{4a}$ and $X^{4b}$ are S atoms.

In Formula 4, 4p and 4q each independently represent an integer of 0 to 2. It is preferable that 4p and 4q each independently represent 0 or 1, because then the mobility and the solubility can be achieved at the same time. It is more preferable that 4p=4q=0 or 4p=4q=1.

In Formula 4, $R^{4a}$ to $R^{4k}$ and $R^{4m}$ each independently represent a hydrogen atom, a halogen atom, or a group represented by Formula W, and at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, in Formula W represented by $R^{4e}$ and $R^{4f}$, $L^W$ is a divalent linking group represented by Formula L-2 or L-3. The definition of a group represented by Formula W is as described above.

The case where at least one of $R^{4e}$ or $R^{4f}$ is a group represented by Formula W corresponds to a case where none of $R^{4e}$ and $R^{4f}$ are a hydrogen atom or a halogen atom. In a case where at least one of $R^{4e}$ or $R^{4f}$ is a group represented by Formula W, in Formula W represented by $R^{4e}$ and $R^{4f}$, $L^W$ is preferably a divalent linking group represented by Formula L-3.

In a case where at least one of $R^4$ or $R^{4f}$ is a group represented by Formula W, both of $R^{4e}$ and $R^{4f}$ preferably represent a group represented by Formula W.

In a case where both of $R^{4e}$ and $R^{4f}$ represent a hydrogen atom or a halogen atom, $R^{4a}$ to $R^{4d}$, $R^{4g}$ to $R^{4k}$, and $R^{4m}$ each independently represent a hydrogen atom, a halogen atom, or a group represented by Formula W, and at least one or more out of $R^{4a}$, $R^{4b}$, $R^{4c}$, $R^{4d}$, $R^{4g}$, $R^{4h}$, $R^{4i}$, $R^{4j}$, $R^{4k}$, or $R^{4m}$ is a group represented by Formula W.

Examples of the halogen atom represented by $R^{4a}$ to $R^{4k}$ and $R^{4m}$ in Formula 4 include a fluorine atom, a chlorine atom, a bromine atom, and an iodine atom. The halogen atom is preferably a fluorine atom, a chlorine atom, or a bromine atom, more preferably a fluorine atom or a chlorine atom, and particularly preferably a fluorine atom.

Among $R^{4a}$ to $R^{4k}$ and $R^{4m}$ in the compound represented by Formula 4, the number of halogen atoms is preferably 0 to 4, more preferably 0 to 2, even more preferably 0 or 1, and particularly preferably 0.

In the compound represented by Formula 4, among $R^{4a}$ to $R^{4k}$ and $R^{4m}$, the number of groups represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{4a}$ to $R^{4k}$ and $R^{4m}$ without particular limitation. In the present invention, from the viewpoint of improving the carrier mobility and improving the solubility in an organic solvent, it is preferable that, in Formula 4, $R^{4a}$, $R^{4d}$ to $R^{4g}$, $R^{4j}$, $R^{4k}$, and $R^{4m}$ each independently represent a hydrogen atom or a halogen atom, $R^{4b}$, $R^{4c}$, $R^{4h}$, and $R^{4i}$ each independently represent a hydrogen atom, a halogen atom, or a group represented by Formula W, and at least one of $R^{4b}$, $R^{4c}$, $R^{4h}$, or $R^{4i}$ is a group represented by Formula W.

In the present invention, it is more preferable that $R^{4a}$, $R^{4c}$ to $R^{4h}$, and $R^{4j}$ each independently represent a hydrogen atom or a halogen atom, $R^{4b}$ and $R^{4i}$ each independently represent a hydrogen atom, a halogen atom, or a group represented by Formula W, and at least one of $R^{4b}$ or $R^{4i}$ is a group represented by Formula W.

In the present invention, it is even more preferable that both of $R^{4b}$ and $R^{4i}$ represent a group represented by Formula W, both of $R^{4c}$ and $R^{4h}$ represent a hydrogen atom or a halogen atom, or both of $R^{4c}$ and $R^{4h}$ represent a group represented by Formula W, and both of $R^{4b}$ and $R^{4i}$ represent a hydrogen atom or a halogen atom.

In the present invention, it is particularly preferable that both of $R^{4b}$ and $R^{4i}$ represent a group represented by Formula W and both of $R^{4c}$ and $R^{4h}$ represent a hydrogen atom or a halogen atom, or both of $R^{4c}$ and $R^{4h}$ represent a group represented by Formula W and both of $R^{4b}$ and $R^{4i}$ represent a hydrogen atom or a halogen atom.

In Formula 4, 2 or more groups among $R^{4a}$ to $R^{4k}$ and $R^{4m}$ may or may not form a ring by being bonded to each other, but it is preferable that they do not form a ring by being bonded to each other.

—Compound represented by Formula 5—

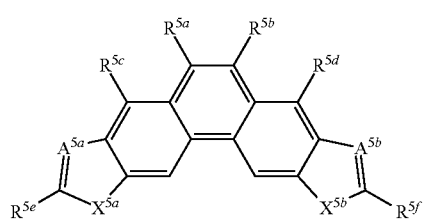

(5)

In Formula 5, $X^{5a}$ and $X^{5b}$ each independently represent $NR^{5'}$, an O atom, or a S atom. From the viewpoint of ease of synthesis, it is preferable that $X^{5a}$ and $X^{5b}$ each independently represent an O atom or a S atom. In contrast, from the viewpoint of improving the carrier mobility, it is preferable that at least one of $X^{5a}$ or $X^{5b}$ is a S atom. It is preferable that $X^{5a}$ and $X^{5b}$ are the same linking groups. It is more preferable that both of $X^{5a}$ and $X^{5b}$ are S atoms.

$R^{5i}$ represents a hydrogen atom, an alkyl group, an alkenyl group, an alkynyl group, an acyl group, an aryl group, or a heteroaryl group. $R^{5i}$ is preferably a hydrogen atom, an alkyl group, an alkenyl group, an alkynyl group, or an acyl group, more preferably a hydrogen atom or an alkyl group, even more preferably an alkyl group having 1 to 14 carbon atoms, and preferably an alkyl group having 1 to 4 carbon atoms.

In a case where $R^{5i}$ is an alkyl group, the alkyl group may be linear, branched, or cyclic. It is preferable that $R^{5i}$ is a linear alkyl group, because then the linearity of the molecule is improved, and hence the carrier mobility can be improved.

In Formula 5, $A^{5a}$ represents $CR^{5g}$ or a N atom, $A^{5b}$ represents $CR^{5h}$ or a N atom, and $R^5$ and $R^{5h}$ each independently represent a hydrogen atom or a substituent. It is preferable that $A^{5a}$ represents $CR^{5g}$ or $A^{5b}$ represents $CR^{5h}$. It is more preferable that $A^{5a}$ represents $CR^{5g}$ and $A^{5b}$ represents $CR^{5h}$. $A^{5a}$ and $A^{5b}$ may be the same as or different from each other, but it is preferable that they are the same as each other.

In Formula 5, $R^{5c}$ and $R^{5g}$ may or may not form a ring by being bonded to each other, but it is preferable that they do not form a ring by being bonded to each other.

In Formula 5, $R^{5e}$ and $R^{5i}$ may or may not form a ring by being bonded to each other, but it is preferable that they do not form a ring by being bonded to each other.

In Formula 5, $R^{5f}$ and $R^{5h}$ may or may not form a ring by being bonded to each other, but it is preferable that they do not form a ring by being bonded to each other.

In Formula 5, $R^{5f}$ and $R^{5i}$ may or may not form a ring by being bonded to each other, but it is preferable that they do not form a ring by being bonded to each other.

In Formula 5, $R^{5a}$ to $R^{5h}$ each independently represent a hydrogen atom or a substituent, and at least one of $R^{5a}$, $R^{5b}$, $R^{5c}$, Rd, $R^{5e}$, $R^{5f}$, $R^{5g}$, or $R^{5h}$ is a group represented by Formula W. Examples of the substituent represented by $R^{5a}$ to $R^{5h}$ include the substituent X described above. The definition of a group represented by Formula W is as described above.

In the compound represented by Formula 5, among $R^{5a}$ to $R^{5h}$, the number of groups represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{5a}$ to $R^{5h}$ without particular limitation. From the viewpoint of improving the carrier mobility and improving the solubility in an organic solvent, the group represented by Formula W is preferably positioned in $R^{5e}$ or $R^{5f}$.

Among $R^{5a}$ to $R^{5h}$, the number of substituents other than a group represented by Formula W is preferably 0 to 4, more preferably 0 to 2, even more preferably 0 or 1, and particularly preferably 0.

In a case where $R^{5a}$ to $R^{5h}$ represent substituents other than a group represented by Formula W, each of the substituents is preferably a group having a chain length of a linking group of equal to or less than 3.7 Å, more preferably a group having a chain length of a linking group of 1.0 to 3.7 Å, even more preferably a group having a chain length of a linking group of 1.0 to 2.1 Å. The definition of a chain length of a linking group is as described above.

In a case where $R^{5a}$ to $R^{5h}$ represent substituents other than a group represented by Formula W, the substituents preferably each independently represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms, and more preferably each independently represent a substituted or unsubstituted alkyl group having 2 or less carbon atoms.

In a case where $R^{5a}$ to $R^{5h}$ represent substituents other than a group represented by Formula W, and the substituents each independently represent a substituted alkyl group having 2 or less carbon atoms, examples of substituents that the alkyl group can have include a cyano group, a fluorine atom, a deuterium atom, and the like. Among these, a cyano group is preferable. In a case where $R^{5a}$ to $R^{5h}$ represent substituents other than a group represented by Formula W, the substituted or unsubstituted alkyl group having 2 or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{5a}$ to $R^{5h}$ represent substituents other than a group represented by Formula W, and the substituents each independently represent a substituted alkynyl group having 2 or less carbon atoms, examples of substituents that the alkynyl group can have include a deuterium atom and the like. In a case where $R^{5a}$ to $R^{5h}$ represent substituents other than a substituent represented by Formula W, examples of the substituted or unsubstituted alkynyl group having 2 or less carbon atoms that is represented by each of the substituents include an ethynyl group or an acetylene group substituted with a deuterium atom. Between these, an ethynyl group is preferable.

In a case where $R^{5a}$ to $R^{5h}$ represent substituents other than a group represented by Formula W, and the substituents each independently represent a substituted alkenyl group having 2 or less carbon atoms, examples of substituents that the alkenyl group can have include deuterium atom and the like. In a case where $R^{5a}$ to $R^{5h}$ represent substituents other than a group represented by Formula W, examples of the substituted or unsubstituted alkenyl group having 2 or less carbon atoms that is represented by each of the substituents include an ethenyl group and an ethenyl group substituted with a deuterium atom. Between these, an ethenyl group is preferable.

In a case where $R^{5a}$ to $R^{5h}$ represent substituents other than a group represented by Formula W, and the substituents each independently represent a substituted acyl group having 2 or less carbon atoms, examples of substituents that the acyl group can have include a fluorine atom and the like. In a case where $R^{5a}$ to $R^{5h}$ represent substituents other than a group represented by Formula W, examples of the substituted or unsubstituted acyl group having 2 or less carbon atoms that is represented by each of the substituents include a formyl group, an acetyl group, and an acetyl group substituted with a fluorine atom. Among these, a formyl group is preferable.

—Compound represented by Formula 6—

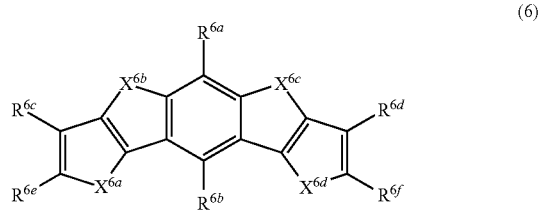

(6)

In Formula 6, $X^{6a}$ to $X^{6d}$ each independently represent $NR^6$, an O atom, or a S atom, and $R^{6g}$ represents a hydrogen atom, an alkyl group, an alkenyl group, an alkynyl group, an acyl group, an aryl group, or a heteroaryl group.

From the viewpoint of ease of synthesis, it is preferable that $X^{6a}$ to $X^{6d}$ each independently represent an O atom or a S atom. In contrast, from the viewpoint of improving the carrier mobility, at least one of $X^{6a}$, $X^{6b}$, $X^{6c}$, or $X^{6d}$ is preferably a S atom. It is preferable that $X^{6a}$ to $X^{6d}$ are the same linking groups. It is more preferable that all of $X^{6a}$ to $X^{6d}$ are S atoms.

$R^{6g}$ represents a hydrogen atom, an alkyl group, an alkenyl group, an alkynyl group, an acyl group, an aryl group, or a heteroaryl group. $R^{6g}$ is preferably a hydrogen atom, an alkyl group, an alkenyl group, an alkynyl group, or an acyl group, more preferably a hydrogen atom or an alkyl group, even more preferably an alkyl group having 1 to 14 carbon atoms, and particularly preferably an alkyl group having 1 to 4 carbon atoms.

In a case where $R^{6g}$ represents an alkyl group, the alkyl group may be linear, branched, or cyclic. However, it is preferable that $R^{6g}$ is a linear alkyl group, because then the linearity of the molecule is improved, and hence the carrier mobility can be improved.

In Formula 6, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ represents a group represented by Formula W. Examples of the substituents represented by $R^{6a}$ to $R^{6f}$ include the substituent X described above. The definition of a group represented by Formula W is as described above.

Among the substituents, the substituent that $R^{6a}$ to $R^{6f}$ can each independently adopt is preferably an alkyl group, an aryl group, an alkenyl group, an alkynyl group, a heterocyclic group, an alkoxy group, an alkylthio group, or a group represented by Formula W, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W, even more preferably a group, which will be described later, having a chain length of a linking group of equal to or less than 3.7 Å or a group represented by Formula W, and particularly preferably a group represented by Formula W.

In the compound represented by Formula 6, among $R^{6a}$ to $R^{6f}$, the number of groups represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{6a}$ to $R^{6f}$ without particular limitation, but the group represented by Formula W is preferably positioned in $R^{6c}$ to $R^{6f}$. From the viewpoint of improving the carrier mobility and improving the solubility in an organic solvent, the group represented by Formula W is more preferably positioned in $R^{6e}$ or $R^{6f}$.

Among $R^{6a}$ to $R^{6f}$, the number of substituents other than a group represented by Formula W is preferably 0 to 4, more preferably 0 to 2, even more preferably 0 or 1, and particularly preferably 0.

In a case where $R^{6a}$ to $R^{6f}$ represent substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{6a}$ to $R^{6f}$ represent substituents other than a group represented by Formula W, the substituents preferably each independently represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms, and more preferably each independently represent a substituted or unsubstituted alkyl group having 2 or less carbon atoms.

In a case where $R^{6a}$ to $R^{6f}$ represent substituents other than a group represented by Formula W, and the substituents each independently represent a substituted alkyl group having 2 or less carbon atoms, examples of substituents that the alkyl group can have include a cyano group, a fluorine atom, a deuterium atom, and the like. Among these, a cyano group is preferable. In a case where $R^{6a}$ to $R^{6f}$ represent substituents other than a group represented by Formula W, the substituted or unsubstituted alkyl group having 2 or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{6a}$ to $R^{6f}$ represent substituents other than a group represented by Formula W, and the substituents each independently represent a substituted alkynyl group having 2 or less carbon atoms, examples of substituents that the alkynyl group can have include a deuterium atom and the like. In a case where $R^{6a}$ to $R^{6f}$ represent substituents other than a group represented by Formula W, examples of the substituted or unsubstituted alkynyl group having 2 or less carbon atoms that is represented by each of the substituents include an ethynyl group and an acetylene group substituted with a deuterium atom. Between these, an ethynyl group is preferable.

In a case where $R^{6a}$ to $R^{6f}$ represent substituents other than a group represented by Formula W, and the substituents each independently represent a substituted alkenyl group having 2 or less carbon atoms, examples of substituents that the alkenyl group can have include a deuterium atom and the like. In a case where $R^{6a}$ to $R^{6f}$ represent substituents other than a group represented by Formula W, examples of the substituted or unsubstituted alkenyl group having 2 or less carbon atoms that is represented by each of the substituents include an ethenyl group and an ethenyl group substituted with a deuterium atom. Between these, an ethenyl group is preferable.

In a case where $R^{6a}$ to $R^{6f}$ represent substituents other than a group represented by Formula W, and the substituents each independently represent a substituted acyl group having 2 or less carbon atoms, examples of substituents that the acyl group can have include a fluorine atom and the like. In a case where $R^{6a}$ to $R^{6f}$ represent substituents other than a group represented by Formula W, examples of the substituted or unsubstituted acyl group having 2 or less carbon atoms that is represented by each of the substituents include a formyl group, an acetyl group, and an acetyl group substituted with a fluorine atom. Among these, a formyl group is preferable.

—Compound represented by Formula 7—

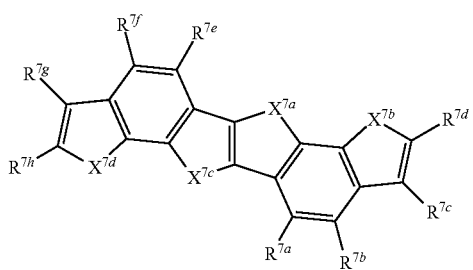

(7)

In Formula 7, $X^{7a}$ and $X^{7c}$ each independently represent a S atom, an O atom, a Se atom, or $NR^{7i}$ (>N—$R^{7i}$), and $X^{7b}$ and $X^{7d}$ each independently represent a S atom, an O atom, or a Se atom. From the viewpoint of ease of synthesis, it is preferable that $X^{7a}$ to $X^{7d}$ each independently represent an O atom or a S atom. In contrast, from the viewpoint of improving the carrier mobility, it is preferable that at least one of $X^{7a}$, $X^{7b}$, $X^{7c}$, or $X^{7d}$ is a S atom. It is preferable that $X^{7a}$ to $X^{7d}$ are the same linking groups. It is more preferable that all of $X^{7a}$ to $X^{7d}$ are S atoms.

In Formula 7, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

Examples of the substituent represented by $R^{7a}$ to $R^{7i}$ include the substituent X described above. The definition of a group represented by Formula W is as described above.

$R^{7i}$ is preferably a hydrogen atom or an alkyl group, more preferably an alkyl group having 5 to 12 carbon atoms, and particularly preferably an alkyl group having 8 to 10 carbon atoms.

In a case where $R^{7i}$ represents an alkyl group, the alkyl group may be linear, branched, or cyclic. However, from the viewpoint of overlapping of HOMO, it is preferable that $R^{7i}$ is a linear alkyl group.

In the compound represented by Formula 7, among $R^{7a}$ to $R^{7i}$, the number of substituents represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{7a}$ to $R^{7i}$ without particular limitation. The group represented by Formula W is preferably positioned in $R^{7d}$ or $R^{7h}$ from the viewpoint of improving the carrier mobility and improving the solubility in an organic solvent, and more preferably positioned in $R^{7d}$ and $R^{7h}$.

Among $R^{7a}$ to $R^{7i}$ of Formula 7, the number of substituents other than a group represented by Formula W is preferably 0 to 4, more preferably 0 to 2, even more preferably 0 or 1, and particularly preferably 0.

In a case where $R^{7a}$ to $R^{7i}$ are substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{7a}$ to $R^{7i}$ are substituents other than a group represented by Formula W, the substituents preferably each independently represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms, and more preferably each independently represent a substituted or unsubstituted alkyl group having 2 or less carbon atoms.

In a case where $R^{7a}$ to $R^{7i}$ are substituents other than a group represented by Formula W, and the substituents each independently represent a substituted alkyl group having 2 or less carbon atoms, examples of substituents that the alkyl group can have include a cyano group, a fluorine atom, a deuterium atom, and the like. Among these, a cyano group is preferable. In a case where $R^{7a}$ to $R^{7i}$ are substituents other than a group represented by Formula W, the substituted or unsubstituted alkyl group having 2 or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{7a}$ to $R^{7i}$ are substituents other than a group represented by Formula W, and the substituents each independently represent a substituted alkynyl group having 2 or less carbon atoms, examples of substituents that the alkynyl group can have include a deuterium atom and the like. In a case where $R^{7a}$ to $R^{7i}$ are substituents other than a substituent represented by Formula W, examples of the substituted or unsubstituted alkynyl group having 2 or less carbon atoms that is represented by each of the substituents include an ethynyl group and an acetylene group substituted with a deuterium atom. Between these, an ethynyl group is preferable.

In a case where $R^{7a}$ to $R^{7i}$ are substituents other than a group represented by Formula W, and the substituents each independently represent a substituted alkenyl group having 2 or less carbon atoms, examples of substituents that the alkenyl group can have include a deuterium atom and the like. In a case where $R^{7a}$ to $R^{7i}$ are substituents other than a substituent represented by Formula W, examples of the substituted or unsubstituted alkenyl group having 2 or less carbon atoms that is represented by each of the substituents include an ethenyl group and an ethenyl group substituted with a deuterium atom. Between these, an ethenyl group is preferable.

In a case where $R^{7a}$ to $R^{7i}$ are substituents other than a group represented by Formula W, and the substituents each independently represent a substituted acyl group having 2 or less carbon atoms, examples of substituents that the acyl group can have include a fluorine atom and the like. In a case where $R^{7a}$ to $R^{7i}$ are substituents other than a substituent represented by Formula W, examples of the substituted or unsubstituted acyl group having 2 or less carbon atoms that is represented by each of the substituents include a formyl group, an acetyl group, and an acetyl group substituted with a fluorine atom. Among these, a formyl group is preferable.

—Compound represented by Formula 8—

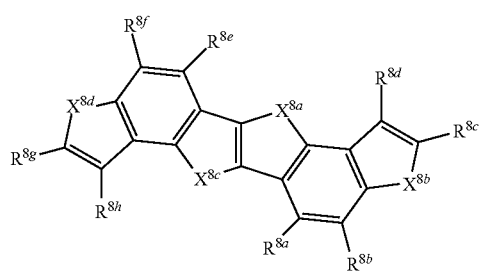

(8)

In Formula 8, $X^{8a}$ and $X^{8c}$ each independently represent a S atom, an O atom, a Se atom, or $NR^{8i}$, and $X^{8b}$ and $X^{8d}$ each independently represent a S atom, an O atom, or a Se atom. From the viewpoint of ease of synthesis, it is preferable that $X^{8a}$ to $X^{8d}$ each independently represent an O atom or a S atom. In contrast, from the viewpoint of improving the carrier mobility, it is preferable that at least one of $X^{8a}$, $X^{8b}$, $X^{8c}$, or $X^{8d}$ is a S atom. It is preferable that $X^{8a}$ to $X^{8d}$ are the same linking groups. It is more preferable that all of $X^{8a}$ to $X^{8d}$ are S atoms.

In Formula 8, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

Examples of the substituent represented by $R^{8a}$ to $R^{8i}$ include the substituent X described above. The definition of a group represented by Formula W is as described above.

$R^{8i}$ is preferably a hydrogen atom or an alkyl group, more preferably an alkyl group having 5 to 12 carbon atoms, and particularly preferably an alkyl group having 8 to 10 carbon atoms.

In a case where $R^{8i}$ is an alkyl group, the alkyl group may be linear, branched, or cyclic. From the viewpoint of the overlapping of HOMO, $R^{8i}$ is preferably a linear alkyl group.

In the compound represented by Formula 8, among $R^{8a}$ to $R^{8i}$, the number of substituents represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{8a}$ to $R^{8i}$ without particular limitation. The group represented by Formula W is preferably positioned in $R^{8c}$ or $R^{8g}$ from the viewpoint of improving the carrier mobility and improving the solubility in an organic solvent, and more preferably positioned in $R^{8c}$ and $R^{8g}$.

Among $R^{8a}$ to $R^{8i}$ of Formula 8, the number of substituents other than a group represented by Formula W is preferably 0 to 4, more preferably 0 to 2, even more preferably 0 or 1, and particularly preferably 0.

In a case where $R^{8a}$ to $R^{8i}$ are substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{8a}$ to $R^{8i}$ are substituents other than a group represented by Formula W, the substituents preferably each independently represent a substituted or unsubstituted alkyl group having 2 or less carbon atoms, a substituted or unsubstituted alkynyl group having 2 or less carbon atoms, a substituted or unsubstituted alkenyl group having 2 or less carbon atoms, or a substituted or unsubstituted acyl group having 2 or less carbon atoms, and more preferably each independently represent a substituted or unsubstituted alkyl group having 2 or less carbon atoms.

In a case where $R^{8a}$ to $R^{8i}$ are substituents other than a group represented by Formula W, and the substituents each independently represent a substituted alkyl group having 2 or less carbon atoms, examples of substituents that the alkyl group can have include a cyano group, a fluorine atom, a deuterium atom, and the like. Among these, a cyano group is preferable. In a case where $R^{8a}$ to $R^{8i}$ are substituents other than a group represented by Formula W, the substituted or unsubstituted alkyl group having 2 or less carbon atoms that is represented by each of the substituents is preferably methyl group, an ethyl group, or a methyl group substituted with a cyano group, more preferably a methyl group or a methyl group substituted with a cyano group, and particularly preferably a methyl group substituted with a cyano group.

In a case where $R^{8a}$ to $R^{8i}$ are substituents other than a group represented by Formula W, and the substituents each independently represent a substituted alkynyl group having 2 or less carbon atoms, examples of substituents that the alkynyl group can have include a deuterium atom and the like. In a case where $R^{8a}$ to $R^{8i}$ are substituents other than a group represented by Formula W, examples of the substituted or unsubstituted alkynyl group having 2 or less carbon atoms that is represented by each of the substituents include an ethynyl group and an acetylene group substituted with a deuterium atom. Between these, an ethynyl group is preferable.

In a case where $R^{8a}$ to $R^{8i}$ are substituents other than a group represented by Formula W, and the substituents each independently represent a substituted alkenyl group having 2 or less carbon atoms, examples of substituents that the alkenyl group can have include a deuterium atom and the like. In a case where $R^{8a}$ to $R^{8i}$ are substituents other than a group represented by Formula W, examples of the substituted or unsubstituted alkenyl group having 2 or less carbon atoms that is represented by each of the substituents include an ethenyl group and an ethenyl group substituted with a deuterium atom. Between these, an ethenyl group is preferable.

In a case where $R^{8a}$ to $R^{8i}$ are substituents other than a group represented by Formula W, and the substituents each independently represent a substituted acyl group having 2 or less carbon atoms, examples of substituents that the acyl group can have include a fluorine atom and the like. In a case where $R^{8a}$ to $R^{8i}$ are substituents other than a group represented by Formula W, examples of the substituted or unsubstituted acyl group having 2 or less carbon atoms that is represented by each of the substituents include a formyl group, an acetyl group, and an acetyl group substituted with a fluorine atom. Among these, a formyl group is preferable.

—Compound represented by Formula 9—

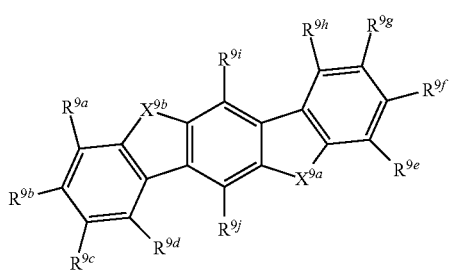

(9)

In Formula 9, $X^{9a}$ and $X^{9b}$ each independently represent an O atom, a S atom, or a Se atom. Among these, a S atom is preferable.

$R^{9c}$, $R^{9d}$, and $R^{9g}$ to $R^{9j}$ each independently represent a hydrogen atom, a halogen atom, or a substituent represented by Formula W. The definition of a group represented by Formula W is as described above.

$R^{9a}$, $R^{9b}$, $R^{9e}$, and $R^{9f}$ each independently represent a hydrogen atom or a substituent. Examples of the substituent represented by $R^{9a}$, $R^{9b}$, $R^{9e}$, and $R^{9f}$ include the substituent X described above.

It is preferable that $R^{9c}$, $R^{9d}$, and $R^{9g}$ to $R^{9j}$ each independently represent a hydrogen atom, a halogen atom, or a group represented by Formula W (here, $L^W$ is a group represented by any one of Formulae L-3, L-5, L-7 to L-9, and L-12 to L-24). Among these, $R^{9c}$, $R^{9d}$, and $R^{9g}$ to $R^{9j}$ more preferably represent a hydrogen atom.

$L^W$ is preferably a group represented by any one of Formulae L-3, L-5, L-13, L-17, and L-18.

It is preferable that at least one of $R^{9a}$, $R^{9b}$, $R^{9c}$, $R^{9d}$, $R^{9e}$, $R^{9f}$, $R^{9g}$, $R^{9h}$, or $R^{9i}$ is a group represented by Formula W.

In the compound represented by Formula 9, among $R^{9a}$ to $R^{9i}$, the number of substituents represented by Formula W is preferably 1 to 4 from the viewpoint of improving the carrier mobility and improving the solubility in an organic solvent, more preferably 1 or 2, and particularly preferably 2.

A group represented by Formula W can be positioned in any of $R^{9a}$ to $R^{9i}$ without particular limitation. The group represented by Formula W is preferably positioned in $R^{9b}$ or $R^{9f}$ from the viewpoint of improving the carrier mobility and improving the solubility in an organic solvent, and more preferably positioned in $R^{9b}$ and $R^{9f}$. Among $R^{9a}$ to $R^{9i}$ of Formula 9, the number of substituents other than a group represented by Formula W is preferably 0 to 4, more preferably 0 to 2, particularly preferably 0 or 1, and more particularly preferably 0.

—Compound represented by Formula 10—

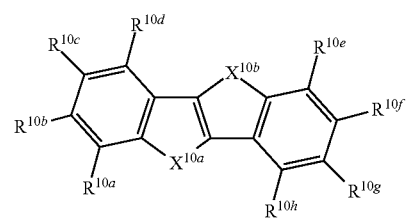

(10)

In Formula 10, $R^{10a}$ to $R^{10h}$ each independently represent a hydrogen atom or a substituent, and at least one of $R^{10a}$, $R^{10b}$, $R^{10c}$, $R^{10d}$, $R^{10e}$, $R^{10f}$, $R^{10g}$, or $R^{10h}$ represents a group represented by Formula W. Examples of the substituent represented by $R^{10a}$ to $R^{10h}$ include the substituent X described above. The definition of a substituent represented by Formula W is as described above.

It is preferable that $R^{10a}$ to $R^{10h}$ each independently represent a hydrogen atom, a halogen atom, or a substituent, and at least one of $R^{10a}$, $R^{10b}$, $R^{10c}$, $R^{10d}$, $R^{10e}$, $R^{10f}$, $R^{10g}$, or $R^{10h}$ is a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group.

Among $R^{10a}$ to $R^{10h}$ of Formula 10, at least one of $R^{10b}$ or $R^{10f}$ is preferably a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted arylthio group or a substituted or unsubstituted heteroarylthio group. It is even more preferable that both of $R^{10b}$ and $R^{10f}$ represent a substituted or unsubstituted arylthio group or a substituted or unsubstituted heteroarylthio group. It is particularly preferable that both of $R^{10b}$ and $R^{10f}$ represent a substituted or unsubstituted phenylthio group or a heteroarylthio group selected from the following group A. It is most preferable that both of $R^{10b}$ and $R^{10f}$ represent a substituted or unsubstituted phenylthio group or a heteroarylthio group represented by the following Formula A-17, A-18, or A-20.

The arylthio group is preferably a group in which a sulfur atom is linked to an aryl group having 6 to 20 carbon atoms, more preferably a naphthylthio group or a phenylthio group, and particularly preferably a phenylthio group.

The heteroarylthio group is preferably a group in which a sulfur atom is linked to a 3- to 10-membered heteroaryl group, more preferably a group in which a sulfur atom is linked to a 5- or 6-membered heteroaryl group, and particularly preferably the following group A (group represented by any one of Formulae A-14 to A-27).

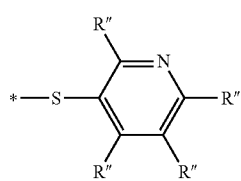

(A-14)

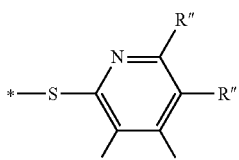
(A-15)

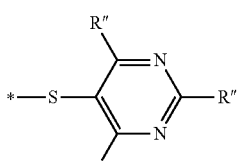
(A-16)

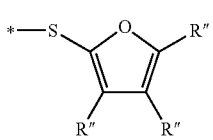
(A-17)

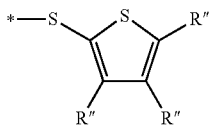
(A-18)

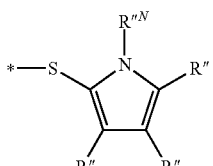
(A-20)

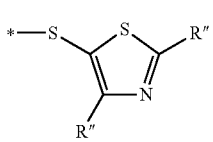
(A-21)

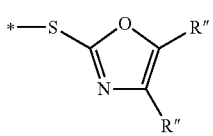
(A-23)

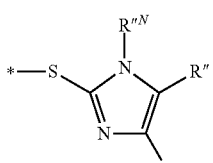
(A-24)

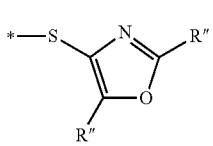
(A-26)

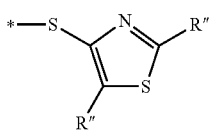
(A-27)

In group A, R″ and R″$^N$ each independently represent a hydrogen atom or a substituent.

It is preferable that R' in group A each independently represents a hydrogen atom or a group represented by Formula W.

R″$^N$ in group A preferably represents a substituent, more preferably represents an alkyl group, an aryl group, or a heteroaryl group, even more preferably represents an alkyl group, an aryl group substituted with an alkyl group, or a heteroaryl group substituted with an alkyl group, and particularly preferably represents an alkyl group having 1 to 4 carbon atoms, a phenyl group substituted with an alkyl group having 1 to 4 carbon atoms, or a 5-membered heteroaryl group substituted with an alkyl group having 1 to 4 carbon atoms.

As the alkyloxycarbonyl group, a group in which a carbonyl group is linked to an alkyl group having 1 to 20 carbon atoms is preferable. The number of carbon atoms in the alkyl group is more preferably 2 to 15, and particularly preferably 5 to 10.

As the aryloxycarbonyl group, a group in which a carbonyl group is linked to an aryl group having 6 to 20 carbon atoms is preferable. The number of carbon atoms in the aryl group is more preferably 6 to 15, and particularly preferably 8 to 12.

As the alkylamino group, a group in which an amino group is linked to an alkyl group having 1 to 20 carbon atoms is preferable. The number of carbon atoms in the alkyl group is more preferably 2 to 15, and particularly preferably 5 to 10.

Among $R^{10a}$ to $R^{10h}$, the number of substituents (hereinafter, referred to as other substituents as well) other than a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group is preferably 0 to 4, more preferably 0 to 2, even more preferably 0 or 1, and more particularly preferably 0.

$X^{10a}$ and $X^{10b}$ each independently represent a S atom, an O atom, a Se atom, or $NR^x$ (>N—$R^x$). From the viewpoint of improving the carrier mobility, it is preferable that at least one of $X^{10a}$ or $X^{10b}$ is a S atom. It is preferable that $X^{10a}$ and $X^{10b}$ are the same linking groups.

It is more preferable that both of $X^{10a}$ and $X^{10b}$ are S atoms.

$R^X$ each independently represents a hydrogen atom or a group represented by Formula W. The definition of a group represented by Formula W is as described above.

—Compound represented by Formula 11—

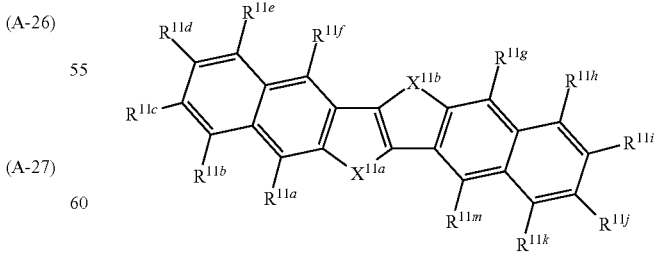

(11)

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11e}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ represents a group represented by Formula W. Examples of the substituent include the substituent X described above. The definition of a substituent represented by Formula W is as described above.

In Formula 11, from the viewpoint of improving the carrier mobility, at least one of $X^{11a}$ or $X^{11b}$ is a S atom. It is preferable that $X^{11a}$ and $X^{11b}$ are the same linking groups. It is more preferable that both of $X^{11a}$ and $X^{11b}$ are S atoms.

Among $R^{11a}$ to $R^{11k}$ and $R^{11m}$ of Formula 11, at least one of $R^{11c}$ or $R^{11i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{11e}$ and $R^{11i}$ represent a substituted or unsubstituted alkyl group.

—Compound represented by Formula 12—

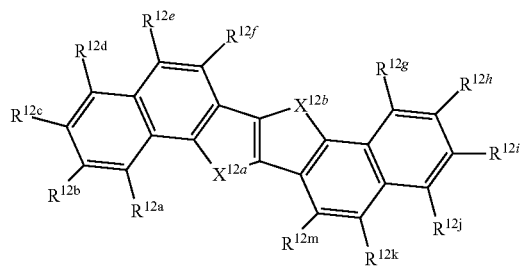

(12)

In Formula 12, $X^{12a}$ and $X^{12b}$ each independently represent a S atom, an O atom, a Se atom, or $NR^{12n}$, $R^{12a}$ to $R^{12k}$, $R^{12m}$ and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ represents a group represented by Formula W. Examples of the substituent include the substituent X described above. The definition of a substituent represented by Formula W is as described above.

In Formula 12, from the viewpoint of improving the carrier mobility, at least one of $X^{12a}$ or $X^{12b}$ is preferably a S atom. It is preferable that $X^{12a}$ and $X^{12b}$ are the same linking groups. It is more preferable that both of $X^{12a}$ and $X^{12b}$ are S atoms.

Among $R^{12a}$ to $R^{12k}$ and $R^{12m}$ of Formula 12, at least one of $R^{12c}$ or $R^{12i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{12c}$ and $R^{12i}$ represent a substituted or unsubstituted alkyl group.

—Compound represented by Formula 13—

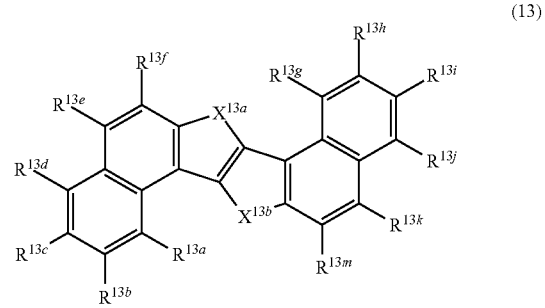

(13)

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ represents a group represented by Formula W. Examples of the substituent include the substituent X described above. The definition of a group represented by Formula W is as described above.

In Formula 13, from the viewpoint of improving the carrier mobility, at least one of $X^{13a}$ or $X^{13b}$ is preferably a S atom. It is preferable that $X^{13a}$ and $X^{13b}$ are the same linking groups. It is more preferable that both of $X^{13a}$ and $X^{13b}$ are S atoms.

Among $R^{13a}$ to $R^{13k}$ and $R^{13m}$ of Formula 13, at least one of $R^{13c}$ or $R^{13i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{13c}$ and $R^{13i}$ represent a substituted or unsubstituted alkyl group.

—Compound represented by Formula 14—

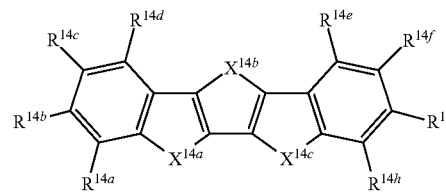

(14)

In Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ represents a group represented by Formula W. Examples of the substituent include the substituent X described above. The definition of a group represented by Formula W is as described above.

In a case where at least one of $R^{14a}$, $R^{14b}$, $R^{14c}$, $R^{14d}$, $R^{14e}$, $R^{14f}$, $R^{14g}$, or $R^{14h}$ is a group represented by Formula W, and $R^W$ is an alkyl group, $L^W$ is preferably a group represented by any one of Formulae L-2 to L-25.

In Formula 14, from the viewpoint of improving the carrier mobility, it is preferable that at least one of $X^{14a}$, $X^{14b}$, or $X^{14c}$ is a S atom. It is preferable that $X^{14a}$ to $X^{14c}$ are the same linking groups. It is more preferable that all of $X^{14a}$ to $X^{14c}$ are S atoms.

In a case where $R^W$ is an alkyl group, $L^W$ is preferably a group represented by any one of Formulae L-2 to L-5, L-13, L-17, and L-18, and more preferably a group represented by any one of Formulae L-3, L-13, and L-18.

Among $R^{14a}$ to $R^{14h}$ of Formula 14, at least one of $R^{14b}$ or $R^{14g}$ is preferably a group represented by Formula W. It is more preferable that both of $R^{14b}$ and $R^{14g}$ represent a group represented by Formula W.

—Compound represented by Formula 15—

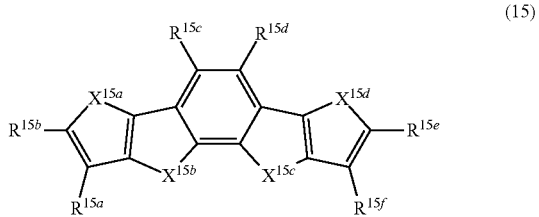

(15)

In Formula 15, $X^{15a}$ to $X^{15d}$ each independently represent a S atom, an O atom, a Se atom, or $NR^{15g}$. $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ represents a group represented by Formula W. Examples of the substituent include the substituent X described above. The definition of a group represented by Formula W is as described above.

In Formula 15, from the viewpoint of improving the carrier mobility, at least one of $X^{15a}$, $X^{15b}$, $X^{15c}$, or $X^{15d}$ is preferably a S atom. It is preferable that $X^{15a}$ to $X^{15d}$ are the same linking groups. It is more preferable that all of $X^{15a}$ to $X^{15d}$ are S atoms.

Among $R^{15a}$ to $R^{15f}$ of Formula 15, at least one of $R^{15b}$ or $R^{15e}$ is preferably a group represented by Formula W. It is more preferable that both of $R^{15b}$ and $R^{15e}$ represent a group represented by Formula W.

—Compound represented by Formula 16—

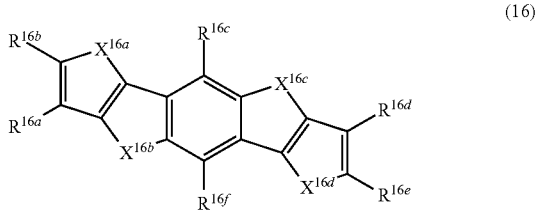

(16)

In Formula 16, $X^{16a}$ to $X^{16d}$ each independently represent a S atom, an O atom, a Se atom, or $NR^{16g}$. $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ represents a group represented by Formula W. Examples of the substituent include the substituent X described above. The definition of a group represented by Formula W is as described above.

$R^{16c}$ and $R^{16f}$ preferably represent a hydrogen atom, a halogen atom, or a group represented by Formula W (here, $L^W$ is a group represented by any one of Formulae L-3, L-5, L-7 to L-9, and L-12 to L-24). It is preferable that $R^{16a}$, $R^{16b}$, $R^{16d}$, $R^{16e}$, and $R^{16g}$ each independently represent a hydrogen atom or a substituent.

In Formula 16, $L^W$ is a group represented by any one of Formulae L-3, L-5, L-7 to L-9, and L-12 to L-24. In a case where $R^{16c}$ and $R^{16f}$ each represent a group represented by Formula W, $L^W$ is preferably a group represented by any one of Formulae L-3, L-5, L-13, L-17, and L-18.

In Formula 16, from the viewpoint of improving the carrier mobility, at least one of $X^{16a}$, $X^{16b}$, $X^{16c}$, or $X^{16d}$ is a S atom. It is preferable that $X^{16a}$ to $X^{16d}$ are the same linking groups. It is more preferable that all of $X^{16a}$ to $X^{16d}$ are S atoms.

It is preferable that at least one of $R^{16a}$ or $R^{16d}$ among $R^{16a}$ to $R^{16f}$ of Formula 16 represents a group represented by Formula W. It is more preferable that both of $R^{16a}$ and $R^{16d}$ represent a group represented by Formula W.

Furthermore, it is preferable that $R^{16c}$ and $R^{16f}$ represent a hydrogen atom.

Component A preferably has an alkyl group, more preferably has an alkyl group having 6 to 20 carbon atoms, and even more preferably has an alkyl group having 7 to 14 carbon atoms, on a condensed polycyclic aromatic ring in the aforementioned condensed polycyclic aromatic group. In a case where the above aspect is adopted, the mobility and the thermal stability of the obtained organic thin film transistor are further improved.

Furthermore, component A preferably has 1 or more alkyl groups, more preferably has 2 to 4 alkyl groups, and even more preferably has 2 alkyl groups, on a condensed polycyclic aromatic ring in the aforementioned condensed polycyclic aromatic group. In a case where the above aspect is adopted, the mobility and the thermal stability of the obtained organic thin film transistor are further improved.

The molecular weight of component A is not particularly limited, but is preferably equal to or less than 3,000, more preferably equal to or less than 2,000, even more preferably equal to or less than 1,000, and particularly preferably equal to or less than 850. In a case where the molecular weight is equal to or less than the aforementioned upper limit, the solubility in a solvent can be improved. In contrast, from the viewpoint of film quality stability of a thin film, the molecular weight is preferably equal to or greater than 300, more preferably equal to or greater than 350, and even more preferably equal to or greater than 400.

The method for synthesizing component A is not particularly limited, and component A can be synthesized with reference to known methods. Examples of methods for synthesizing the compounds represented by Formulae 1 to 16 include the methods disclosed in Journal of American Chemical Society, 116, 925 (1994), Journal of Chemical Society, 221 (1951), Org. Lett., 2001, 3, 3471, Macromolecules, 2010, 43, 6264, Tetrahedron, 2002, 58, 10197, JP2012-513459A, JP2011-46687A, Journal of Chemical Research. Miniprint, 3, 601-635 (1991), Bull. Chem. Soc. Japan, 64, 3682-3686 (1991), Tetrahedron Letters, 45, 2801-2803 (2004), EP2251342A, EP2301926A, EP2301921A, KR10-2012-0120886A, J. Org. Chem., 2011, 696, Org. Lett., 2001, 3, 3471, Macromolecules, 2010, 43, 6264, J. Org. Chem., 2013, 78, 7741, Chem. Eur. J., 2013, 19, 3721, Bull. Chem. Soc. Jpn., 1987, 60, 4187, J. Am. Chem. Soc., 2011, 133, 5024, Chem. Eur. J. 2013, 19, 3721, Macromolecules, 2010, 43, 6264-6267, J. Am. Chem. Soc., 2012, 134, 16548-16550, and the like.

From the viewpoint of the mobility of the organic thin film transistor, component A preferably contains at least one kind of compound represented by any one of Formulae 1 to 9, 14, and 15, and more preferably contains at least one kind of compound represented by any one of Formulae 1 to 9 and 15.

Specific preferred examples of component A will be shown below, but it goes without saying that the present invention is not limited thereto.

OSC-1
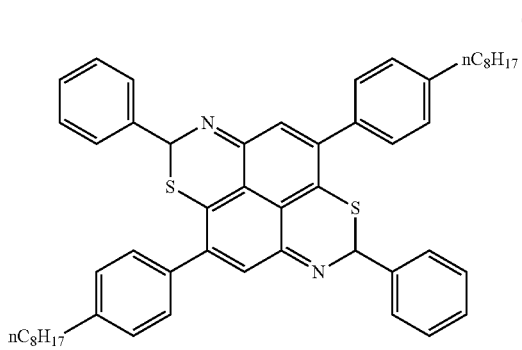
OSC-2
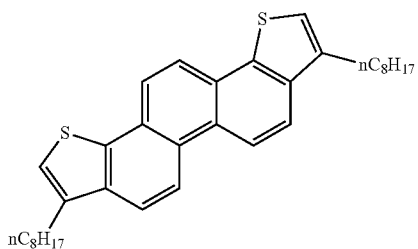
OSC-3
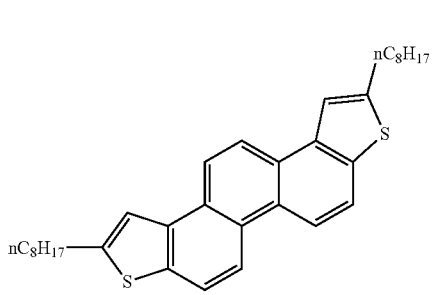
OSC-4
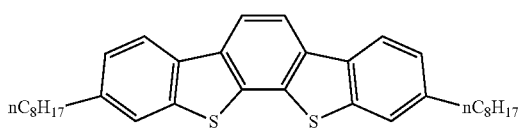
OSC-5
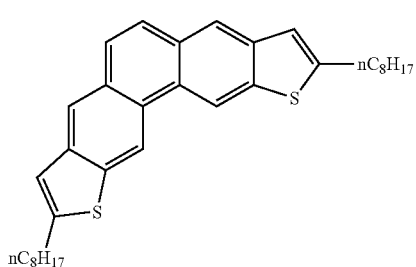
OSC-6
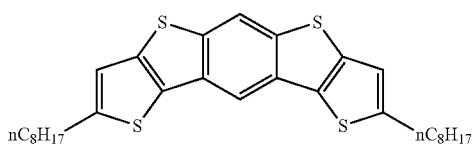
OSC-7
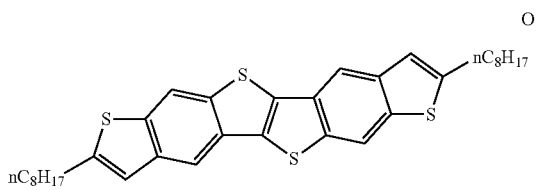
OSC-8
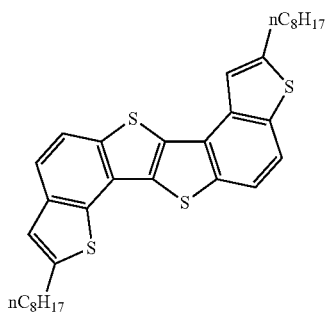
OSC-9
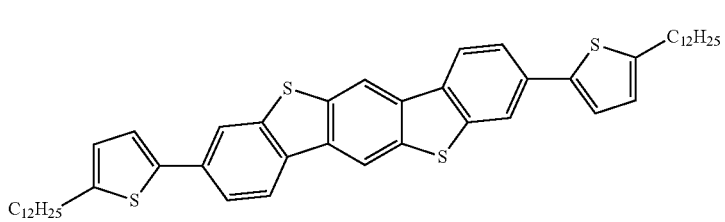
OSC-10
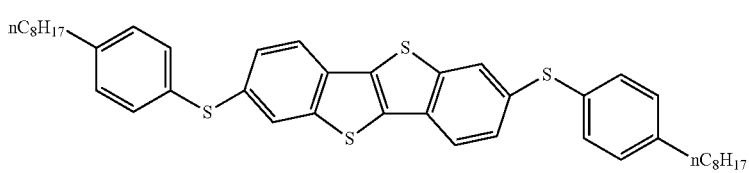

-continued
OSC-11
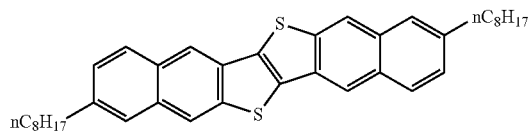
OSC-12
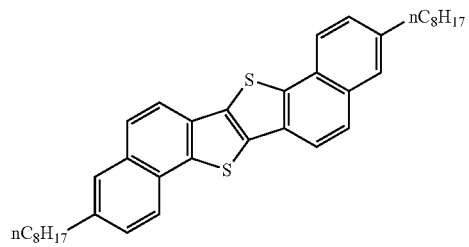
OSC-13
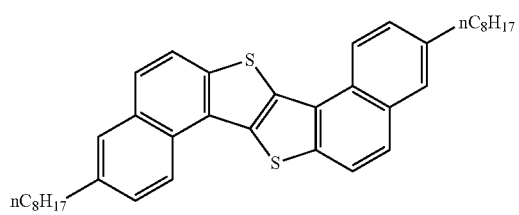
OSC-14
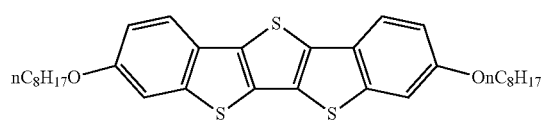
OSC-15
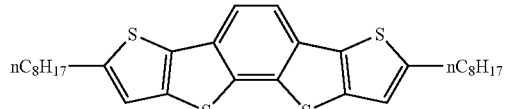
OSC-16
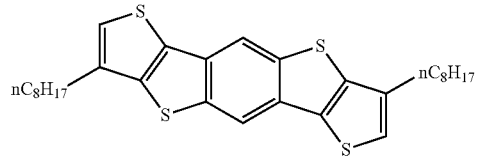
OSC-17
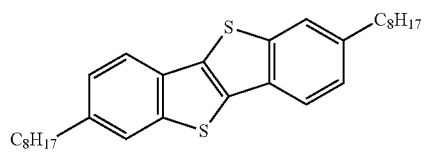
OSC-19
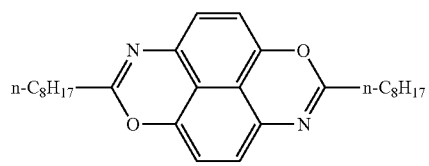
OSC-20
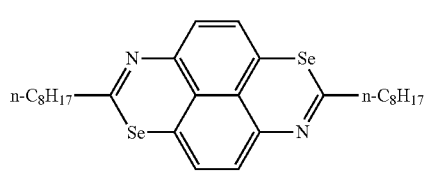
OSC-21
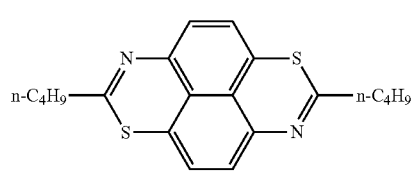
OSC-22
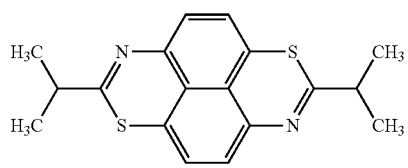
OSC-23
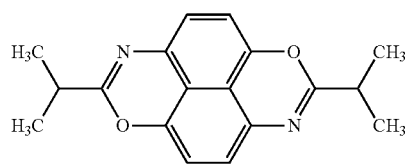
OSC-24
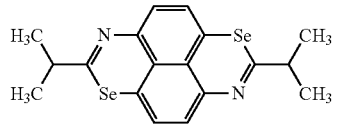
OSC-25
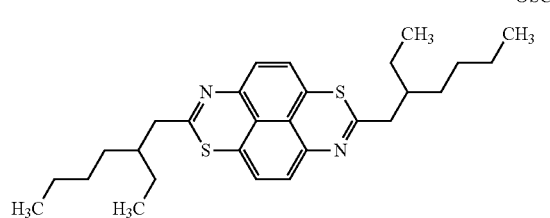

-continued
OSC-26
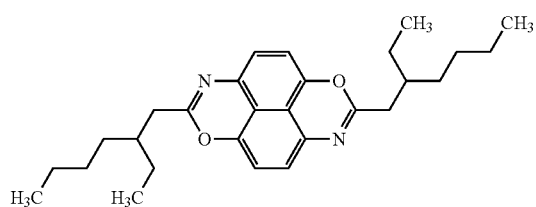
OSC-27
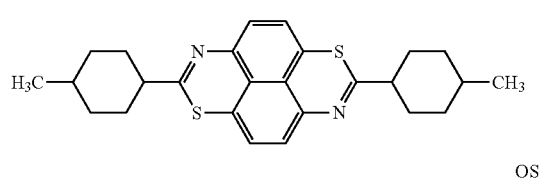
OSC-28
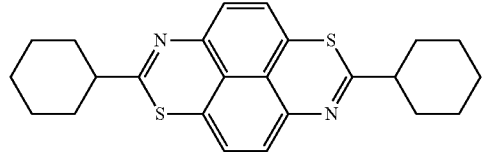
OSC-29
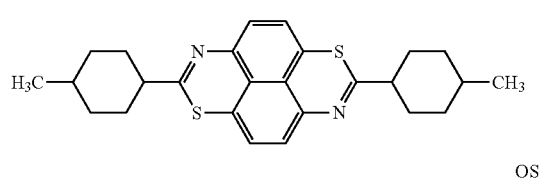
OSC-30
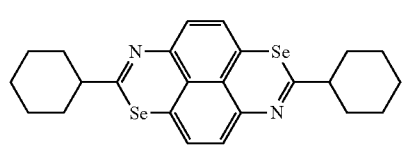
OSC-31
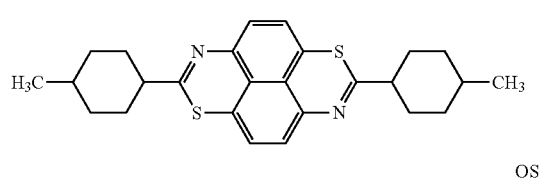
OSC-32
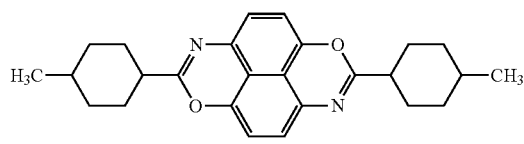
OSC-33
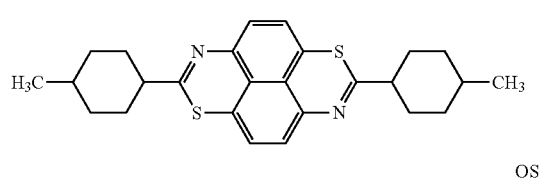
OSC-34
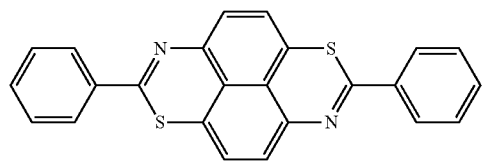
OSC-35
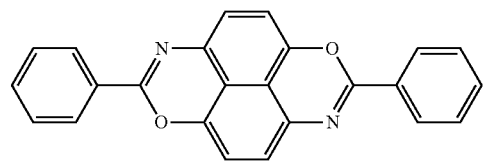
OSC-36
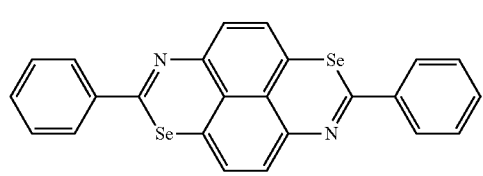
OSC-37
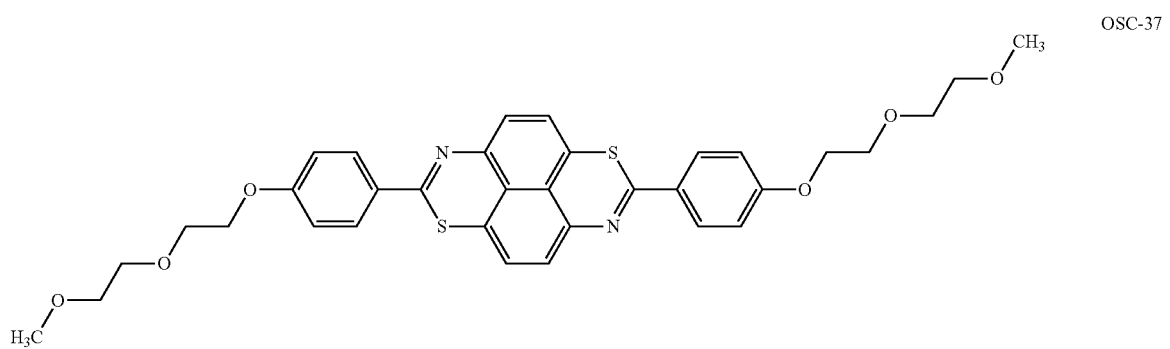

OSC-38
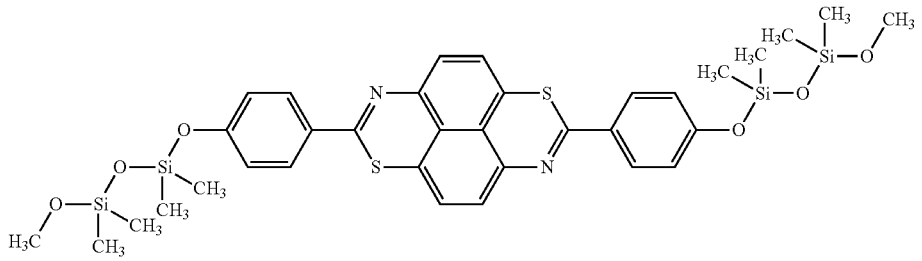
OSC-39
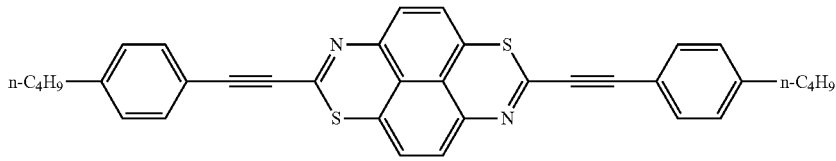
OSC-40
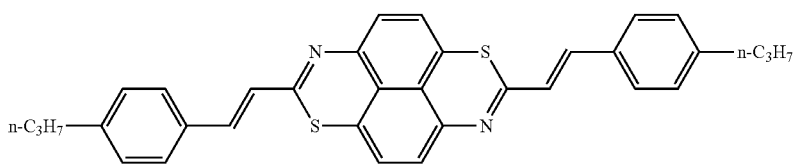
OSC-41
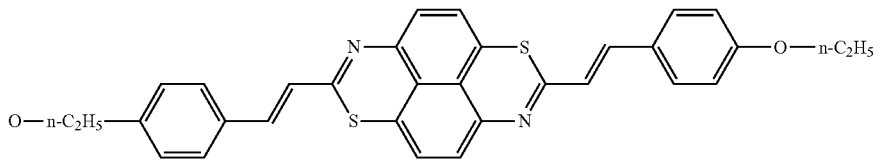
OSC-42
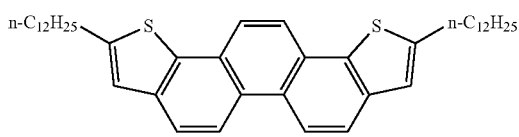
OSC-43
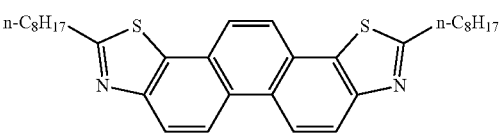
OSC-44
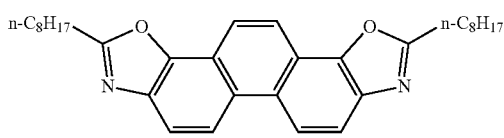
OSC-45
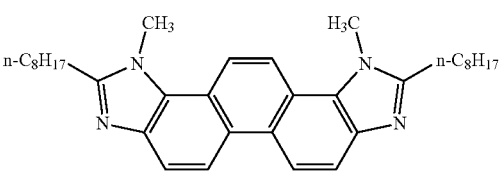
OSC-46
OSC-47
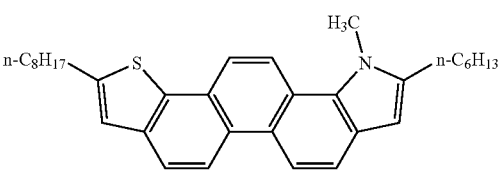
OSC-48
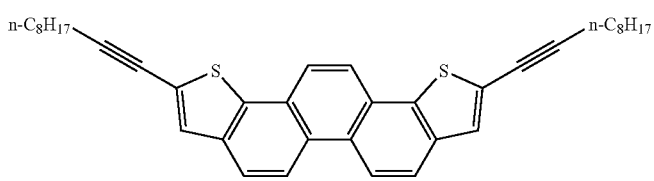

-continued
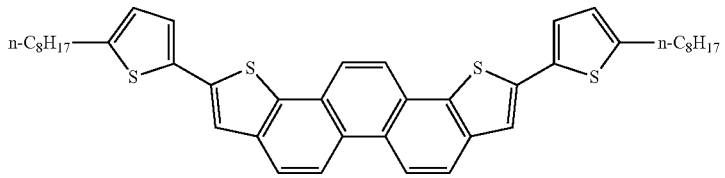
OSC-49
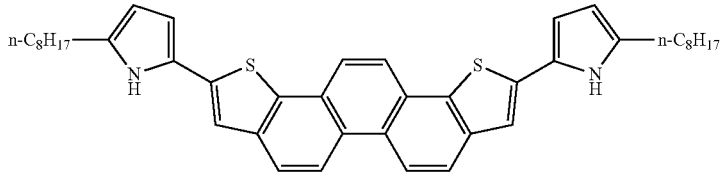
OSC-50
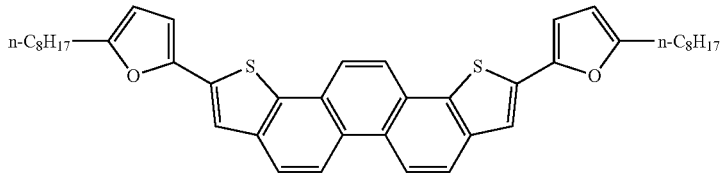
OSC-51
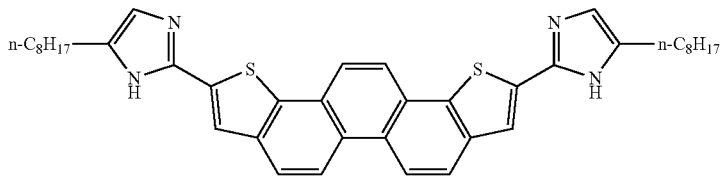
OSC-52
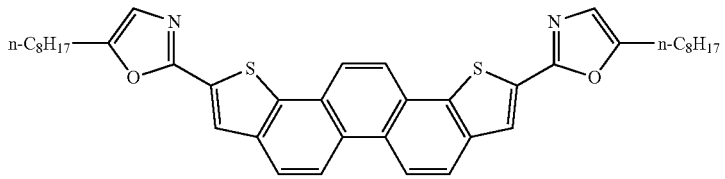
OSC-53
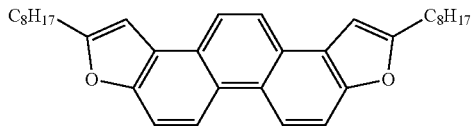
OSC-54
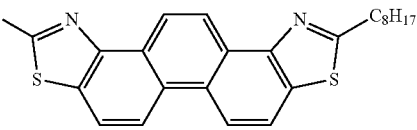
OSC-55
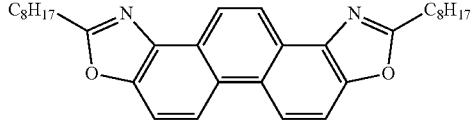
OSC-56
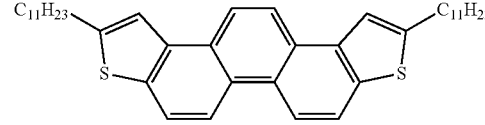
OSC-57
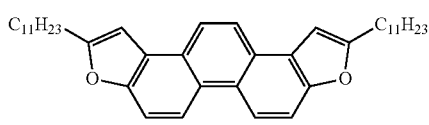
OSC-58
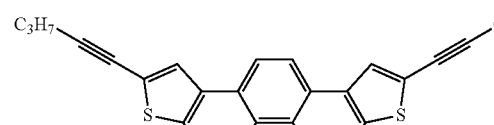
OSC-59
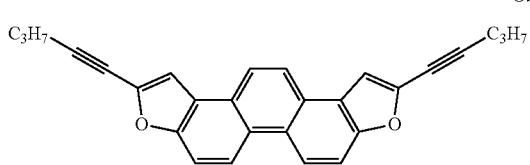
OSC-60
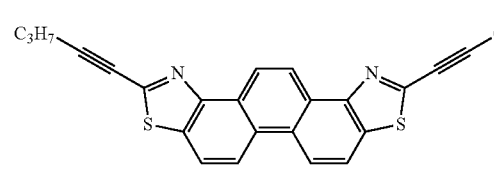
OSC-61

-continued
OSC-62
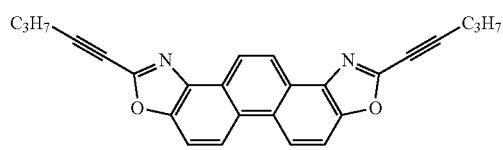
OSC-63
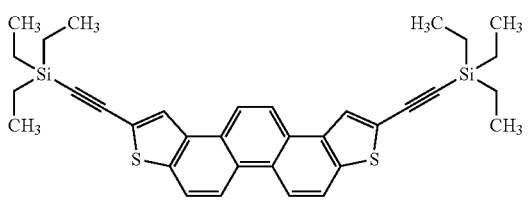
OSC-64
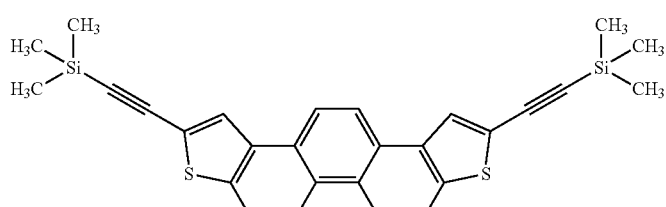
OSC-65
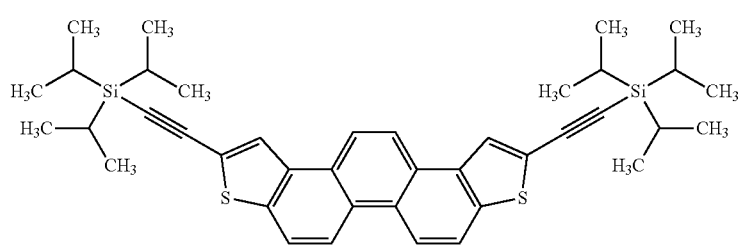
OSC-66
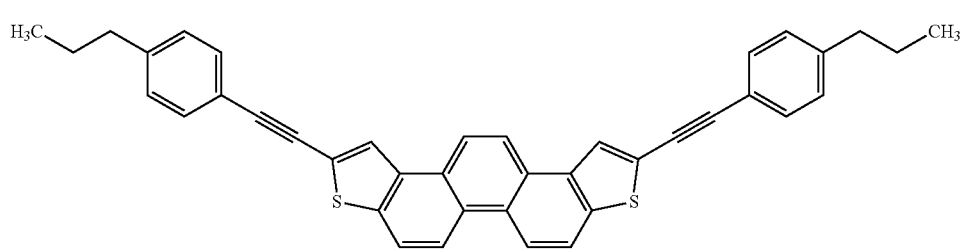
OSC-67
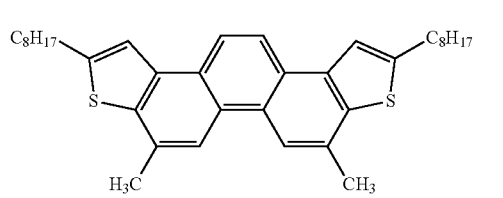
OSC-68
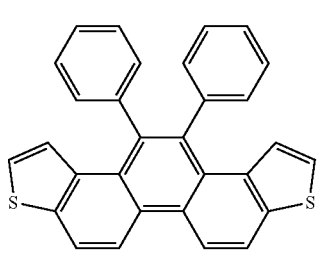
OSC-69
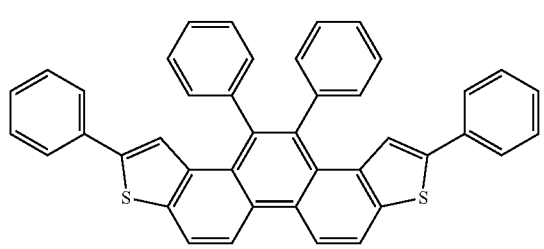
OSC-70
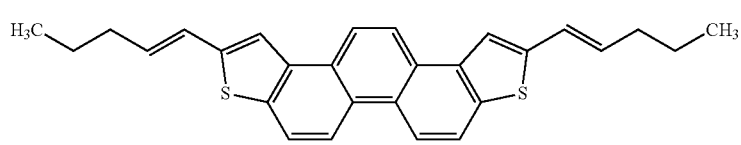

-continued
OSC-71
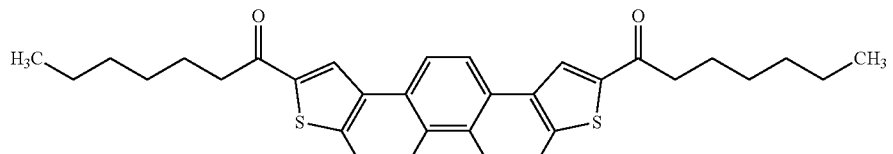
OSC-72
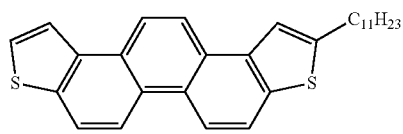
OSC-73
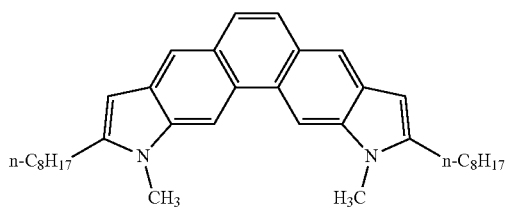
OSC-74
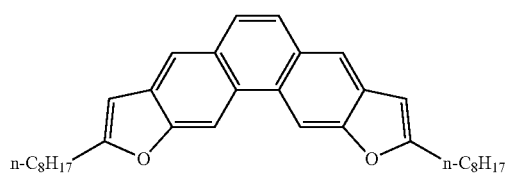
OSC-75
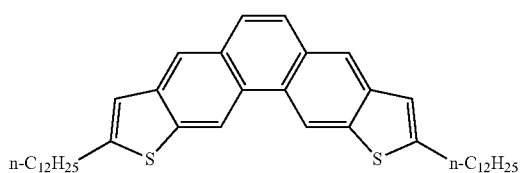
OSC-76
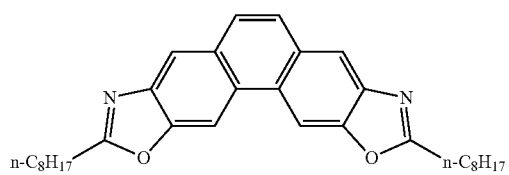
OSC-77
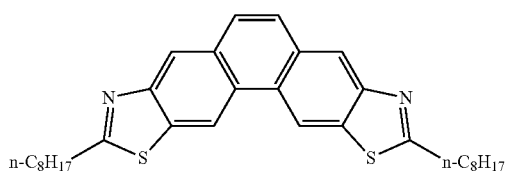
OSC-78
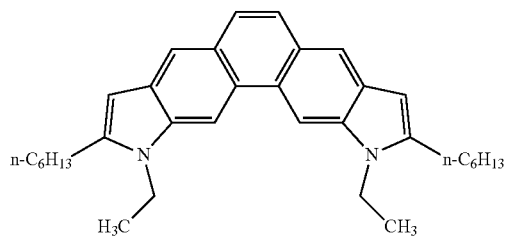
OSC-79
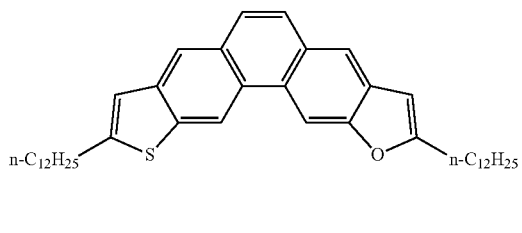
OSC-80
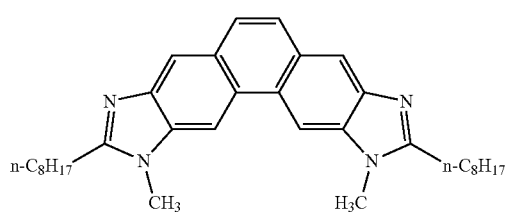
OSC-81
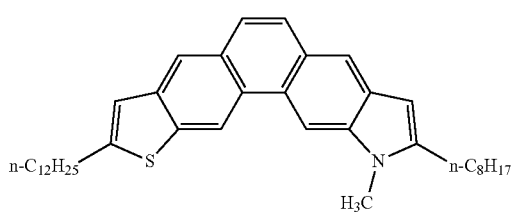
OSC-82
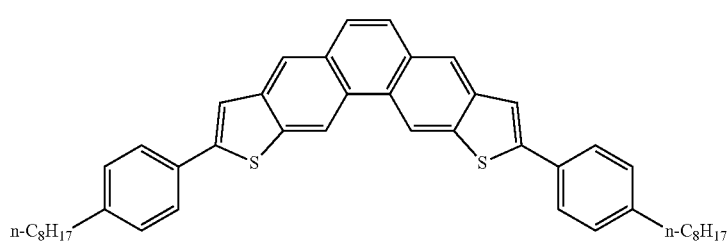

-continued
OSC-83
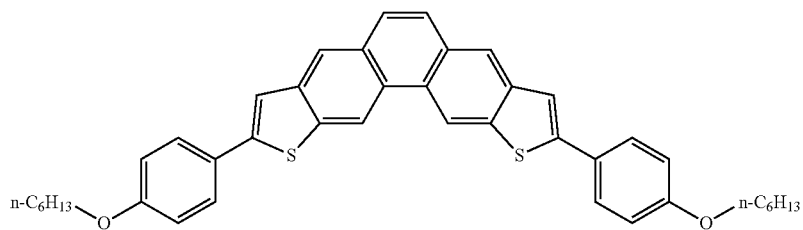
OSC-84
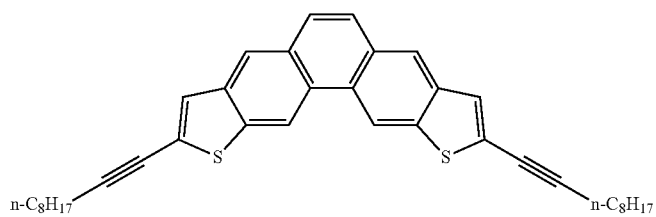
OSC-85
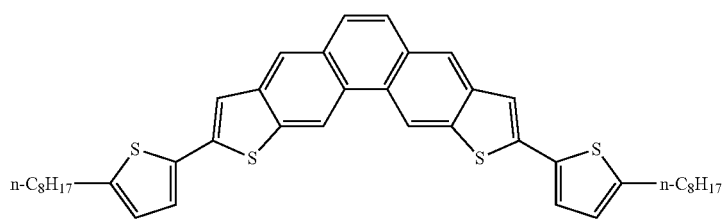
OSC-86
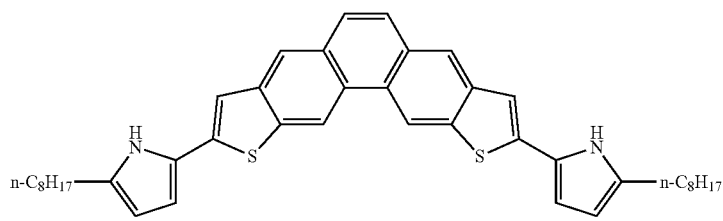
OSC-87
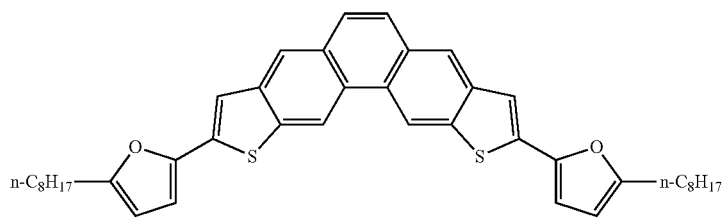
OSC-88
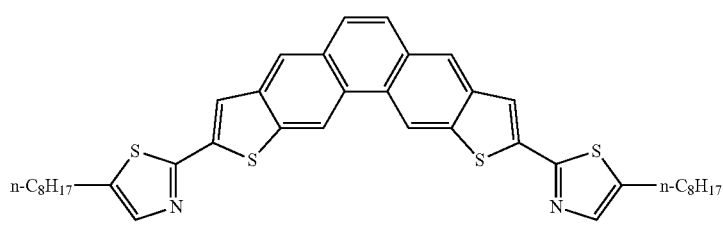
OSC-89
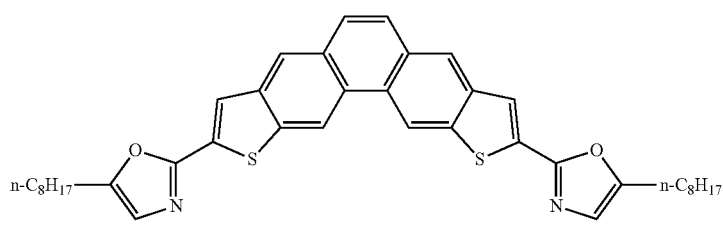

<Phenolic Reductant>

The organic semiconductor composition of the present invention contains a phenolic reductant. Because of having a function of inhibiting migration, the phenolic reductant is referred to as "migration inhibitor" or "phenolic preventor" in some cases.

In the present invention, migration (electromigration) means the migration of ions resulting from the ionization of a conductive substance such as a metal.

The ratio $M_{B/C}$ (phenolic reductant/polymer compound) of the content of the phenolic reductant to the content of the specific polymer compound (described later) is 0.1 to 5, preferably 0.2 to 4, and more preferably 0.3 to 3.3 based on mass. In a case where the ratio $M_{B/C}$ is within the above range, the characteristics of each component are excellently exhibited. Accordingly, the mobility and the insulation reliability of the prepared organic thin film transistor become excellent.

In contrast, in a case where the ratio $M_{B/C}$ is lower than 0.1, the function of the phenolic reductant is not sufficiently performed, and hence the insulation reliability of the prepared organic thin film transistor deteriorates. In a case where the ratio $M_{B/C}$ is higher than 5, the crystal growth of the organic semiconductor material is hindered, and hence the mobility of the prepared organic thin film transistor deteriorates. In this way, in a case where the ratio $M_Bc$ is outside the above range, the characteristics of each component are not sufficiently exhibited.

The content of the phenolic reductant is, with respect to the total mass of the organic semiconductor composition, preferably 0.01% to 5% by mass, more preferably 0.05% to 3% by mass, and even more preferably 0.2% to 2% by mass. In a case where the content of the phenolic reductant is within the above range, the mobility and the insulation reliability of the organic thin film transistor are further improved.

In the present invention, from the viewpoint of further improving the function of inhibiting migration, the phenolic reductant preferably contains at least Compound X or Compound Y described below.

Compound X: compound containing 2 or more groups selected from the group consisting of a group represented by Formula (A) and a group represented by Formula (B)

Compound Y: compound represented by Formula (C)

Hereinafter, each group in the formulae will be described.

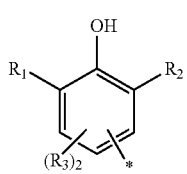

Formula (A)

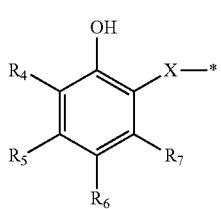

Formula (B)

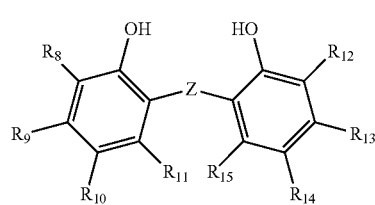

Formula (C)

In Formula (A), $R_1$ to $R_3$ each independently represent a hydrogen atom or a substituent.

Examples of the aforementioned substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy, an amino group (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinylamino group, a silyl group, and a combination of these.

More specifically, the substituent means a halogen atom (for example, a chlorine atom, a bromine atom, or an iodine atom), an alkyl group [it means a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group obtained by removing 1 hydrogen atom from bicycloalkane having 5 to 30 carbon atoms, for example, bicyclo[1.2.2]heptan-2-yl or bicyclo[2.2.2]octan-3-yl), a tricyclo structure consisting of a large number of cyclic structures, and the like. An alkyl group in a substituent described below (for example, an alkyl group of an alkylthio group) also means the alkyl group having the concept described above], an alkenyl group [it means a substituted or unsubstituted linear, branched, or cyclic alkenyl group; these also include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group obtained by removing 1 hydrogen atom from cycloalkene having 3 to 30 carbon atoms, for example, 2-cyclopenten-1-yl or 2-cyclohexen-1-yl), and a bicycloalkenyl group (a substituted or unsubstituted bicycloalkenyl group and preferably a substituted or unsubstituted bicycloalkenyl group having 5 to 30 carbon atoms, that is, a monovalent group obtained by removing 1 hydrogen atom from bicycloalkene having 1 double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, an ethynyl, propargyl, or trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group obtained by removing 1 hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy), an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methyl-anilino, or diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenylcarbonylamino), an aminocarbonylamino group (preferably substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), alkyl and aryl sulfonylamino groups (preferably substituted or unsubstituted alkylsulfonylamino having 1 to 30 carbon atoms and substituted or unsubstituted arylsulfonylamino having 6 to 30 carbon atoms, for example, methylsulfonylamino, butylsulfonyl amino, phenylsulfonylamino, or 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, alkyl and aryl sulfinyl groups (preferably a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl), alkyl and aryl sulfonyl groups (preferably a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, or p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms that is bonded to a carbonyl group through the carbon atoms, for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an arylazo group and a heterocyclic azo group (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, or 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), and a silyl group (preferably a substituted or unsubstituted silyl group having 3 to 30 carbon atoms, for example, trimethylsilyl, t-butyldimethylsilyl, or phenyldimethylsilyl).

Among the above functional groups, those having a hydrogen atom may be substituted with the aforementioned groups after the hydrogen atom is removed. Examples of such functional groups include an alkylcarbonylaminosulfonyl group, an arylcarbonylaminosulfonyl group, an alkylsulfonylaminocarbonyl group, an arylsulfonylaminocarbonyl group, and the like. Examples of these include methylsulfonylaminocarbonyl, p-methylphenylsulfonylaminocarbonyl, acetylaminosulfonyl, and benzoylaminosulfonyl groups, and the like.

In the present specification, "substituent" in the description of the phenolic reductant means the above substituents.

Particularly, in view of further improving the mobility and/or the insulation reliability of the obtained organic thin film transistor (hereinafter, simply described as "in view of further improving the effects of the present invention" as well), $R_1$ and $R_2$ preferably each independently represent a hydrogen atom, an alkyl group, or an alkoxy group, and more preferably each independently represent an alkyl group having 1 to 4 carbon atoms. Furthermore, in view of further improving the effects of the present invention, $R_3$ preferably represents a hydrogen atom or an alkyl group.

$R_1$ and $R_2$ do not simultaneously represent a hydrogen atom.

In addition, in the formulae, * represents a binding position.

In Formula (B), $R_4$ represents a substituent. The definition of the substituent as described above.

Particularly, in view of further improving the effects of the present invention, $R_4$ is preferably an alkyl group or an alkoxy group, and more preferably an alkyl group having 1 to 4 carbon atoms.

$R_5$ to $R_7$ each independently represent a hydrogen atom or a substituent. The definition of the substituent is as described above.

Particularly, in view of further improving the effects of the present invention, $R_5$ and $R_7$ preferably each independently represent a hydrogen atom or an alkyl group.

$R_6$ is preferably a hydrogen atom, an alkyl group, or an alkoxy group, and more preferably an alkyl group having 1 to 4 carbon atoms.

X represents a divalent linking group. Examples of the divalent linking group include a linear, branched, or cyclic divalent aliphatic hydrocarbon group (for example, an alkylene group having 1 to 12 carbon atoms, more specifically, a methylene group, an ethylene group, a propylene group, or the like), a linear, branched, or cyclic divalent aromatic hydrocarbon group (for example, a phenylene group), —O—, —S—, —SO$_2$—, —NR$_{20}$—, —CO—, —NH—, —COO—, —CONR$_{20}$—, —O—CO—O—, —SO$_3$—, —NHCOO—, —SO$_2$NR$_{20}$—, —NH—CO—NH—, a group obtained by combining these (for example, an alkyleneoxy group, an alkyleneoxycarbonyl group, or an alkylenecarbonyloxy group), and the like. Herein, $R_{20}$ represents a hydrogen atom or an alkyl group having 1 to 5 carbon atoms.

* represents a binding position.

In Formula (C), $R_8$ and $R_{12}$ each independently represent a substituent. The definition of the substituent is as described above.

Particularly, in view of further improving the effects of the present invention, $R_8$ and $R_{12}$ preferably each independently represent an alkyl group or an alkoxy group, and more preferably each independently represent an alkyl group having 1 to 4 carbon atoms.

$R_9$ to $R_{11}$ and $R_{13}$ to $R_{15}$ each independently represent a hydrogen atom or a substituent. The definition of the substituent is as described above.

Particularly, in view of further improving the effects of the present invention, $R_9$ to $R_1$ and $R_{13}$ to $R_{15}$ preferably each independently represent a hydrogen atom or an alkyl group, and more preferably each independently represent a hydrogen atom.

$R_9$, $R_{11}$, $R_{13}$, and $R_{15}$ preferably each independently represent a hydrogen atom or an alkyl group. $R_{10}$ and $R_{14}$ preferably each independently represent a hydrogen atom, an alkyl group, or an alkoxy group, and more preferably each independently represent an alkyl group having 1 to 4 carbon atoms.

Z represents —COR$_{16}$R$_{17}$—, —O—, —S—, —SO—, —SO$_2$—, —NR—, —PR—, —POR—, —COCO—, —NHNH—, or —S—S—.

R represents a hydrogen atom or a substituent. The definition of the substituent is as described above. R is preferably a hydrogen atom or an alkyl group.

$R_{16}$ and $R_{17}$ each independently represent a hydrogen atom or a substituent. The definition of the substituent is as described above.

Compound X contains at least 2 groups selected from the group consisting of the group represented by Formula (A) and the group represented by Formula (B) described above. In view of further improving the effects of the present invention, Compound X preferably contains 3 or more groups described above, and more preferably contains 4 or more groups described above. The upper limit of the number of the groups is not particularly limited. However, in view of synthesis, the upper limit of the number of the groups contained in Compound X is preferably equal to or less than 12, and more preferably equal to or less than 6.

Furthermore, in view of further improving the effects of the present invention, Compound X preferably contains at least the group represented by Formula (A). Particularly, the number of groups represented by Formula (A) contained in Compound X is more preferably within the suitable range described above.

Compound X may be a polymer compound or a low-molecular weight compound. For example, the polymer compound may be a multibranched polymer (a hyperbranched polymer, a dendrimer, or the like).

The molecular weight of Compound X and Compound Y is not particularly limited. In view of further improving the effects of the present invention, the molecular weight is preferably equal to or less than 3,000, and more preferably equal to or less than 2,000. The lower limit of the molecular weight is not particularly limited, but in view of the crystallinity of the organic semiconductor material, the lower limit is preferably equal to or greater than 330 and more preferably equal to or greater than 500.

As a suitable aspect of Compound X, in view of further improving the effects of the present invention, a compound represented by Formula (D) is exemplified.

(Rx)n-L-(Ry)m     Formula (D)

In Formula (D), Rx is a group selected from the group consisting of a group represented by Formula (E) and a group represented by Formula (B). The definition of the group represented by Formula (B) is as described above.

The definition of $R_1$ to $R_3$ in the group represented by Formula (E) is the same as the definition of each of the groups in the group represented by Formula (A).

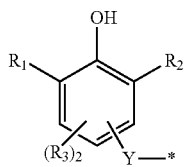

Formula (E)

In Formula (E), Y represents a single bond or a divalent linking group. The definition of the divalent linking group is the same as the definition of the divalent linking group represented by X described above. Examples of suitable aspects Y include an alkylene group and -$L_{10}$-$L_{11}$-$L_{10}$- ($L_{10}$: alkylene group, $L_{11}$: ester group or amide group), and the alkylene group may contain —O—.

* represents a binding position. Here, none of $R_1$ and $R_2$ are a hydrogen atom.

In a case where n is equal to or greater than 2, a plurality of Rx's may be the same as or different from each other.

Ry represents a hydrogen atom or a substituent. The definition of the substituent is as described above.

Particularly, in view of further improving the effects of the present invention, Ry is preferably a hydrogen atom, an alkyl group, or an aryl group. In a case where m is equal to or greater than 2, a plurality of Ry's may be the same as or different from each other.

L represents a (n+m)-valent linking group. For example, in a case where n+m=2, L represents a divalent linking group; in a case where n+m=3, L represents a trivalent linking group; in a case where n+n=4, L represents a tetravalent linking group; in a case where n+m=5, L represents a pentavalent linking group; and in a case where n+m=6, L represents a hexavalent linking group.

In view of further improving the effects of the present invention, examples of suitable aspects of L include a group selected from the group consisting of groups represented by Formulae (1) to (10). * represents a binding position.

In Formulae (1), (2), (8), and (9), n+m=2. In Formulae (3) to (5), n+m=3. In Formula (6), n+m=4. In Formulae (7) and (10), n+m=6.

In Formula (10), $L_1$ represents a single bond or a divalent linking group. The definition of the divalent linking group is the same as the definition of the divalent linking group represented by X.

*—S—S—*    Formula (1)

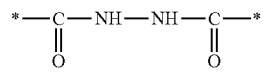

Formula (2)

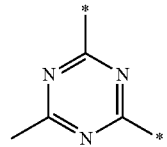

Formula (3)

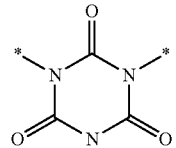

Formula (4)

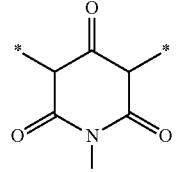

Formula (5)

Formula (6)

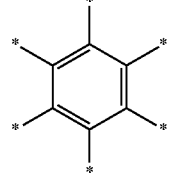

Formula (7)

*—S—*    Formula (8)

*—O—*    Formula (9)

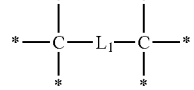

Formula (10)

n represents an integer of 2 to 6, m represents an integer of 0 to 4, and n and m satisfy n+m≤6.

Particularly, in view of further improving the effects of the present invention, n preferably represents an integer of 2 to 4, m preferably represents an integer of 0 to 2, and m is preferably 0.

Examples of suitable aspects of the relationship between n and m include an aspect in which n represents an integer of 2 to 4, m represents an integer of 0 to 2, and n and m satisfy n+m≤4.

Examples of suitable aspects of the molecular weight of the compound represented by Formula (D) include the range of the molecular weight of Compound X described above.

Examples of the aforementioned phenolic reductant include the following compounds.

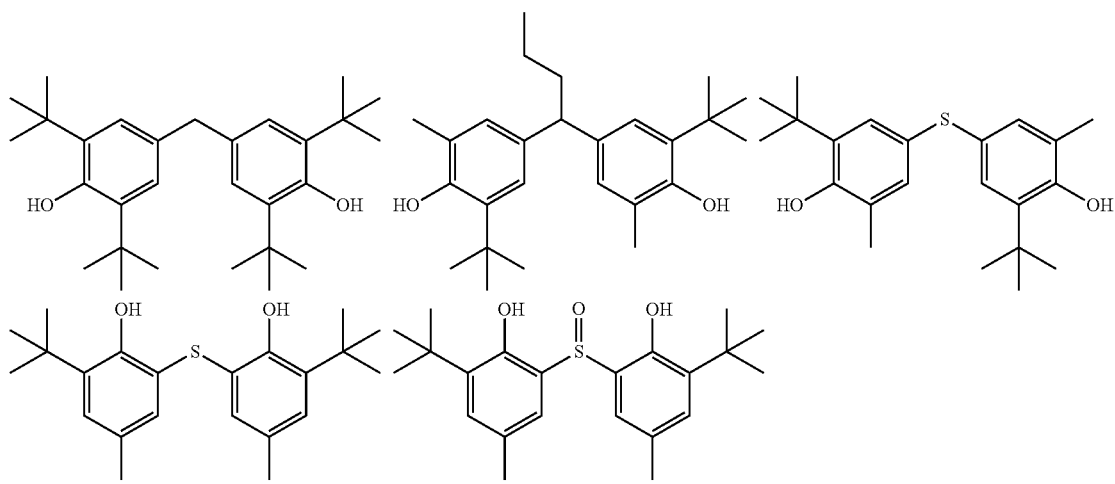
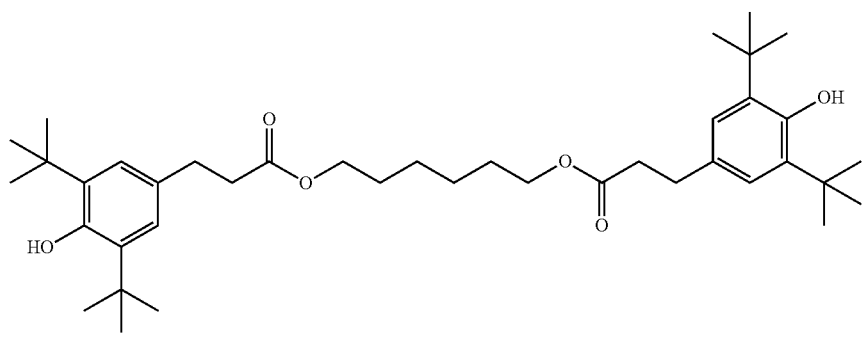
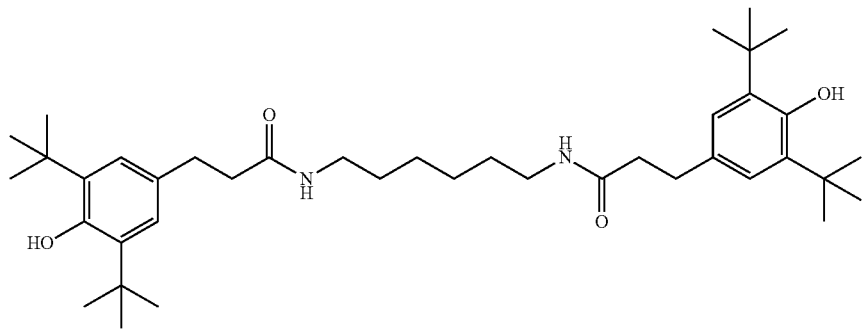
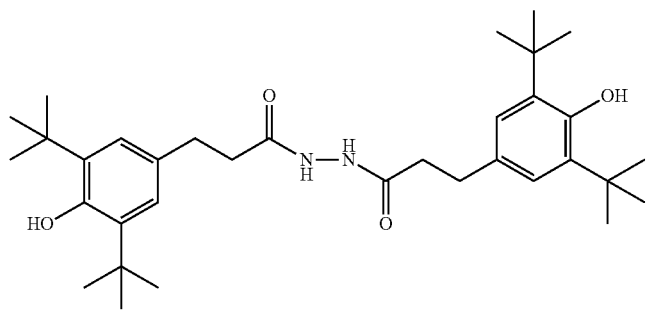

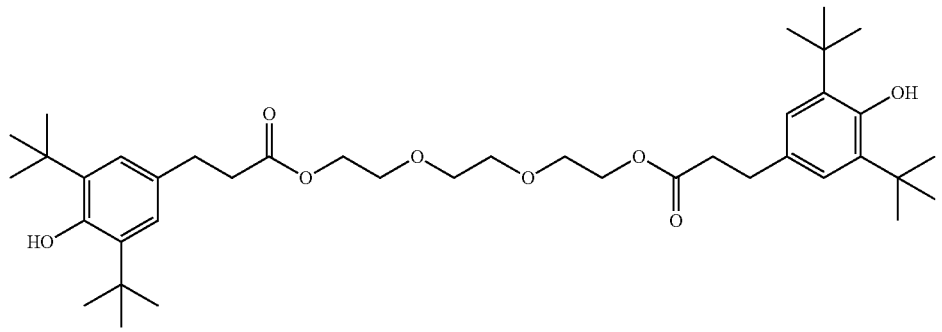
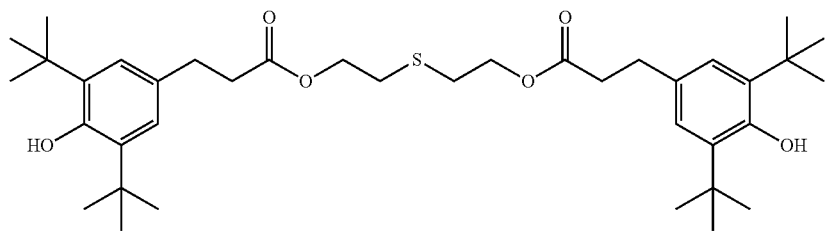
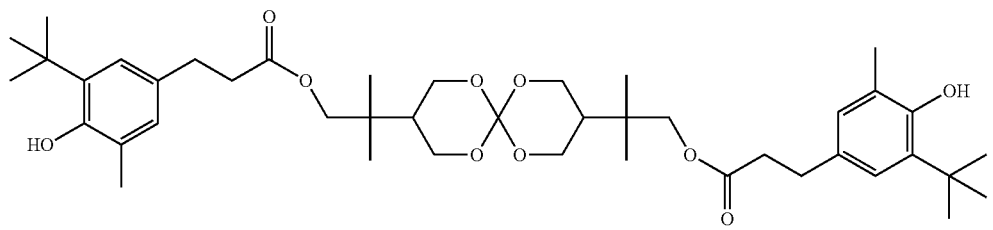
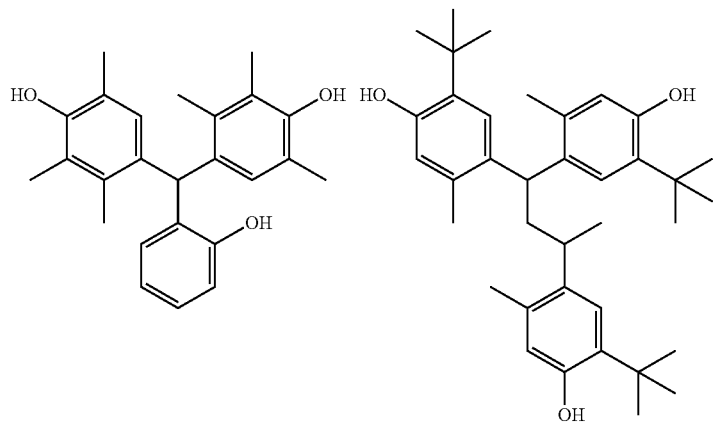
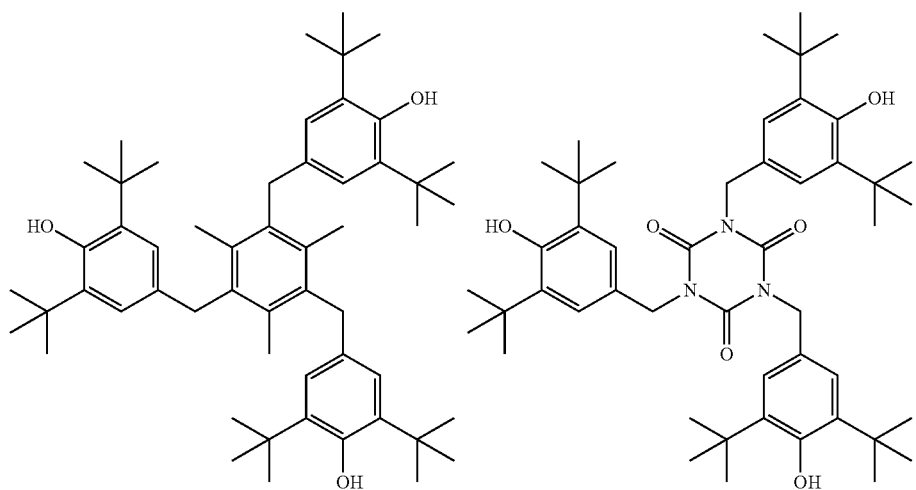

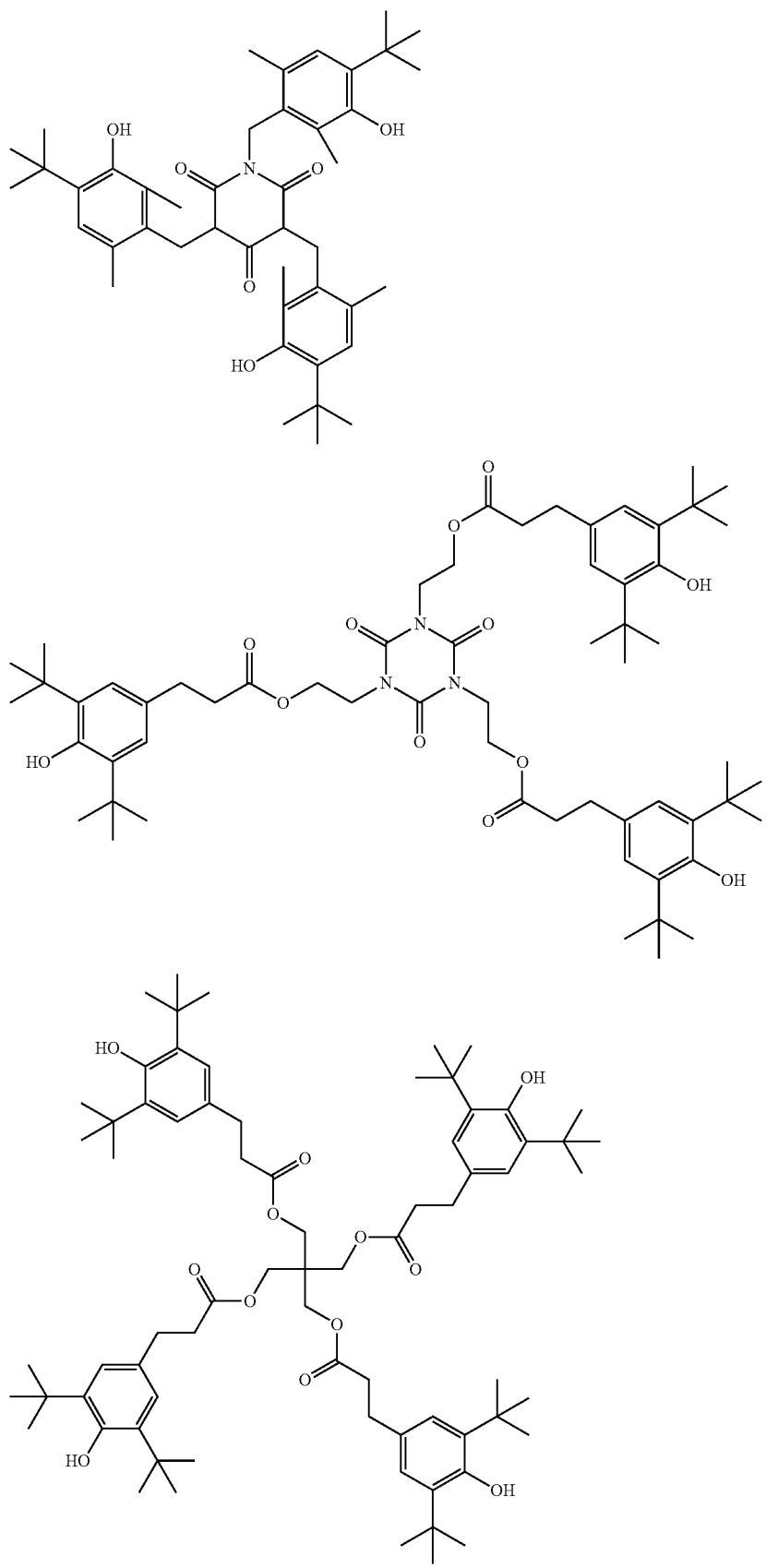

-continued

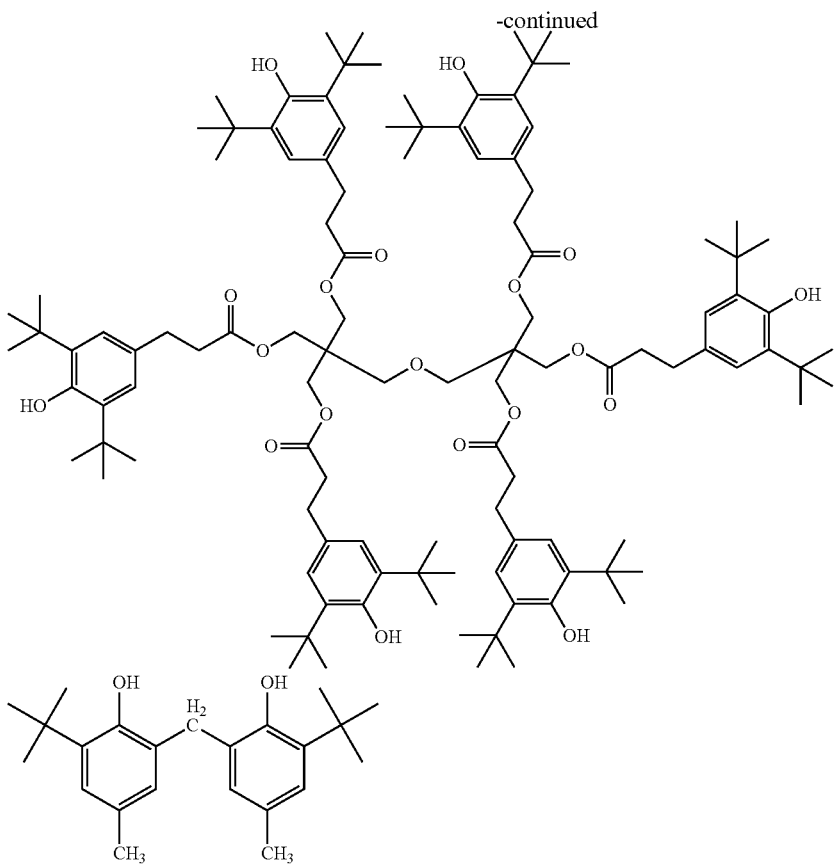

<Specific Polymer Compound>

The organic semiconductor composition of the present invention contains a specific polymer compound. As described above, in the present invention, the specific polymer compound refers to a polymer compound having a weight-average molecular weight of equal to or greater than 500,000.

As described above, examples of one of the functions of the specific polymer compound include adjusting the viscosity of the organic semiconductor composition. Due to such a function, the viscosity of the organic semiconductor composition is easily rendered suitable for printing.

The weight-average molecular weight of the specific polymer compound is equal to or greater than 500,000. In view of making the organic semiconductor composition more suitable for printing, the weight-average molecular weight of the specific polymer compound is preferably 800,000 to 20,000,000, more preferably 1,500,000 to 8,000,000, and even more preferably 2,000,000 to 6,000,000.

In the present invention, the weight-average molecular weight of each component is a value determined by gel permeation chromatography (GPC) and expressed in terms of polystyrene.

More specifically, the weight-average molecular weight is measured under the following conditions by using gel permeation chromatography (GPC).

The number-average molecular weight is measured using an ultraviolet detector (wavelength: 254 nm) and tetrahydrofuran as an eluent by dissolving each component in tetrahydrofuran, connecting TSK-GEL Super H1000, Super H2000, Super H3000, and Super H4000 in series in a 8020 GPC system manufactured by a Tosoh Corporation. For correcting the molecular weight, a polystyrene standard is used.

As the specific polymer compound, polymer compounds having insulating properties are preferably used. Specifically, a polymer compound having an electric conductivity of equal to or lower than $10^{-10}$ S/cm is more preferably used.

Examples of the specific polymer compound include a polystyrene resin, an acryl resin, rubber, a thermoplastic elastomer, and the like.

Specific examples of the specific polymer compound include polystyrene (PS), poly(α-methylsytrene) (PαMS), poly(methylmethacrylate) (PMMA), polyvinyl phenol (PVP), poly(vinylalcohol) (PVA), poly(vinylacetate) (PVAc), polyvinyl chloride (PVC), polyvinylidene fluoride (PVDF), cyanoethyl pullulan (CYPEL), poly(divinyltetramethyldisiloxane-bis(benzocyclobutene)) (BCB), ethylene-propylene rubber, acrylonitrile-butadiene rubber, and the like, but the specific polymer compound is not limited to these.

Among these, as the specific polymer compound, a polymer compound having a benzene ring (polymer having benzene ring-containing monomer unit) is preferable. The content of the benzene ring-containing monomer unit is not particularly limited, but is, with respect to all the monomer units constituting the specific polymer compound, preferably equal to or greater than 50 mol %, more preferably equal to or greater than 70 mol %, and even more preferably equal to or greater than 90 mol %. The upper limit of the content of the benzene ring-containing monomer unit is not particularly limited, and is 100 mol % for example.

The organic semiconductor composition of the present invention may contain one kind of specific polymer compound singly or contain two or more kinds of specific polymer compounds.

The content of the specific polymer compound is, with respect to the total mass of the organic semiconductor composition, preferably 0.1% to 3% by mass, more preferably 0.15% to 2% by mass, and even more preferably 0.2% to 1.5% by mass.

<Surfactant>

The organic semiconductor composition of the present invention contains a surfactant.

In many cases, an organic semiconductor film is formed on a highly hydrophobic substrate. Furthermore, because the organic semiconductor composition of the present invention is used for printing, the viscosity of the composition needs to be reduced. Therefore, the composition more easily bounces off the substrate.

Accordingly, by using the organic semiconductor composition of the present invention that contains a surfactant, the wetting and spreading properties of the organic semiconductor film are further improved, and the printing properties of the organic semiconductor composition are improved.

A ratio $M_{C/D}$ (specific polymer compound/surfactant) of the content of the specific polymer compound to the content of the surfactant is preferably 0.01 to 200, more preferably 0.5 to 150, even more preferably 1 to 100, and particularly preferably 3 to 80 based on mass. In a case where the ratio $M_{C/D}$ is within the above range, the viscosity and the wetting and spreading properties of the organic semiconductor composition are well balanced, and hence the printing properties are further improved.

The content of the surfactant is, with respect to the total mass of the organic semiconductor composition, preferably 0.005% to 2% by mass, more preferably 0.01% to 1% by mass, and even more preferably 0.05% to 0.5% by mass. In a case where the content of the surfactant is within the above range, the wetting and spreading properties of the organic semiconductor composition become excellent, and hence the printing properties are further improved.

As the surfactant, it is possible to use various surfactants such as a fluorine-based surfactant, a silicone-based surfactant, a nonionic surfactant, a cationic surfactant, and an anionic surfactant. Among these, a fluorine-based surfactant and a silicone-based surfactant are preferably used because then the printing properties are further improved, and a fluorine-based surfactant is more preferably used because then the mobility of the organic thin film transistor is further improved. One kind of the surfactants may be used singly, or two or more kinds thereof may be used in combination.

As the fluorine-based surfactant, commercially available products can be used, and examples thereof include W-AHE and W-AHI (all manufactured by FUJIFILM Corporation), MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781, and MEGAFACE F781F (all manufactured by DIC Corporation), FLUORAD FC430, FLUORAD FC431, and FLUORAD FC171 (all manufactured by Sumitomo 3M, LTD.), SURFLON S-382, SURFLON SC-101, SURFLON SC-103, SURFLON SC-104, SURFLON SC-105, SURFLON SC 1068, SURFLON SC-381, SURFLON SC-383, SURFLON S393, and SURFLON KH-40 (all manufactured by ASAHI GLASS CO., LTD.), PF636, PF656, PF6320, PF6520, and PF7002 (manufactured by OMNOVA Solutions), and the like.

As the silicone-based surfactant, it is preferable to use a modified silicone-based surfactant because then the printing properties are further improved.

As the modified silicone-based surfactant, for example, it is possible to use a silicone-based surfactant modified with at least one kind of group selected from the group consisting of an alkyl group, an aralkyl group, a polyether group, and a higher fatty acid ester. Among these, it is preferable to use a silicone-based surfactant modified with at least one of the alkyl group or the aralkyl group.

As the silicone-based surfactant, commercially available products can be used, and examples thereof include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials), KP341, KF6001, and KF6002 (all manufactured by Shin-Etsu Silicone Co., Ltd.), BYK300, BYK302, BYK306, BYK307, BYK310, BYK322, BYK323, BYK330, BYK331, BYK333, BYK337, BYK344, BYK352, BYK354, BYK356, BYK377, and BYK378 (all manufactured by BYK-Chemie GmbH), and the like.

<Specific Organic Solvent>

The organic semiconductor composition of the present invention contains a specific organic solvent. As described above, the specific organic solvent refers to an organic solvent having a standard boiling point of equal to or higher than 150° C.

In the organic semiconductor composition, the specific organic solvent functions as a solvent in which each component is dissolved or dispersed.

The standard boiling point (that is, a boiling point under 1 atm) of the specific organic solvent is equal to or higher than 150° C., preferably 160° C. to 280° C., and more preferably 180° C. to 250° C. In a case where the standard boiling point of the specific organic solvent is equal to or higher than 150° C., it is possible to inhibit the organic semiconductor composition from being thickened as the composition adhering to a printing device evaporates (volatilizes). For this reason, the composition can be excellently applied to a printing process. In a case where the standard boiling point is equal to or lower than 250° C., the throughput at the time of manufacturing can be secured by shortening the drying time, the amount of the solvent remaining in the organic semiconductor film can be reduced, and hence the performance can be easily maintained.

In contrast, in a case where the standard boiling point of the specific organic solvent is lower than 150° C., thickening, solidification, or the like of the organic semiconductor composition adhering to the printing device is accelerated, and hence the applicability of the composition to a printing process deteriorates.

The content of the specific organic solvent is, with respect to the total mass of the organic semiconductor composition, preferably 90% to 99% by mass, more preferably 95% to 98.5% by mass, and even more preferably 96% to 98% by mass. In a case where the content of the specific organic solvent is within the above range, the applicability of the organic semiconductor composition to a printing process tends to be better, and the solubility (or dispersibility) of each component described above tends to be further improved.

The specific organic solvent is not particularly limited as long as it has a boiling point of equal to or higher than 150° C. Examples of the specific organic solvent include anisole, ethyl lactate, cyclohexanone, a glycol ether-based solvent, butyl thiophene, 2,4-lutidine, N,N-dimethylacetamide, phenetole, methoxytoluene, 1,2-methylenedioxybenzene, benzofuran, benzyl methyl ether, 1,8-cineole, methyl benzoxazole, dichlorobenzene, 2,2-dimethyl-1,3-benzodioxole, dimethyl anisole, benzoxazole, ethyl benzyl ether, ethyl anisole, thioanisole, 2,3-dihydrobenzofuran, dimethyl sulfoxide, benzonitrile, ethylenedioxythiophene, allyl phenyl ether, phenyl acetate, decalin, methyl imidazole, 2,3-dihydro-2-methylbenzofuran, benzoic acid ester, acetophenone, cresol, 1-methyl-2-pyrrolidinone, γ-butyrolactone, 4-ethylphenetole, amyl benzene, tetralin(1,2,3,4-tetrahydronaphthalene), dimethoxybenzene, butoxybenzene, dibromothiophene, nitrobenzene, 1-fluoronaphthalene, acetylthiophene, isophorone, benzyl acetate, benzodioxane, dimethoxytoluene, 4-tert-butylanisole, p-propenylanisole, quinoline, ethylene carbonate, methyl benzothiazole, cyclohexylbenzene, methyl naphthalene, glycidyl phenyl ether, dimethyl tetralin, trimethoxybenzene, butyl thiophene carboxylate, dipropoxybenzene, p-anisaldehyde dimethyl acetal, biphenyl, diphenyl ether, dimethyl naphthalene, phenoxytoluene, tetrahydro-2-phenoxy-2H-pyran, dibenzyl ether, cyclohexyl phenyl ether, and the like. Among these, tetralin(1,2,3,4-tetrahydronaphthalene), 1-fluoronaphthalene, decalin, and dibromothiophene are preferable because these further improve the solubility (or dispersibility) of each component described above.

One kind of specific organic solvent may be used singly, or two or more kinds thereof may be used in combination.

The organic semiconductor composition of the present invention may contain an organic solvent other than the above, that is, an organic solvent having a boiling point of lower than 150° C. In this case, the organic solvent can be used to such an extent that the applicability to a printing process does not deteriorate.

<Other Components>

As long as the function of each component described above can be performed, the organic semiconductor composition of the present invention may contain various components contained in general organic semiconductor compositions.

<Physical Properties and the Like>

From the viewpoint of further improving the applicability to a printing process, the viscosity of the organic semiconductor composition of the present invention at the temperature at the time of printing is preferably 5 to 1,000 mPa·s, more preferably 10 to 500 mPa·s, and even more preferably 20 to 100 mPa·s.

It is preferable to measure the viscosity by the method based on JIS Z8803. Specifically, in the present invention, the viscosity can be measured using an E-type viscometer (TVE-22) manufactured by TOKI SANGYO CO., LTD.

<Method for Preparing Organic Semiconductor Composition>

The method for preparing (manufacturing) the organic semiconductor composition is not particularly limited, and known methods can be adopted. For example, by adding the aforementioned various components in a predetermined amount to the specific organic solvent and appropriately stirring the solution, the organic semiconductor composition of the present invention can be obtained.

[Organic Thin Film Transistor]

The organic thin film transistor of the present invention has an organic semiconductor film prepared using the organic semiconductor composition described above. As the method for manufacturing the organic semiconductor film, for example, it is possible to use a method of applying the organic semiconductor composition onto a predetermined substrate (base material) by printing and performing a drying treatment if necessary.

The method for applying the composition onto a substrate is not particularly limited as long as a printing method is used. For example, it is possible to use an ink jet printing method, a flexographic printing method, a gravure printing method, a screen printing method, and the like. Among these, an ink jet printing method and a flexographic printing method are preferable. In this case, the organic semiconductor composition is also referred to as an organic semiconductor composition for ink jet printing or an organic semiconductor composition for flexographic printing.

The drying treatment is a treatment performed if necessary. For the drying treatment, optimal conditions are appropriately selected according to the type of each component contained in the organic semiconductor composition. Particularly, in view of further improving the effect of the present invention and in view of excellent productivity, the heating temperature is preferably 30° C. to 150° C. and more preferably 40° C. to 120° C., and the heating time is preferably 10 to 300 minutes and more preferably 20 to 180 minutes.

The film thickness of the formed organic semiconductor film is not particularly limited. However, in view of further improving the effects of the present invention, the film thickness is preferably 10 to 500 nm and more preferably 30 to 200 nm.

The aforementioned organic semiconductor composition is suitable as a composition for forming an organic semiconductor film (organic semiconductor layer) of an organic thin film transistor, organic electro luminescence (EL), an organic thin film solar cell, and the like. Particularly, the organic semiconductor composition is suitable as a composition for forming an organic semiconductor film (organic semiconductor layer) of an organic thin film transistor.

Hereinafter, an organic thin film transistor (organic field-effect transistor) prepared using the aforementioned organic semiconductor composition will be described.

The organic thin film transistor of the present invention has an organic semiconductor film (organic semiconductor layer) prepared using the organic semiconductor composition and can additionally have a source electrode, a drain electrode, and a gate electrode. The organic thin film transistor of the present invention has the organic semiconductor layer formed using the organic semiconductor composition described above. Therefore, the organic thin film transistor satisfies a high level of mobility and insulation reliability.

The structure of the organic thin film transistor according to the present embodiment is not particularly limited, and may have any of structures such as a bottom contact-type structure and a top contact-type structure.

Hereinafter, an example of the organic thin film transistor of the present invention will be described with reference to a drawing. FIG. 1 is a schematic cross-sectional view of a bottom contact-type organic thin film transistor 100 according to an embodiment of the present invention.

In the example shown in FIG. 1, the organic thin film transistor 100 has a substrate (base material) 10, a gate electrode 20, a gate insulating film 30, a source electrode 40, a drain electrode 42, an organic semiconductor layer (organic semiconductor film) 50, and a sealing layer 60. The organic semiconductor layer 50 is formed using the aforementioned organic semiconductor composition.

Hereinafter, the substrate (base material), the gate electrode, the gate insulating film, the source electrode, the drain electrode, and the organic semiconductor layer (organic semiconductor film) as well as the method for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoints of the applicability to each device and the cost, a glass substrate or a plastic substrate is preferable.

Examples of the material of the plastic substrate include a thermosetting resin (for example, an epoxy resin, a phenol resin, a polyimide resin, or a polyester resin (such as polyethylene terephthalate (PET) or polyethylene naphthalate (PEN)) and a thermoplastic resin (for example, a phenoxy resin, polyethersulfone, polysulfone, or polyphenylenesulfone).

Examples of the material of the ceramic substrate include alumina, aluminum nitride, zirconia, silicon, silicon nitride, silicon carbide, and the like.

Examples of the material of the glass substrate include soda glass, potash glass, borosilicate glass, quartz glass, aluminosilicate glass, lead glass, and the like.

<Gate Electrode>

Examples of the material of the gate electrode include a metal such as gold (Au), silver, aluminum, copper, chromium, nickel, cobalt, titanium, platinum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver or aluminum is more preferable.

The thickness of the gate electrode is not particularly limited, but is preferably 20 to 200 nm.

The method for forming the gate electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as inkjet printing, screen printing, offset printing, or relief printing (flexographic printing); a mask vapor deposition method; and the like.

<Gate Insulating Film>

Examples of the material of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor layer, a polymer is preferable.

In a case where a polymer is used as the material of the gate insulating film, it is preferable to concurrently use a cross-linking agent (for example, melamine). By the concurrent use of the cross-linking agent, the polymer is cross-linked, and the durability of the formed gate insulating film is improved.

The film thickness of the gate insulating film is not particularly limited, but is preferably 100 to 1,000 nm.

The method for forming the gate insulating film is not particularly limited, but examples thereof include a method of coating a substrate, on which the gate electrode is formed, with a composition for forming a gate insulating film, a method of vapor-depositing or sputtering the material of the gate insulating film onto the substrate on which the gate electrode is formed, and the like. The method for coating the aforementioned substrate with the composition for forming a gate insulating film is not particularly limited, and it is possible to use a known method (for example, a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating. The heating conditions at the time of forming the gate insulating film are not particularly limited, but generally, it is preferable to perform heating for 5 to 120 minutes (preferably for 5 to 60 minutes) at 30° C. to 250° C. (preferably at 80° C. to 200° C.).

<Source Electrode and Drain Electrode>

Specific examples of the material of the source electrode and the drain electrode are the same as those exemplified above as the material of the gate electrode. Among the materials, a metal is preferable, and silver is more preferable.

The method for forming the source electrode and the drain electrode is not particularly limited, but examples thereof include a method of vacuum vapor-depositing or sputtering an electrode material onto a substrate on which the gate electrode and the gate insulating film are formed, a method of coating a substrate, on which the gate electrode and the gate insulating film are formed, with a composition for forming an electrode, a method of printing a composition for forming an electrode onto the substrate on which the gate electrode and the gate insulating film are formed, and the like. Specific examples of the patterning method are the same as those exemplified above for the gate electrode.

The channel length of the source electrode and the drain electrode is not particularly limited, but is preferably 5 to 30 µm.

The channel width of the source electrode and the drain electrode is not particularly limited, but is preferably 10 to 200 µm.

In the organic thin film transistor of the present invention, among the source electrode, the drain electrode, and the gate electrode, at least 1 electrode can be silver. Among electrode materials, silver is easily ionized and easily causes migration. However, in a case where a semiconductor layer is formed using the aforementioned organic semiconductor composition, the occurrence of migration can be sufficiently inhibited. Therefore, in a case where silver is used as an electrode material, the effects of the present invention are particularly markedly exhibited.

<Organic Semiconductor Layer>

The organic semiconductor layer (organic semiconductor film) is a layer formed using the organic semiconductor composition described above.

The method for manufacturing the organic semiconductor layer will not be described because it was described above.

<Sealing Layer>

From the viewpoint of the durability, the organic thin film transistor of the present invention preferably includes a sealing layer as an outermost layer. In the sealing layer, a known sealant (composition for forming a sealing layer) can be used.

The thickness of the sealing layer is not particularly limited, but is preferably 0.2 to 10 μm.

The method for forming the sealing layer is not particularly limited, but examples thereof include a method of coating the substrate, on which the gate electrode, the gate insulating film, the source electrode, the drain electrode, and the organic semiconductor layer are formed, with a composition for forming a sealing layer, and the like. Specific examples of the method of coating the substrate with the composition for forming a sealing layer are the same as the examples of the method of coating the substrate with the composition for forming a gate insulating film. In a case where the sealing layer is formed by coating the substrate with the composition for forming a sealing layer, for the purpose of removing the solvent, causing cross-linking, or the like, the composition may be heated (baked) after coating.

The heating conditions at the time of forming the sealing layer are not particularly limited, but generally, it is preferable to perform heating for 5 to 120 minutes (preferably for 5 to 60 minutes) at 30° C. to 250° C. (preferably at 80° C. to 200° C.).

<Other Organic Thin Film Transistors>

Figure 2:
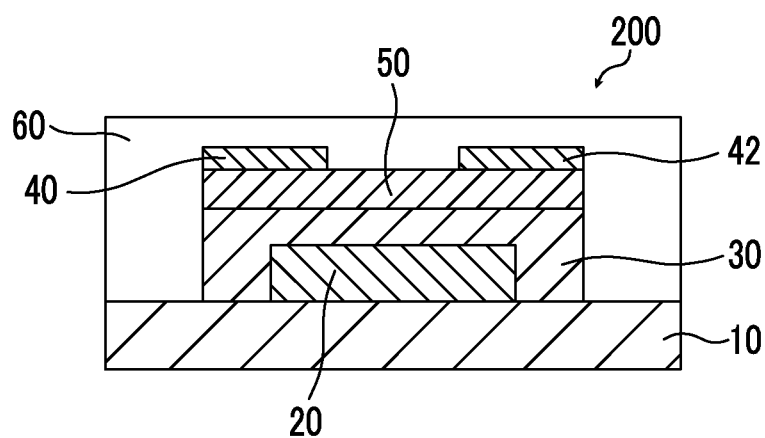
FIG. 2 is a schematic cross-sectional view of a top contact-type organic thin film transistor according to an embodiment of the present invention.

FIG. 2 is a schematic cross-sectional view of a top contact-type organic thin film transistor 200 according to an embodiment of the present invention.

In the example shown in FIG. 2, the organic thin film transistor 200 has a substrate 10, a gate electrode 20, a gate insulating film 30, a source electrode 40, a drain electrode 42, an organic semiconductor layer (organic semiconductor film) 50, and a sealing layer 60. The organic semiconductor layer 50 is formed using the aforementioned organic semiconductor composition of the present invention.

The substrate, the gate electrode, the gate insulating film, the source electrode, the drain electrode, the organic semiconductor layer, and the sealing layer are the same as described above, and hence the description thereof will not be repeated.

[Electronic Paper and Display Device]

In electronic paper and a display device according to an embodiment of the present invention, the aforementioned organic thin film transistor is used in a display portion that displays an image. Except for this, the electronic paper and the display device can have known structure, and hence the description thereof will not be repeated.

As described above, the aforementioned organic thin film transistor has excellent mobility and insulation reliability. Accordingly, the organic thin film transistor is suitably used various electronic devices such as electronic paper or display devices.

EXAMPLES

Hereinafter, the present invention will be more specifically described based on examples, but the present invention is not limited to the examples.

[Preparation of Organic Semiconductor Composition]

The components shown in the following Table 1 were mixed and stirred together at a ratio shown in Table 1, thereby preparing organic semiconductor compositions of examples and comparative examples.

In a case where the organic semiconductor material, the specific polymer compound, and the like were not easily dissolved, the components were dissolved by being stirred with heating to a temperature of about 50° C. if necessary.

(A) Organic Semiconductor Material

A-1: TIPS pentacene (6,13-bis(triisopropylsilylethynyl)pentacene, manufactured by Sigma-Aldrich Co, LLC.)

A-2: diF-TES-ADT (2,8-difluoro-5,11-bis(triethylsilylethynyl)anthradithiophene, manufactured by Sigma-Aldrich Co, LLC.)

A-3: OSC-15 (synthesized based on the method described in 2009-190999A)

A-4: OSC-5 (synthesized with reference to known documents (J. Org. Chem., 2011, 696, Org. Lett., 2001, 3, 3471, Macromolecules, 2010, 43, 6264, J. Org. Chem., 2013, 78, 7741, Chem. Eur. J., 2013, 19, 3721))

A-5: OSC-9 (synthesized with reference to document A (K. Muellen, Chem. Commun., 2008, 1548-1550.), document B (K. Takimiya, Org. Lett., 2007, 9, 4499-4502.), Document C (Rao; Tilak, Journal of Scientific and Industrial Research, 1958, vol. 17 B, p. 260-265.), and document D (Ghaisas; Tilak, Journal of Scientific and Industrial Research, 1955, vol. 14 B, p. 11))

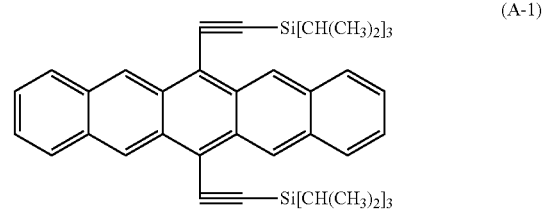

(A-1)

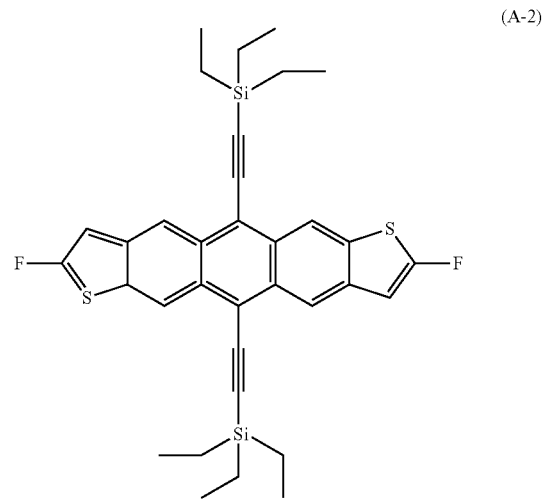

(A-2)

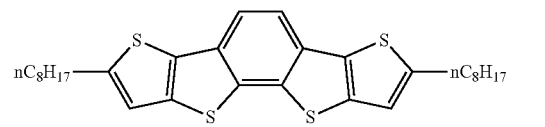

OSC-15

-continued

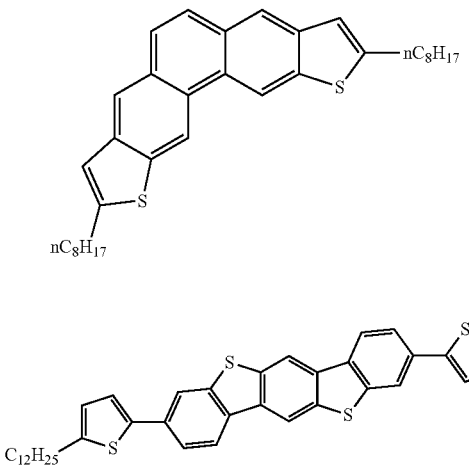

OSC-5

OSC-9

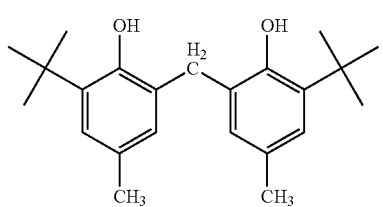

B-4

(B) Phenolic Reductant

B-1: IRGANOX-245 (trade name, see the following formula, manufactured by BASF SE)

B-2: IRGANOX-1035 (trade name, see the following formula, manufactured by BASF SE)

B-3: IRGANOX-1010 (trade name, see the following formula, manufactured by BASF SE)

B-4: SUMILIZER MDP-S (trade name, 2,2'-methylenebis(6-tert-butyl-p-cresol), see the following formula, manufactured by Sumitomo Chemical Co., Ltd.)

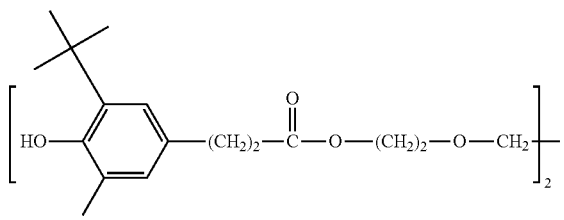

B-1

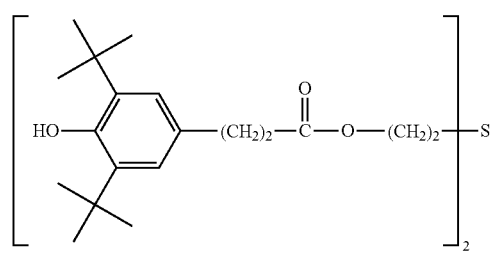

B-2

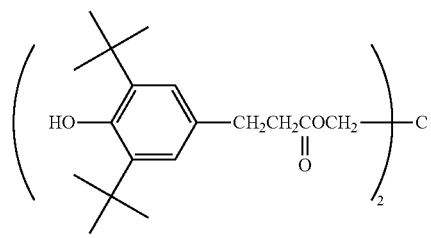

B-3

(C) Polymer Compound

C-1: polystyrene (weight-average molecular weight (Mw): 550,000, manufactured by Polysciences, Inc.)

C-2: polystyrene (weight-average molecular weight (Mw): 2,110,000, manufactured by Sigma-Aldrich Co, LLC.)

C-3: poly ca-methylstyrene (weight-average molecular weight (Mw): 850,000, manufactured by Polysciences, Inc.)

C-4: polystyrene (weight-average molecular weight (Mw): 160,000, manufactured by Sigma-Aldrich Co, LLC.)

(D) Surfactant

D-1: BYK-323 (trade name, aralkyl-modified silicone-based surfactant, manufactured by BYK-Chemie GmbH)

D-2: MEGAFACE F-781F (trade name, fluorine-based surfactant, manufactured by DIC Corporation)

D-3: FLOWLEN AC-277 (trade name, acryl-based surfactant, manufactured by KYOEISHA CHEMICAL Co., LTD.)

(E) Specific Organic Solvent

E-1: tetralin (manufactured by Sigma-Aldrich Co. LLC., standard boiling point: 207° C.)

E-2: 1-fluoronaphthalene (manufactured by TOKYO CHEMICAL INDUSTRY CO., LTD., standard boiling point: 212° C.)

[Evaluation Test]

<Evaluation of Printing Properties>

Onto the entire surface an organic insulating film substrate having a surface energy of 35 mN/m, the organic semiconductor compositions of examples and comparative examples obtained as above was printed using a flexographic printer (manufactured by IGT Testing Systems Pte Ltd. product name: "F-1") such that a Wet film thickness (thickness of moist film) became 5 μm. Then, based on the area in which the solid content remained in a case where the substrate was dried at 50° C. on a hot plate, the printing properties were evaluated to be A to D as below. For practical use, compositions evaluated to be A to C are preferable, compositions evaluated to be A or B are more preferable, and compositions evaluated to be A are even more preferable. The results are shown in Table 1.

"A": the proportion of the area in which the solid content remained was equal to or higher than 95% with respect to the entire surface of the substrate.

"B": the proportion of the area in which the solid content remained was equal to or higher than 90% and less than 95% with respect to the entire surface of the substrate.

"C": the proportion of the area in which the solid content remained was equal to or higher than 80% and less than 90% with respect to the entire surface of the substrate.

"D": "B": the proportion of the area in which the solid content remained was less than 80% with respect to the entire surface of the substrate.

<Preparation of Organic Thin Film Transistor>

By using each of the organic semiconductor compositions of examples and comparative examples obtained as above, an organic thin film transistor was prepared according to the following procedure, and then the mobility and the insulation reliability were evaluated.

Al which will become a gate electrode was vapor-deposited (thickness: 50 nm) onto a glass substrate (Eagle XG: manufactured by Corning Incorporated). The Al layer was spin-coated with a composition for a gate insulating film (a propylene glycol monomethyl ether acetate (PGMEA) solution (solution concentration: 2% by mass) of polyvinylphenol/melamine=1/1 (w/w)), and the composition was baked for 60 minutes at 150° C., thereby forming a gate insulating film having a film thickness of 400 nm. Au was vapor-deposited onto the gate insulating film through a mask, thereby forming a source electrode and a drain electrode having a channel length of 25 μm and a channel width of 200 μm. Onto the entire surface of the substrate on which the electrode were formed, the organic semiconductor compositions of examples and comparative examples obtained as above were printed using a flexographic printer (manufactured by IGT Testing Systems Pte Ltd. product name: "F-1") such that a Wet film thickness (thickness of a moist film) became 5 μm. Then, the composition was baked for 30 minutes at 80° C. in a glove box, thereby forming an organic semiconductor layer having a thickness of 150 nm. The organic semiconductor layer was spin-coated with Cytop CTL-107MK (composition for forming a sealing layer) (manufactured by ASAHI GLASS CO., LTD), and the Cytop CTL-107MK was baked for 20 minutes at 120° C., thereby forming a sealing layer (uppermost layer) having a thickness of 2 m. In this way, organic thin film transistors (bottom contact-type) of examples and comparative examples were obtained.

(Evaluation of Mobility)

Each electrode of each of the organic thin film transistors of examples and comparative examples obtained as above was connected to each terminal of a manual prober connected to a semiconductor parameter•analyzer (4155C, manufactured by Agilent Technologies Inc.), thereby evaluating the field effect transistor (FET). Specifically, by measuring the drain current-gate voltage (Id-Vg) characteristics, the field effect mobility ([$cm^2$/V·sec]) was calculated. The average of 5 elements prepared in the same manner was denoted by field effect mobility $\mu 1$.

Furthermore, according to the same procedure as described above, for each of the organic semiconductor compositions of examples and comparative examples, an organic semiconductor composition (comparative composition) which did not contain a phenolic reductant were prepared. For example, a comparative composition for Example 1 is the organic semiconductor composition of Example 1 that does not contain the phenolic reductant B-1. In addition, a comparative composition for Example 6 is the organic semiconductor composition of Example 6 that does not contain the phenolic reductant B-2.

Thereafter, organic thin film transistors for comparison were prepared according to the same procedure as Preparation of an organic thin film transistor of Example 1, except that each of the comparative compositions was used. The field effect mobility of the obtained organic thin film transistors for comparison was calculated according to the same procedure as followed for calculating $\mu 1$. The calculated field effect mobility was denoted by $\mu 2$.

From the calculated $\mu 1$ and $\mu 2$, $\mu 1/\mu 2$ was determined, and the mobility was evaluated according to the following standards. The results are shown in Table 1. For practical use, organic thin film transistors evaluated to be A to C are preferable, organic thin film transistors evaluated to be A or B are more preferable, and organic thin film transistors evaluated to be A are even more preferable "A": $\mu 1/\mu 2 \geq 0.8$
"B": $0.8 > \mu 1/\mu 2 \geq 0.5$
"C": $0.5 > \mu 1/\mu 2 \geq 0.1$
"D": $0.1 > \mu 1/\mu 2$ (Evaluation of Insulation Reliability)

The durability of the organic thin film transistors of examples and comparative examples obtained as above was tested according to the following method, and the insulation reliability was evaluated.

First, each of the obtained organic thin film transistors was installed in a thermo-hygrostat tank with a temperature of 60° C. and a humidity of 60%, and voltages of Vs=−20 V, Vd=0 V, and Vg=−20 V were applied thereto. In the meantime, the transistor characteristics were measured every 10 minutes, and a point in time when a threshold voltage Vth was found to shift by 10 V or higher from the initial voltage was calculated as a service life time (T1) of the transistor.

Furthermore, according to the same procedure as in Evaluation of mobility described above, organic thin film transistors for comparison were prepared by using the organic semiconductor composition which did not contain a phenolic reductant. For the obtained organic thin film transistors for comparison, a point in time when the threshold voltage Vth was found to shift by 10 V or higher from the initial voltage was calculated as a service life time (T2) of the transistor.

From the calculated T1 and T2, T1/T2 was determined, and the insulation reliability was evaluated according to the following standards. The results are shown in Table 1. From the viewpoint of the insulation reliability, organic thin film transistors evaluated to be A to C are preferable, organic thin film transistors evaluated to be A or B are more preferable, and organic thin film transistors evaluated to be A are even more preferable.

"A": T1/T2≥10
"B": 10>T1/T2≥5
"C": 5>T1/T2≥1.5
"D": 1.5≥T1/T2

[Evaluation Result]

The results of the evaluation tests described above are shown in Table 1. In the table, wt % represents % by mass.

TABLE 1

| | (A) Organic semiconductor material | | (B) Phenolic wt % reductant | | (C) Polymer wt % compound | | (D) wt % Surfactant | | (E) Organic wt % solvent | |
|---|---|---|---|---|---|---|---|---|---|---|
| Example 1 | A-1 | 2 | B-1 | 0.5 | C-1 | 1.2 | D-1 | 0.1 | E-1 | |
| Example 2 | A-2 | 2 | B-1 | 0.5 | C-1 | 1.2 | D-1 | 0.1 | E-1 | |
| Example 3 | A-3 | 2 | B-1 | 0.5 | C-1 | 1.2 | D-1 | 0.1 | E-1 | |
| Example 4 | A-4 | 2 | B-1 | 0.5 | C-1 | 1.2 | D-1 | 0.1 | E-1 | |
| Example 5 | A-5 | 2 | B-1 | 0.5 | C-1 | 1.2 | D-1 | 0.1 | E-1 | |

TABLE 1-continued

| | | | | | | | | | |
|---|---|---|---|---|---|---|---|---|---|
| Example 6 | A-3 | 2 | B-2 | 0.5 | C-1 | 1.2 | D-1 | 0.2 | E-1 |
| Example 7 | A-3 | 2 | B-3 | 0.5 | C-1 | 1.2 | D-1 | 0.2 | E-1 |
| Example 8 | A-3 | 2 | B-4 | 0.5 | C-1 | 1.2 | D-1 | 0.2 | E-1 |
| Example 9 | A-4 | 2 | B-3 | 0.5 | C-2 | 1 | D-1 | 0.1 | E-1 |
| Example 10 | A-4 | 2 | B-3 | 1 | C-2 | 0.3 | D-1 | 0.1 | E-1 |
| Example 11 | A-4 | 2 | B-3 | 0.5 | C-2 | 2 | D-1 | 0.1 | E-1 |
| Example 12 | A-4 | 0.5 | B-3 | 0.2 | C-2 | 2 | D-1 | 0.1 | E-1 |
| Example 13 | A-4 | 2 | B-3 | 0.5 | C-2 | 2 | D-1 | 0.005 | E-1 |
| Example 14 | A-4 | 2 | B-3 | 0.5 | C-2 | 0.7 | D-1 | 0.3 | E-1 |
| Example 15 | A-4 | 2 | B-3 | 0.5 | C-3 | 1.2 | D-1 | 0.1 | E-1 |
| Example 16 | A-4 | 2 | B-3 | 0.5 | C-3 | 1.2 | D-2 | 0.1 | E-1 |
| Example 17 | A-4 | 2 | B-3 | 0.5 | C-3 | 1.2 | D-3 | 0.2 | E-1 |
| Example 18 | A-4 | 2 | B-3 | 0.5 | C-3 | 1.2 | D-1 | 0.1 | E-2 |
| Example 19 | A-4 | 2 | B-3 | 0.5 | C-2 | 2 | D-1 | 1.0 | E-1 |
| Example 20 | A-4 | 2 | B-3 | 0.5 | C-2 | 2 | D-1 | 0.020 | E-1 |
| Comparative Example 1 | A-3 | 2 | B-3 | 0.5 | — | — | — | — | E-1 |
| Comparative Example 2 | A-3 | 2 | B-3 | 0.5 | C-1 | 1.2 | — | — | E-1 |
| Comparative Example 3 | A-4 | 0.05 | B-3 | 0.5 | C-2 | 5 | D-1 | 0.1 | E-1 |
| Comparative Example 4 | A-4 | 2 | B-3 | 0.5 | C-2 | 0.05 | D-1 | 0.1 | E-1 |
| Comparative Example 5 | A-4 | 2 | B-3 | 0 | C-2 | 1 | D-1 | 0.1 | E-1 |
| Comparative Example 6 | A-4 | 2 | B-3 | 6 | C-2 | 1 | D-1 | 0.1 | E-1 |
| Comparative Example 7 | A-3 | 2 | B-1 | 0.5 | C-4 | 1.2 | D-1 | 0.1 | E-1 |

| | wt % | $M_{A/C}$ | $M_{B/C}$ | $M_{C/D}$ | Mobility | Insulation reliability | Printing properties |
|---|---|---|---|---|---|---|---|
| Example 1 | Balance | 1.67 | 0.42 | 12.00 | B | A | B |
| Example 2 | Balance | 1.67 | 0.42 | 12.00 | B | B | A |
| Example 3 | Balance | 1.67 | 0.42 | 12.00 | A | B | A |
| Example 4 | Balance | 1.67 | 0.42 | 12.00 | A | A | A |
| Example 5 | Balance | 1.67 | 0.42 | 12.00 | A | B | A |
| Example 6 | Balance | 1.67 | 0.42 | 6.00 | A | B | A |
| Example 7 | Balance | 1.67 | 0.42 | 6.00 | A | A | A |
| Example 8 | Balance | 1.67 | 0.42 | 6.00 | A | A | A |
| Example 9 | Balance | 2.00 | 0.50 | 10.00 | A | A | A |
| Example 10 | Balance | 6.67 | 3.33 | 3.00 | A | B | B |
| Example 11 | Balance | 1.00 | 0.25 | 20.00 | A | B | A |
| Example 12 | Balance | 0.25 | 0.10 | 20.00 | A | A | A |
| Example 13 | Balance | 1.00 | 0.25 | 400.00 | B | A | C |
| Example 14 | Balance | 2.86 | 0.71 | 2.33 | C | A | A |
| Example 15 | Balance | 1.67 | 0.42 | 12.00 | A | A | A |
| Example 16 | Balance | 1.67 | 0.42 | 12.00 | B | A | A |
| Example 17 | Balance | 1.67 | 0.42 | 6.00 | B | A | C |
| Example 18 | Balance | 1.67 | 0.42 | 12.00 | A | A | A |
| Example 19 | Balance | 1.00 | 0.25 | 2.00 | C | B | A |
| Example 20 | Balance | 1.00 | 0.25 | 100.00 | B | A | B |
| Comparative Example 1 | Balance | — | — | — | A | B | D |
| Comparative Example 2 | Balance | 1.67 | 0.42 | — | A | A | D |
| Comparative Example 3 | Balance | 0.01 | 0.10 | 50 | D | A | A |
| Comparative Example 4 | Balance | 40.00 | 10.00 | 0.5 | A | A | D |
| Comparative Example 5 | Balance | 2.00 | 0.01 | 10 | A | D | A |
| Comparative Example 6 | Balance | 2.00 | 6.00 | 10 | D | A | B |
| Comparative Example 7 | Balance | 1.67 | 0.42 | 12 | A | A | D |

As is evident from the evaluation results shown in Table 1, by setting the ratio of the content of the organic semiconductor material to the content of the specific polymer compound to be within a range of 0.02 to 10 and setting the ratio of the content of the phenolic reductant to the content of the specific polymer compound to be within a range of 0.1 to 5, an organic semiconductor composition excellent in printing properties is obtained, and the mobility and the insulation reliability of the organic thin film transistor prepared using the composition become excellent (Examples 1 to 20).

From the comparison of Examples 15 to 17, it was found that by using the organic semiconductor composition containing a silicone-based surfactant or a fluorine-based surfactant (Examples 15 and 16), the printing properties are further improved. Particularly, it was understood that in a case where a fluorine-based surfactant is used (Example 15), the mobility of the organic thin film transistor is further improved. Presumably, this is because the use of a fluorine-based surfactant may further improve the wetting and spreading properties of the organic semiconductor film formed using the organic semiconductor composition, and hence a more uniform film could be formed.

From the comparison between Example 11 and Example 13, it was found that in a case where the ratio of the content of the specific polymer compound to the content of the surfactant is equal to or lower than 200 (Example 11), the printing properties are further improved. Furthermore, from the comparison between Example 11 and Example 19, it was found that in a case where the ratio of the content of the specific polymer compound to the content of the surfactant is equal to or higher than 3 (Example 11), the mobility and the insulation reliability of the prepared organic thin film transistor are further improved.

It was found that in a case where the organic semiconductor compositions of Comparative Examples 1 and 2 that do not contain at least the specific polymer compound or the surfactant is used, the printing properties deteriorate.

It was found that in a case where the organic semiconductor composition of Comparative Example 3 is used in which the ratio of the content of the organic semiconductor material to the content of the specific polymer compound is outside the range of 0.02 to 10 (lower than 0.02), the mobility of the prepared organic thin film transistor deteriorate.

It was found that in a case where the organic semiconductor composition of Comparative Example 4 is used in which the ratio of the content of the organic semiconductor material to the content of the specific polymer compound is outside the range of 0.02 to 10 (higher than 10) and the ratio of the content of the phenolic reductant to the content of the specific polymer compound is outside the range of 0.1 to 5 (higher than 5), the printing properties deteriorate.

It was found that in a case where the organic semiconductor composition of Comparative Example 5 is used in which the ratio of the content of the phenolic reductant to the content of the specific polymer compound is outside the range of 0.1 to 5 (lower than 0.1), the insulation reliability of the prepared organic thin film transistor deteriorates.

It was found that in a case where the organic semiconductor composition of Comparative Example 6 is used in which the ratio of the content of the phenolic reductant to the content of the specific polymer compound is outside the range of 0.1 to 5 (higher than 5), the mobility of the prepared organic thin film transistor deteriorates.

It was found that in a case where the organic semiconductor composition of Comparative Example 7 containing a polymer compound having a molecular weight of less than 500,000 is used, the printing properties deteriorate.

EXPLANATION OF REFERENCES

10: substrate
20: gate electrode
30: gate insulating film
40: source electrode
42: drain electrode
50: organic semiconductor layer
60: sealing layer
100, 200: organic thin film transistor

What is claimed is:

1. A composition for forming an organic semiconductor film, comprising:
   an organic semiconductor material;
   a phenolic reductant;
   a polymer compound having a weight-average molecular weight of equal to or greater than 500,000;
   a surfactant; and
   an organic solvent having a standard boiling point of equal to or higher than 150° C.,
   wherein a ratio of a content of the organic semiconductor material to a content of the polymer compound is 0.02 to 10 based on mass,
   a ratio of a content of the phenolic reductant to the content of the polymer compound is 0.1 to 5 based on mass, and
   a ratio of the content of the polymer compound to a content of the surfactant is 3 to 200 based on mass.

2. The composition for forming an organic semiconductor film according to claim 1,
   wherein the phenolic reductant contains at least one of Compound X, which contains 2 or more groups selected from the group consisting of a group represented by Formula (A) and a group represented by Formula (B), or Compound Y represented by Formula (C),

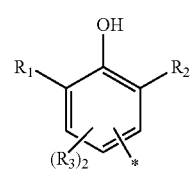

Formula (A)

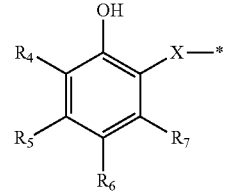

Formula (B)

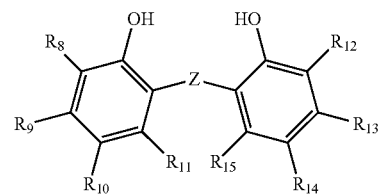

Formula (C)

in Formula (A), $R_1$ to $R_3$ each independently represent a hydrogen atom or a substituent, * represents a binding position, and $R_1$ and $R_2$ do not simultaneously represent a hydrogen atom, in Formula (B), $R_4$ represents a substituent, $R_5$ to $R_7$ each independently represent a hydrogen atom or a substituent, X represents a divalent linking group, and * represents a binding position, and in Formula (C), $R_8$ and $R_{ig}$ each independently represent a substituent, $R_9$ to $R_{11}$ and $R_{13}$ to $R_{15}$ each independently represent a hydrogen atom or a substituent, Z represents $CR_{16}R_{17}$, —O—, —S—, —SO—, —SO$_2$—, —NR—, —PR—, —POR—, —COCO—, —NH—NH—, or —S—S—, R represents a hydrogen atom or a substituent, and $R_{16}$ and $R_{17}$ each independently represent a hydrogen atom or a substituent.

3. The composition for forming an organic semiconductor film according to claim 2,
wherein the organic semiconductor material has a condensed polycyclic aromatic group,
the number of rings in the condensed polycyclic aromatic group is equal to or greater than 4,
at least 2 rings in the condensed polycyclic aromatic group contain at least 1 atom selected from the group consisting of a sulfur atom, a nitrogen atom, a selenium atom, and an oxygen atom, and
at least any one structure selected from the group consisting of a benzene ring, a naphthalene ring, and a phenanthrene ring is contained as a partial structure in the condensed polycyclic aromatic group.

4. The composition for forming an organic semiconductor film according to claim 2,
wherein the surfactant contains at least one kind of compound selected from the group consisting of a fluorine-based surfactant and a silicone-based surfactant.

5. The composition for forming an organic semiconductor film according to claim 1,
wherein the organic semiconductor material has a condensed polycyclic aromatic group,
the number of rings in the condensed polycyclic aromatic group is equal to or greater than 4,
at least 2 rings in the condensed polycyclic aromatic group contain at least 1 atom selected from the group consisting of a sulfur atom, a nitrogen atom, a selenium atom, and an oxygen atom, and
at least any one structure selected from the group consisting of a benzene ring, a naphthalene ring, and a phenanthrene ring is contained as a partial structure in the condensed polycyclic aromatic group.

6. The composition for forming an organic semiconductor film according to claim 5, wherein the surfactant contains at least one kind of compound selected from the group consisting of a fluorine-based surfactant and a silicone-based surfactant.

7. The composition for forming an organic semiconductor film according to claim 5,
wherein the number of rings in the condensed polycyclic aromatic group in the organic semiconductor material is 5 or 6.

8. The composition for forming an organic semiconductor film according to claim 7,
wherein at least 2 heterocyclic rings are contained in the condensed polycyclic aromatic group of the organic semiconductor material, and
each of the heterocyclic rings is a heterocyclic ring having only 1 heteroatom.

9. The composition for forming an organic semiconductor film according to claim 7,
wherein the surfactant contains at least one kind of compound selected from the group consisting of a fluorine-based surfactant and a silicone-based surfactant.

10. The composition for forming an organic semiconductor film according to claim 5,
wherein at least 2 heterocyclic rings are contained in the condensed polycyclic aromatic group of the organic semiconductor material, and
each of the heterocyclic rings is a heterocyclic ring having only 1 heteroatom.

11. The composition for forming an organic semiconductor film according to claim 10,
wherein the surfactant contains at least one kind of compound selected from the group consisting of a fluorine-based surfactant and a silicone-based surfactant.

12. The composition for forming an organic semiconductor film according to claim 1,
wherein the surfactant contains at least one kind of compound selected from the group consisting of a fluorine-based surfactant and a silicone-based surfactant.

13. The composition for forming an organic semiconductor film according to claim 1,
wherein the organic semiconductor material contains at least one kind of compound represented by any one of Formulae 1 to 16,

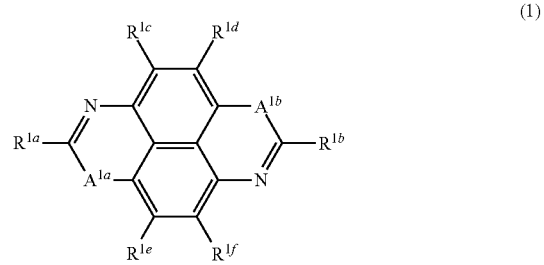

(1)

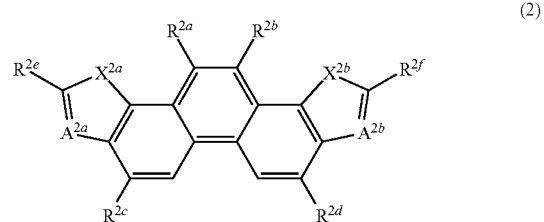

(2)

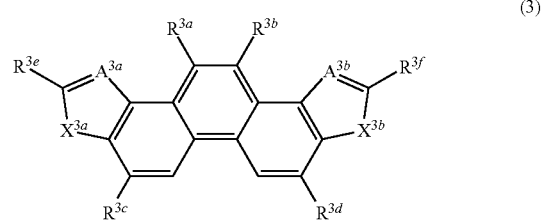

(3)

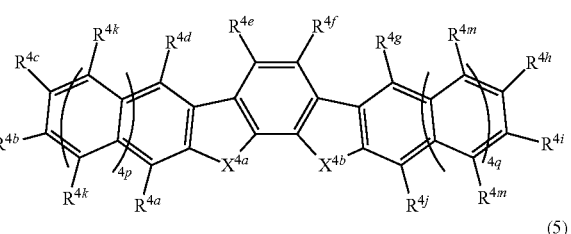

(4)

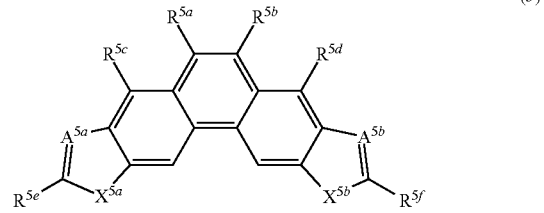

(5)

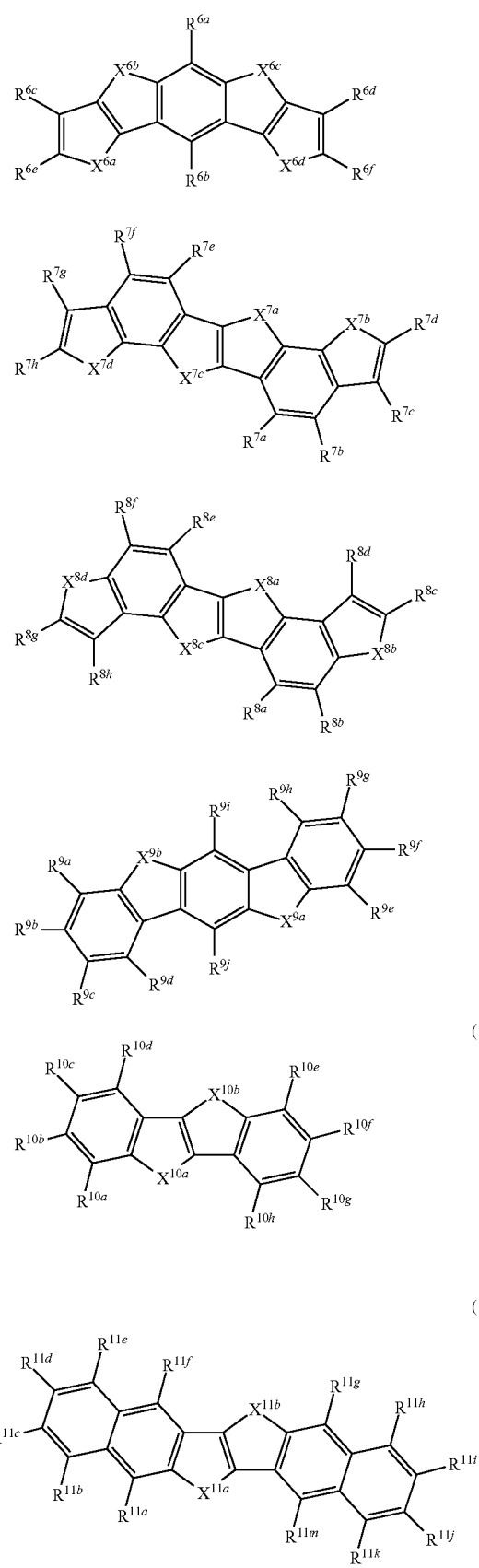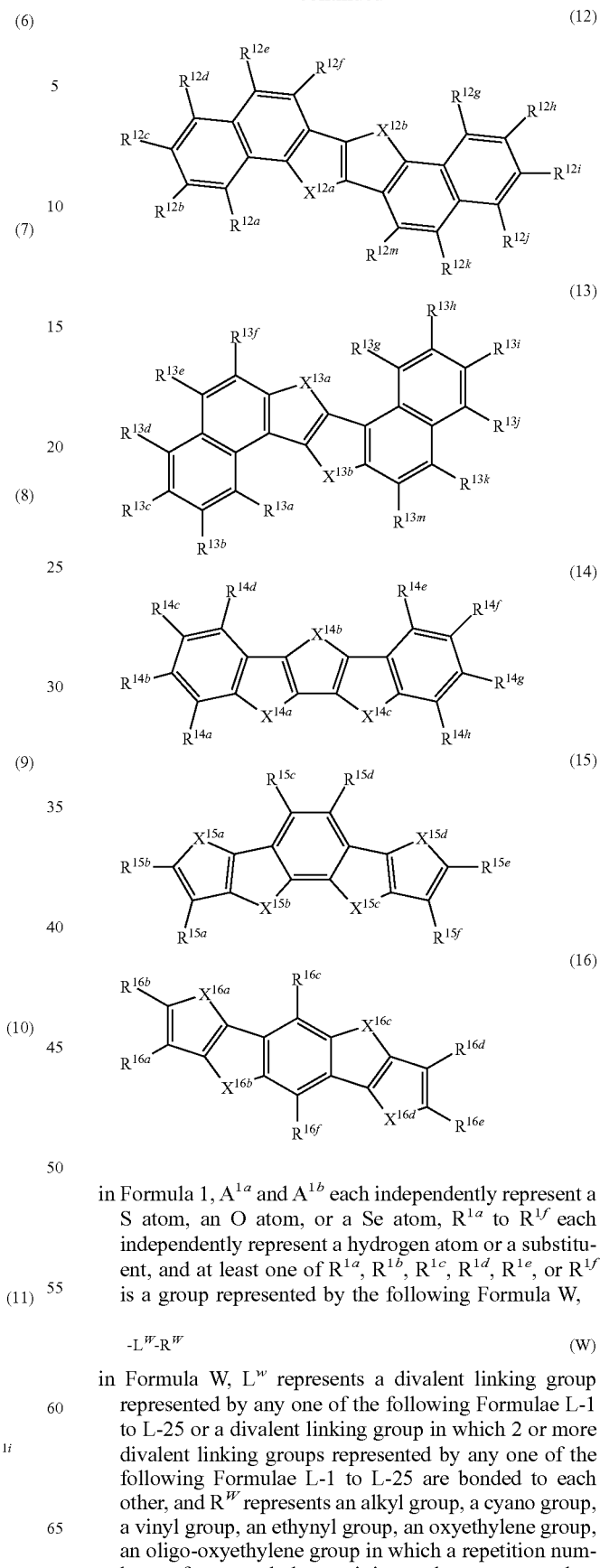

in Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W, $$-L^W\text{-}R^W \tag{W}$$

in Formula W, $L^W$ represents a divalent linking group represented by any one of the following Formulae L-1 to L-25 or a divalent linking group in which 2 or more divalent linking groups represented by any one of the following Formulae L-1 to L-25 are bonded to each other, and $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having 2 or more silicon atoms, or a trialkylsilyl group,
(L-1) 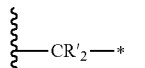
(L-2) 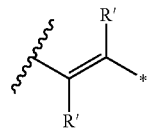
(L-3) 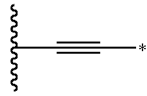
(L-4) 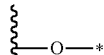
(L-5) 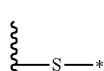
(L-6) 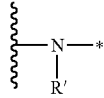
(L-7) 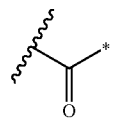
(L-8) 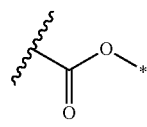
(L-9) 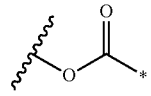
(L-10) 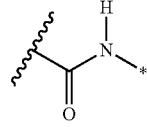
(L-11) 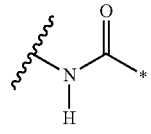
(L-12) 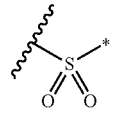
-continued
(L-13) 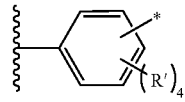
(L-14) 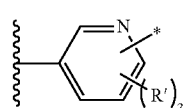
(L-15) 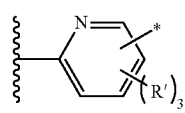
(L-16) 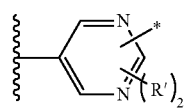
(L-17) 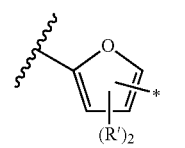
(L-18) 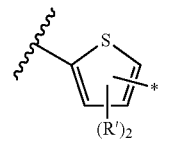
(L-19) 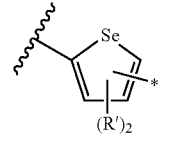
(L-20) 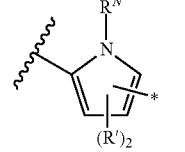
(L-21) 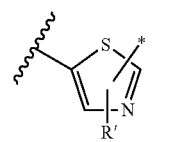
(L-22) 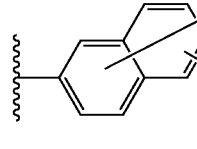
(L-23) 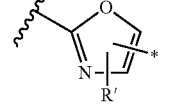

-continued

(L-24)

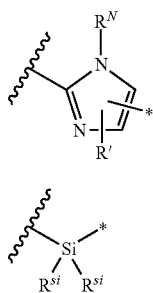
(L-25)

in Formulae L-1 to L-25, * represents a binding position with respect to $R^W$, the portion of a wavy line represents a binding position on the other side, R' in Formulae L-1, L-2, L-6, and L-13 to L-24 each independently represents a hydrogen atom or a substituent, $R^N$ represents a hydrogen atom or a substituent, and $R^{si}$ each independently represents a hydrogen atom, an alkyl group, an alkenyl group, or an alkynyl group, in Formula 2, $X^{2a}$ and $X^{2b}$ each independently represent $NR^{2i}$, an O atom, or a S atom, $A^{2a}$ represents $CR^{2g}$ or a N atom, $A^{1b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W, in Formula 3, $X^a$ and $X^{3b}$ each independently represent a S atom, an O atom, or $NR^3g$, and $A^{3a}$ and $A^{3b}$ each independently represent $CR^{3h}$ or a N atom, $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W, in Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, and at least one of $R^{4a}$, $R^{4b}$, $R^{4c}$, $R^{4d}$, $R^{4e}$, $R^{4f}$, $R^{4g}$, $R^{4i}$, $R^{4k}$, or $R^{4m}$ is a group represented by Formula W, and in a case where at least one of $R^{4e}$ or $R^{4f}$ is a group represented by Formula W, $L^w$ in Formula W represented by $R^{4e}$ and $R^{4f}$ is a divalent linking group represented by Formula L-2 or L-3, in Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W, in Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$ or $R^{6f}$ is a group represented by Formula W, in Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7i}$, $R^{7d}$, $R^{7e}$, $R^{7f}$, $R^{7g}$, $R^{7h}$, or $R^{7i}$ is a group represented by Formula W, in Formula 8, $X^{8a}$ and $X^{8i}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W, in Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent, in Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, a Se atom, or $NR^{10i}$, and $R^{10i}$ each independently represents a hydrogen atom or a group represented by Formula W, in Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R_{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W, in Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R_{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W, in Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13m}$, $R^{13e}$, $R^{13f}$, $R^{13g}$, $R^{13m}$, $R^{13i}$, $R^{13j}$, $R^{13k}$, $R^{13m}$, or $R^{13n}$ is a group represented by Formula W, in Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W, in Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W, and in Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

14. The composition for forming an organic semiconductor film according to claim 13,
wherein the organic semiconductor material contains at least one kind of compound represented by Formulae 1 to 9 or Formula 15.

15. The composition for forming an organic semiconductor film according to claim 1 that is for ink jet printing or flexographic printing.

16. An organic thin film transistor comprising:
an organic semiconductor film prepared using the composition for forming an organic semiconductor film according to claim 1.

17. The organic thin film transistor according to claim 16, further comprising:
a source electrode;
a drain electrode; and
a gate electrode,
wherein at least one of the source electrode, the drain electrode, or the gate electrode is constituted with a silver-containing material.

18. Electronic paper obtained using the organic thin film transistor according to claim 11.

19. A display device obtained using the organic thin film transistor according to claim 11.

\* \* \* \* \*